United States Patent
Niwa et al.

(10) Patent No.: US 12,185,009 B2
(45) Date of Patent: Dec. 31, 2024

(54) IMAGE SENSOR, METHOD OF CONTROLLING IMAGE SENSOR, AND ELECTRONIC DEVICE

(71) Applicant: Sony Semiconductor Solutions Corporation, Kanagawa (JP)

(72) Inventors: Atsumi Niwa, Kanagawa (JP); Tomonori Yamashita, Kanagawa (JP); Takashi Moue, Kanagawa (JP); Yosuke Ueno, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/326,242

(22) Filed: May 20, 2021

(65) Prior Publication Data
US 2021/0368125 A1 Nov. 25, 2021

Related U.S. Application Data

(63) Continuation of application No. 16/488,734, filed as application No. PCT/JP2018/005650 on Feb. 19, 2018, now Pat. No. 11,039,098.

(30) Foreign Application Priority Data

Mar. 2, 2017 (JP) ................................. 2017-039337
Jun. 15, 2017 (JP) ................................. 2017-117453

(51) Int. Cl.
*H04N 25/772* (2023.01)
*H03K 5/24* (2006.01)
(Continued)

(52) U.S. Cl.
CPC ......... *H04N 25/772* (2023.01); *H03K 5/2481* (2013.01); *H03M 1/34* (2013.01); *H04N 25/75* (2023.01)

(58) Field of Classification Search
CPC .. H04N 5/37455; H04N 5/378; H04N 25/772; H04N 25/75; H04N 25/534;
(Continued)

(56) References Cited

U.S. PATENT DOCUMENTS 5,374,859 A 12/1994 Doyle
5,572,153 A * 11/1996 Vallancourt ............ H03K 5/249
327/96

(Continued)

FOREIGN PATENT DOCUMENTS

CN 101320974 A 12/2008
CN 106101586 A 11/2016
(Continued)

OTHER PUBLICATIONS

International Search Report and Written Opinion mailed May 4, 2018 in connection with International Application No. PCT/JP2018/005650.

(Continued)

*Primary Examiner* — Yogesh K Aggarwal
(74) *Attorney, Agent, or Firm* — Wolf, Greenfield & Sacks, P.C.

(57) ABSTRACT

Provided is an image sensor including: a pixel section configured to include a plurality of pixels arranged therein; and an AD conversion unit configured to perform analog-to-digital (AD) conversion on a pixel signal on the basis of a result of comparison between a first voltage of a signal, which is obtained by adding, via capacitances, the pixel signal of the pixel and a reference signal that linearly changes in a direction opposite to the pixel signal, with a second voltage serving as a reference.

12 Claims, 47 Drawing Sheets

(51) Int. Cl.
*H03M 1/34* (2006.01)
*H04N 25/75* (2023.01)

(58) Field of Classification Search
CPC ....... H03K 5/2481; H03K 5/249; H03M 1/34; H03M 1/1295; H03M 1/56; H03M 1/123
See application file for complete search history.

(56) References Cited

U.S. PATENT DOCUMENTS

| | | | |
|---|---|---|---|
| 10,992,889 B2 | 4/2021 | Kawazu et al. | |
| 11,039,098 B2 | 6/2021 | Niwa et al. | |
| 11,303,833 B2 | 4/2022 | Kawazu et al. | |
| 11,368,644 B2 | 6/2022 | Etou et al. | |
| 11,558,568 B2 | 1/2023 | Kawazu | |
| 2004/0046685 A1 | 3/2004 | Yun | |
| 2005/0206752 A1 | 9/2005 | Lim | |
| 2006/0170795 A1* | 8/2006 | Higuchi | H04N 5/3575 348/E5.079 |
| 2006/0176205 A1 | 8/2006 | Kawahito | |
| 2007/0008206 A1* | 1/2007 | Tooyama | H04N 5/3745 348/E5.079 |
| 2007/0176646 A1 | 8/2007 | Nam | |
| 2007/0253255 A1* | 11/2007 | Gallo | G11C 16/3418 365/185.21 |
| 2008/0030595 A1 | 2/2008 | Murakami | |
| 2008/0111905 A1 | 5/2008 | Toyama et al. | |
| 2008/0192126 A1* | 8/2008 | Purcell | H04N 5/3575 348/222.1 |
| 2008/0259193 A1 | 10/2008 | Toya | |
| 2009/0128676 A1* | 5/2009 | Tanaka | H04N 25/709 348/340 |
| 2010/0091167 A1* | 4/2010 | Azami | H03F 3/08 348/340 |
| 2010/0157035 A1 | 6/2010 | Purcell et al. | |
| 2010/0164761 A1 | 7/2010 | Wan | |
| 2011/0115959 A1* | 5/2011 | Toyama | H04N 5/378 348/308 |
| 2011/0249162 A1 | 10/2011 | Moore | |
| 2012/0012736 A1 | 1/2012 | Simony | |
| 2013/0207727 A1* | 8/2013 | Kusuda | H03F 1/26 330/296 |
| 2013/0215302 A1* | 8/2013 | Ueno | H03K 5/08 348/300 |
| 2014/0160331 A1 | 6/2014 | Murakami | |
| 2014/0293104 A1* | 10/2014 | Tanaka | H04N 5/3745 348/301 |
| 2015/0172580 A1* | 6/2015 | Zhang | H03M 1/129 250/208.1 |
| 2015/0281619 A1 | 10/2015 | Tanaka | |
| 2016/0277010 A1* | 9/2016 | Park | H03K 5/24 |
| 2017/0054931 A1 | 2/2017 | Wang et al. | |
| 2017/0272674 A1* | 9/2017 | Tokunaga | H03F 3/3028 |
| 2018/0091752 A1 | 3/2018 | Ebihara | |
| 2018/0191977 A1 | 7/2018 | Jung et al. | |
| 2018/0324378 A1* | 11/2018 | Ebihara | H03K 5/2481 |
| 2019/0373190 A1 | 12/2019 | Kawazu et al. | |
| 2020/0053308 A1 | 2/2020 | Niwa et al. | |
| 2020/0366863 A1 | 11/2020 | Etou et al. | |
| 2021/0250533 A1 | 8/2021 | Kawazu | |
| 2022/0191414 A1 | 6/2022 | Kawazu | |
| 2022/0264051 A1 | 8/2022 | Etou | |
| 2023/0247329 A1 | 8/2023 | Niwa et al. | |

FOREIGN PATENT DOCUMENTS

| | | |
|---|---|---|
| EP | 2104234 A1 | 9/2009 |
| JP | 2005136540 A | 5/2005 |
| JP | 2007281540 A | 10/2007 |
| JP | 2009-124513 A | 6/2009 |
| JP | 2009124514 A | 6/2009 |
| JP | 2013058909 A | 3/2013 |
| JP | 2014197772 A | 10/2014 |
| KR | 20050077790 A | 8/2005 |
| KR | 20070099479 A | 10/2007 |

OTHER PUBLICATIONS

International Preliminary Report on Patentability mailed Sep. 12, 2019 in connection with International Application No. PCT/JP2018/005650.
Communication pursuant to Article 94(3) EPC dated Sep. 16, 2020 in connection with European Application No. 18708227.6.
U.S. Appl. No. 16/332,145, filed Mar. 11, 2019, Kawazu et al.
U.S. Appl. No. 16/488,734, filed Aug. 26, 2019, Niwa et al.
U.S. Appl. No. 16/761,224, filed May 1, 2020, Etou et al.
U.S. Appl. No. 17/197,992, filed Mar. 10, 2021, Kawazu et al.
Extended European Search Report issued Dec. 9, 2022 in connection with European Application No. 22192583.7.

* cited by examiner

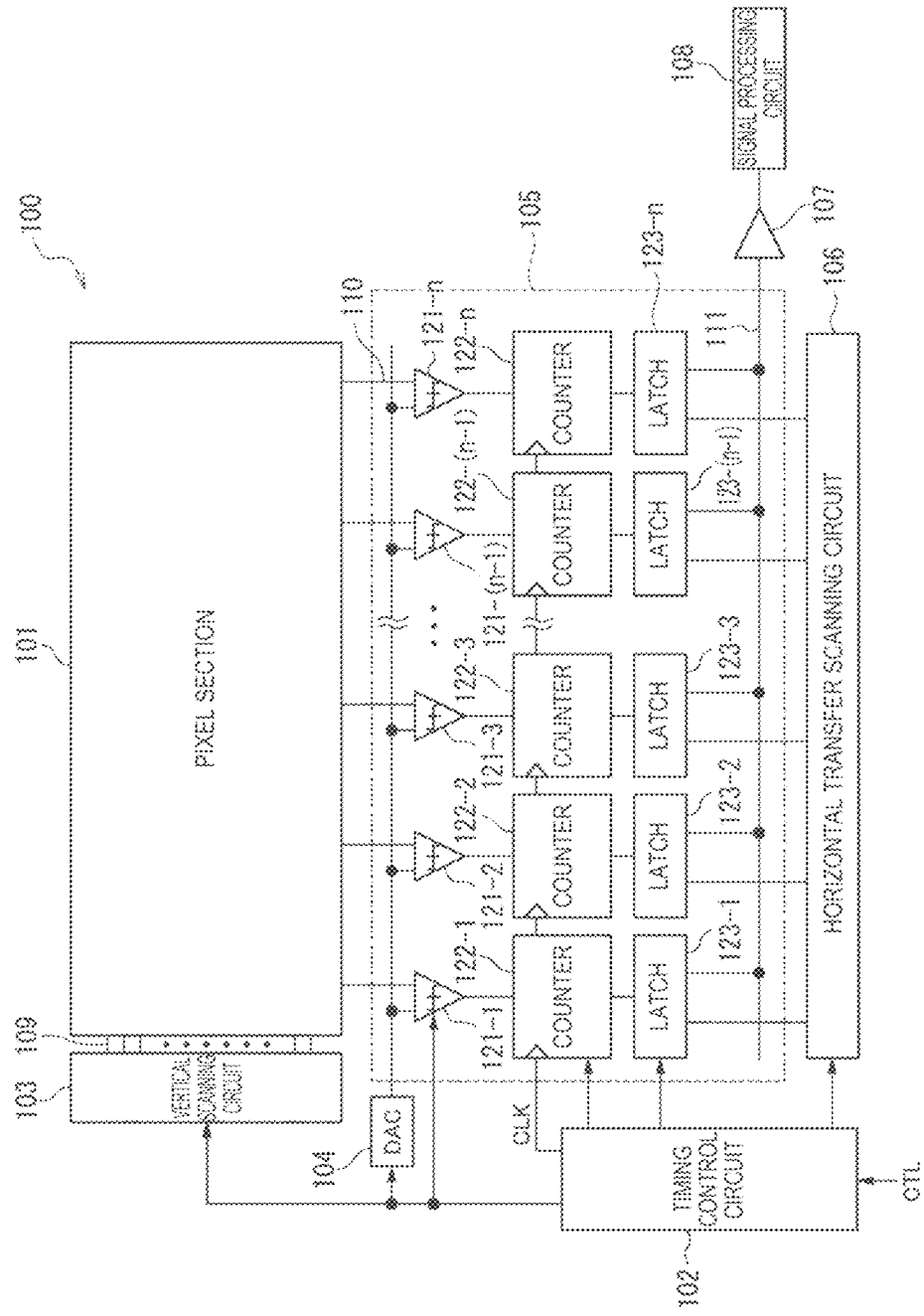
[FIG. 1]

[FIG. 2]
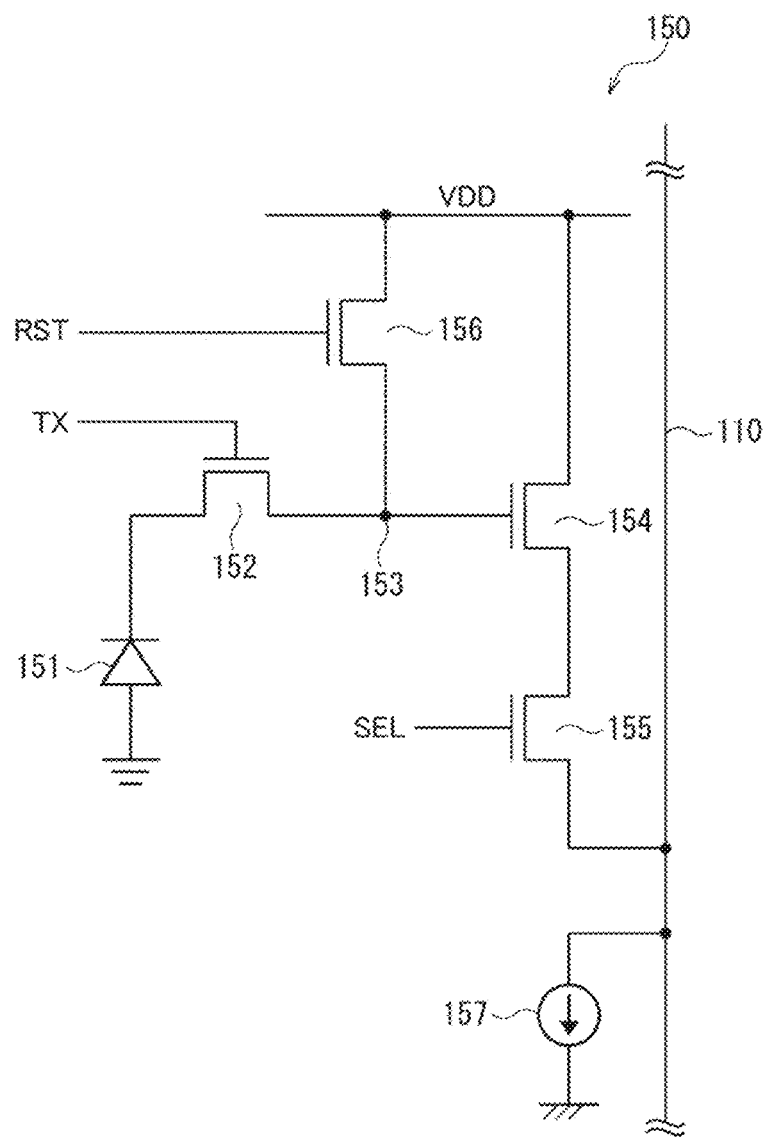

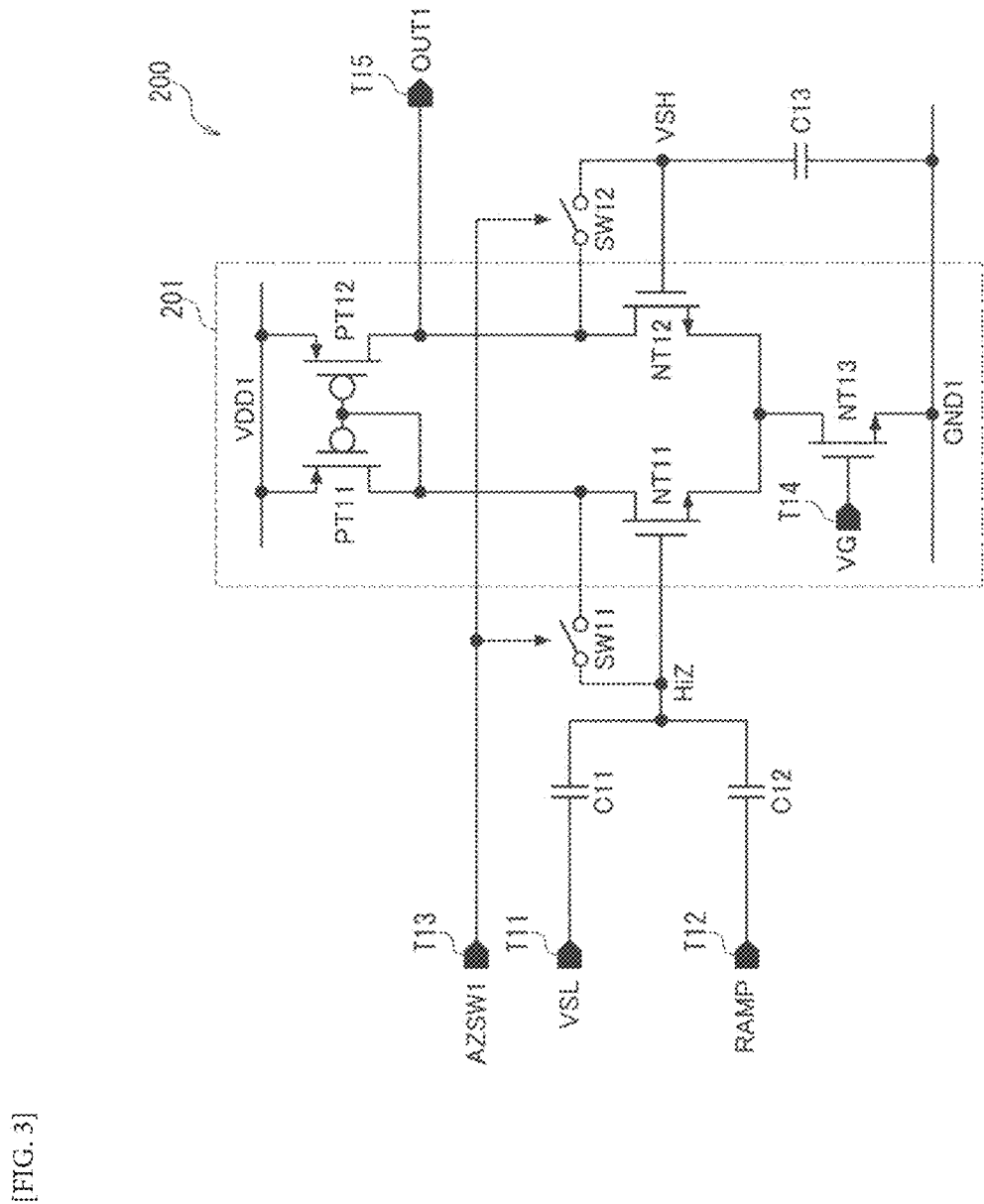
[FIG. 3]

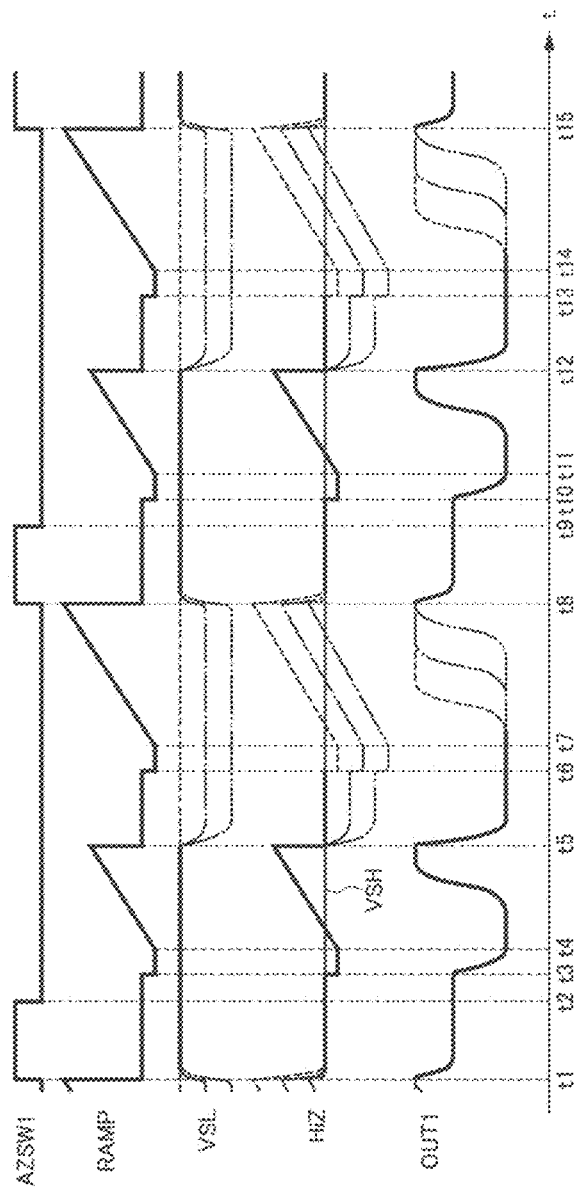

[FIG. 5]
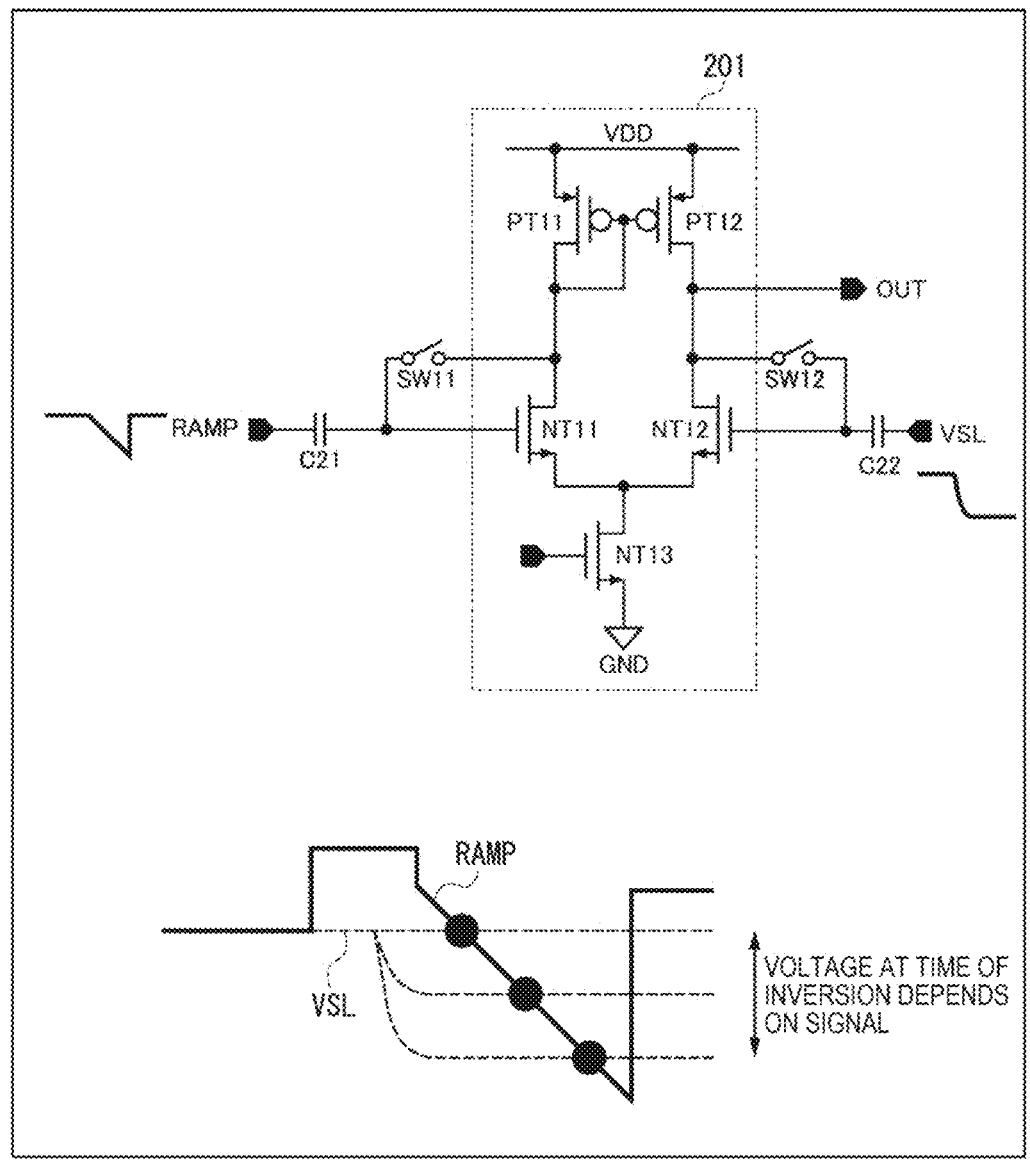

[FIG. 6]
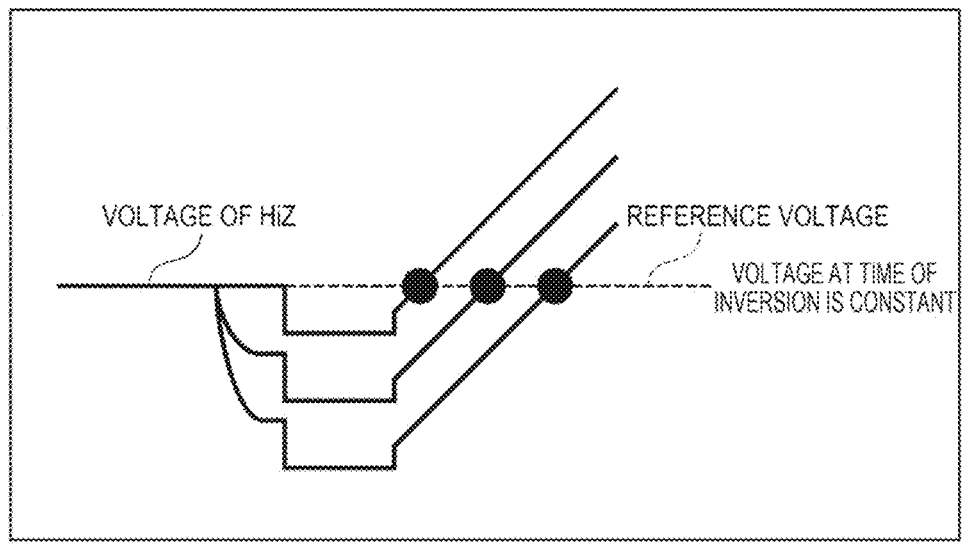

[FIG. 7]
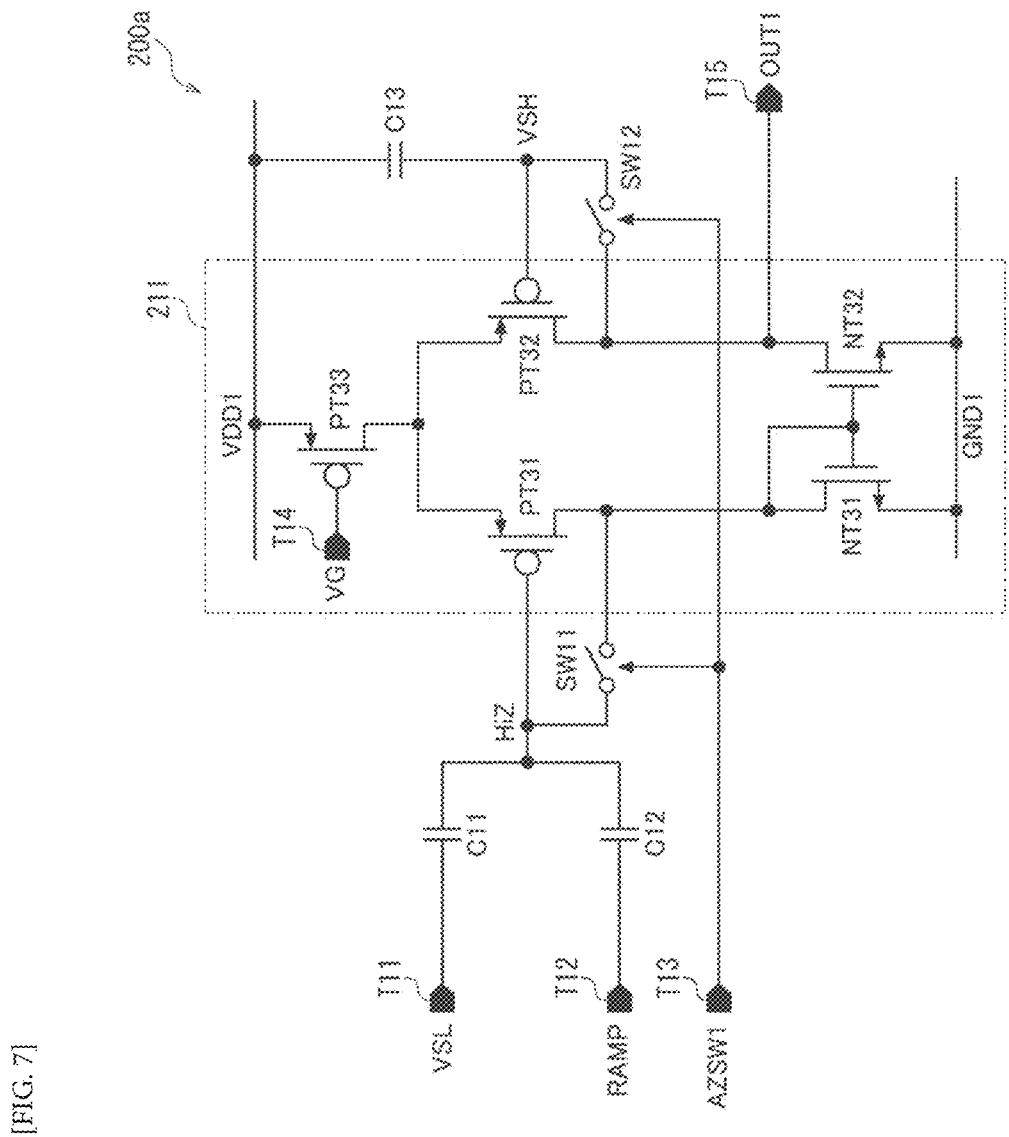

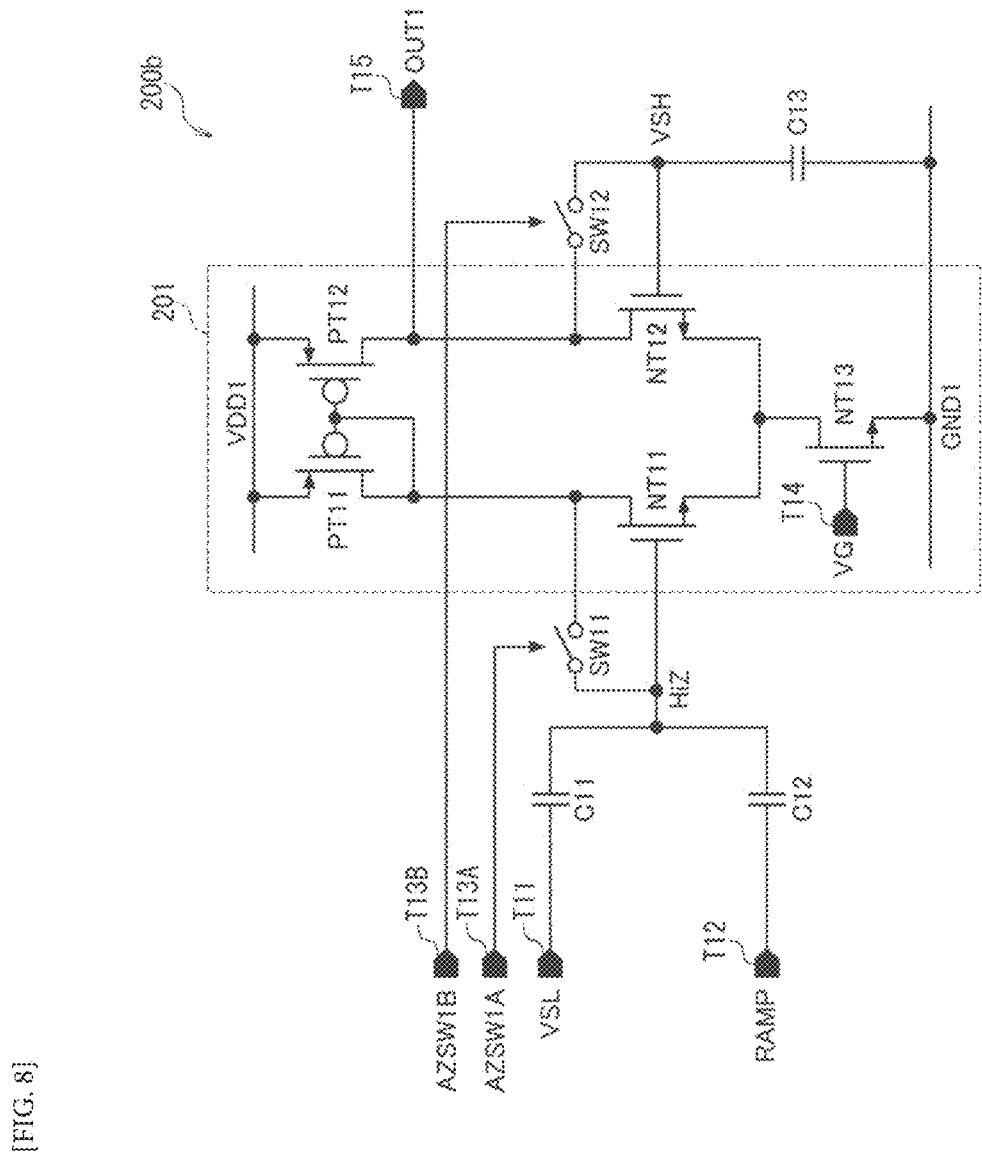
[FIG. 8]

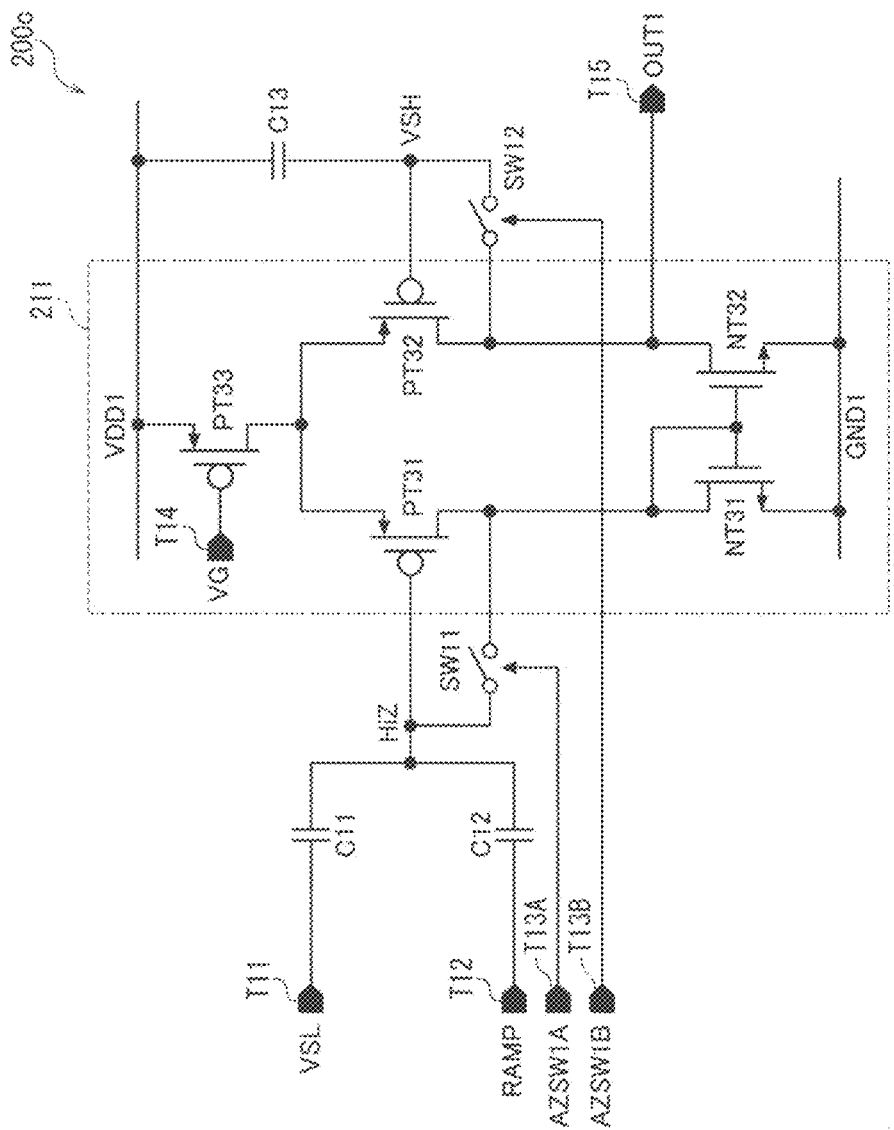
[FIG. 9]

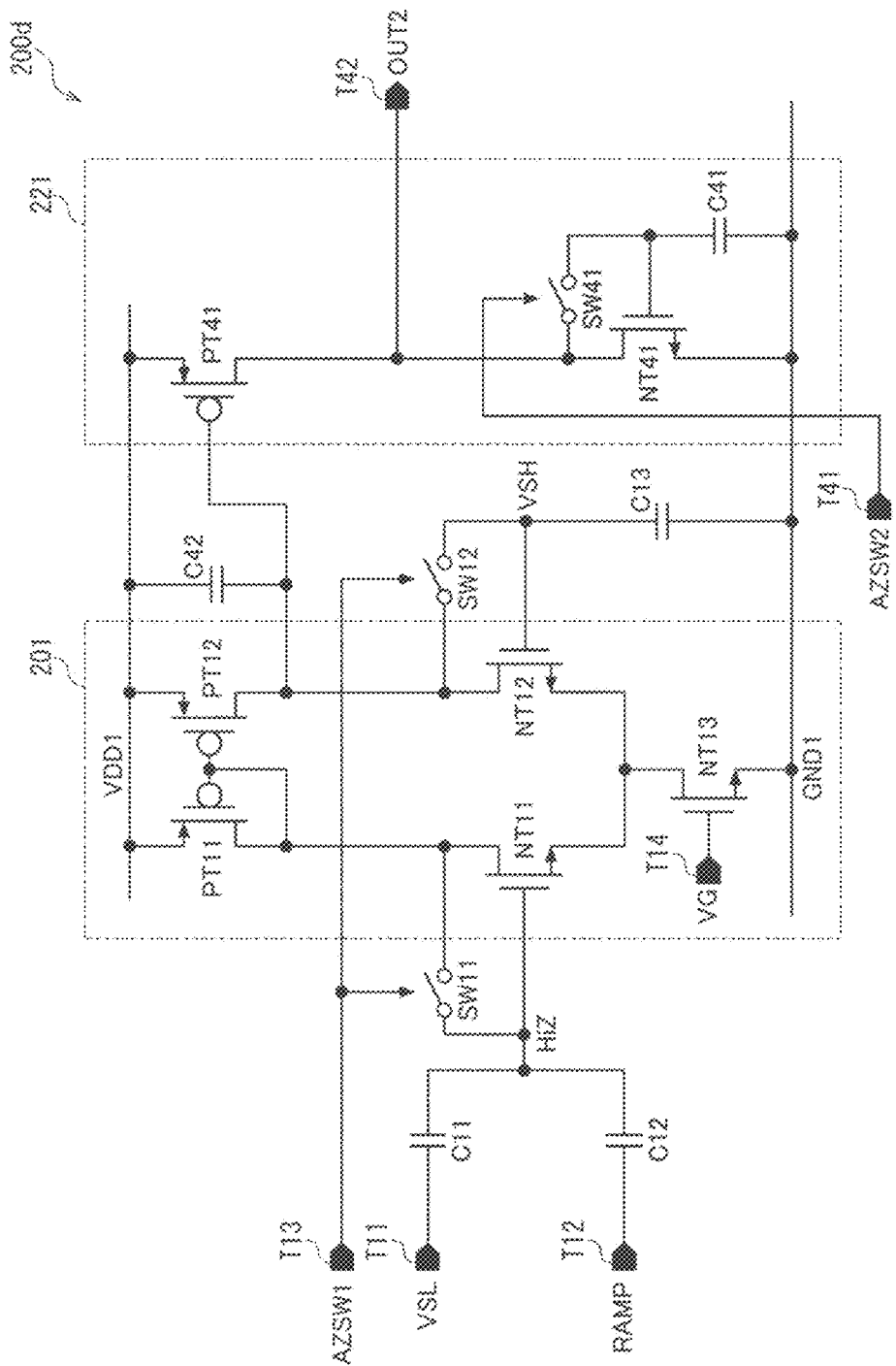
[FIG. 10]

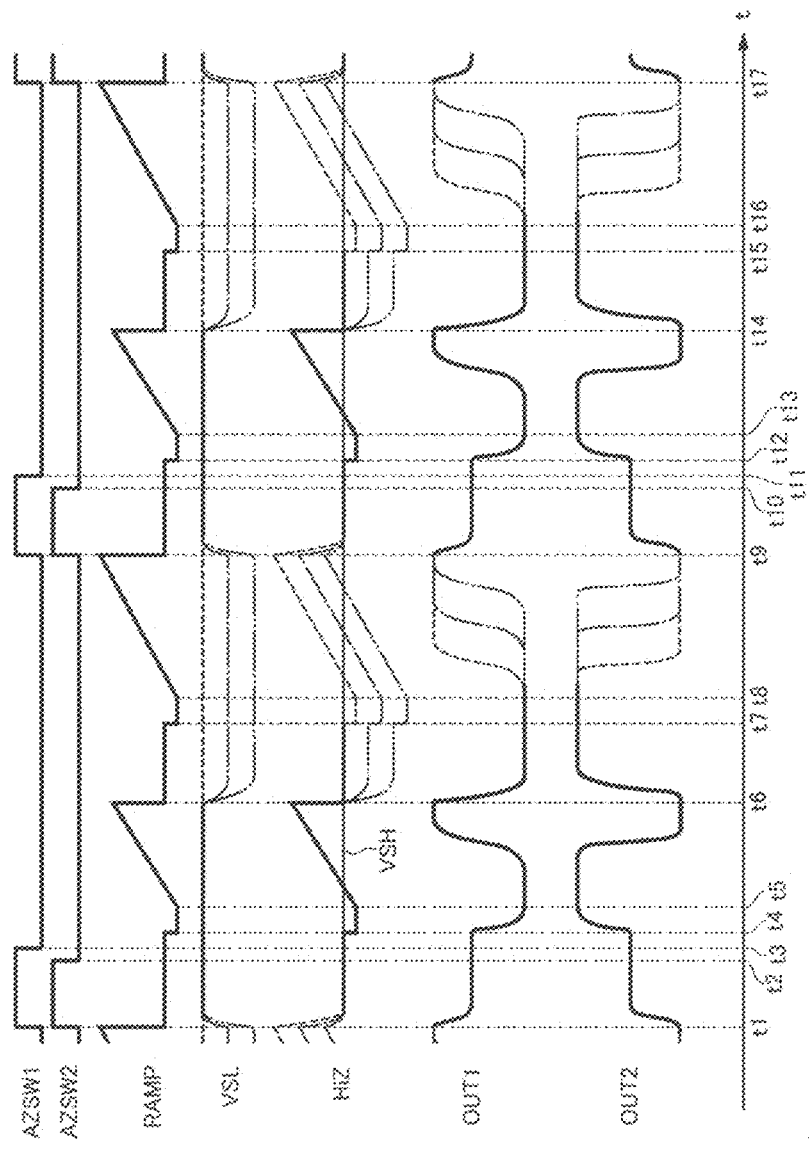

[FIG. 12]
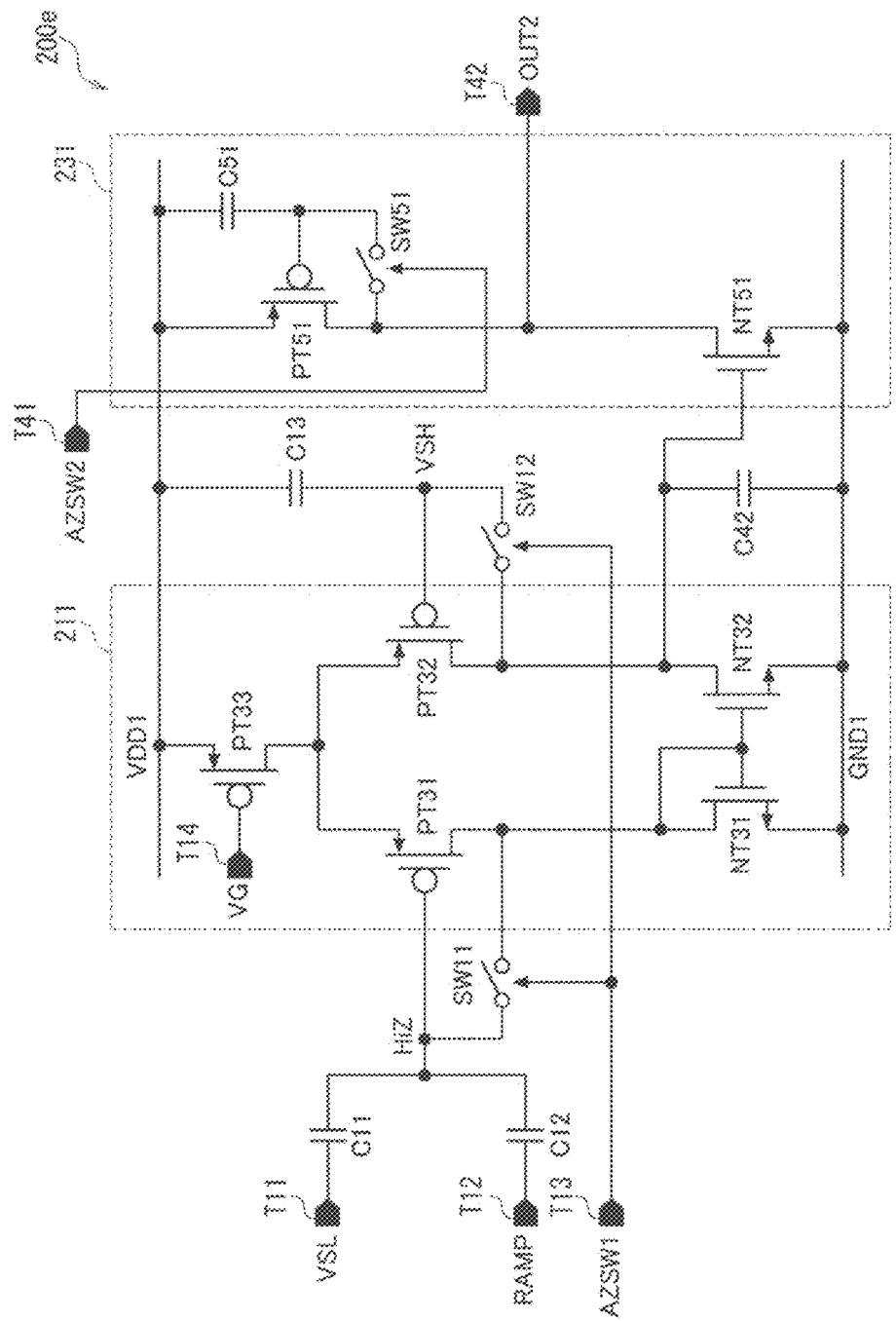

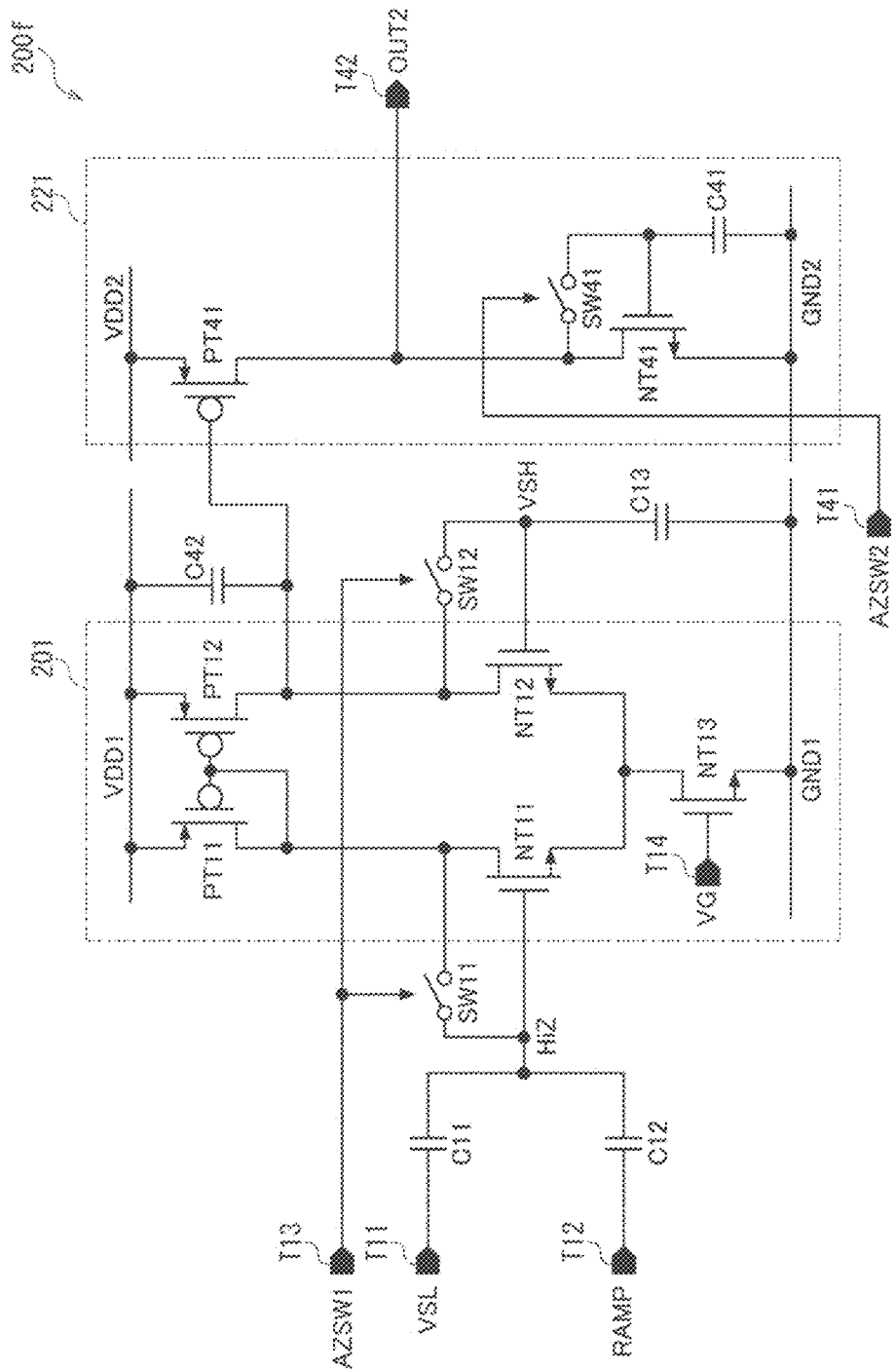
[FIG. 13]

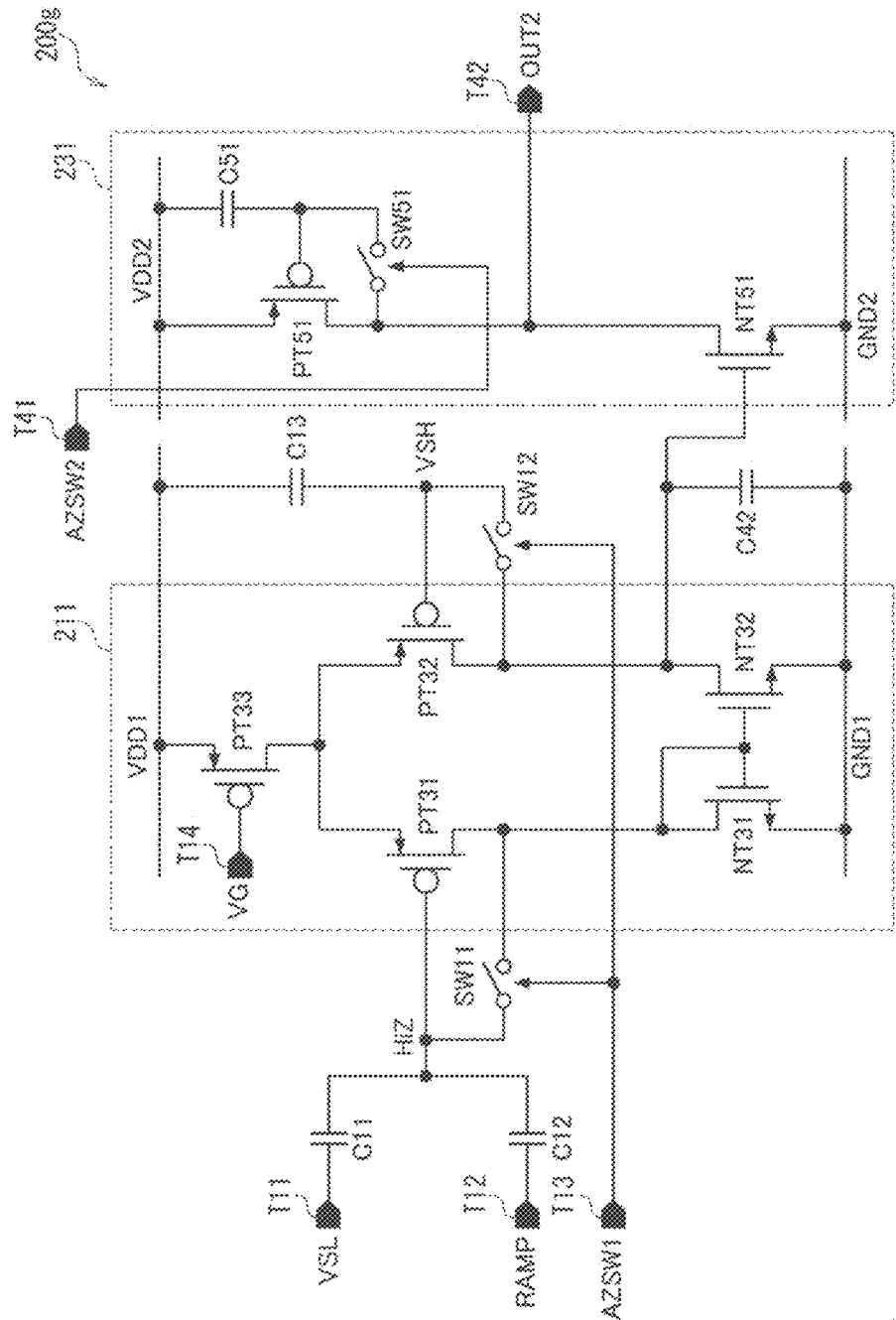
[FIG. 14]

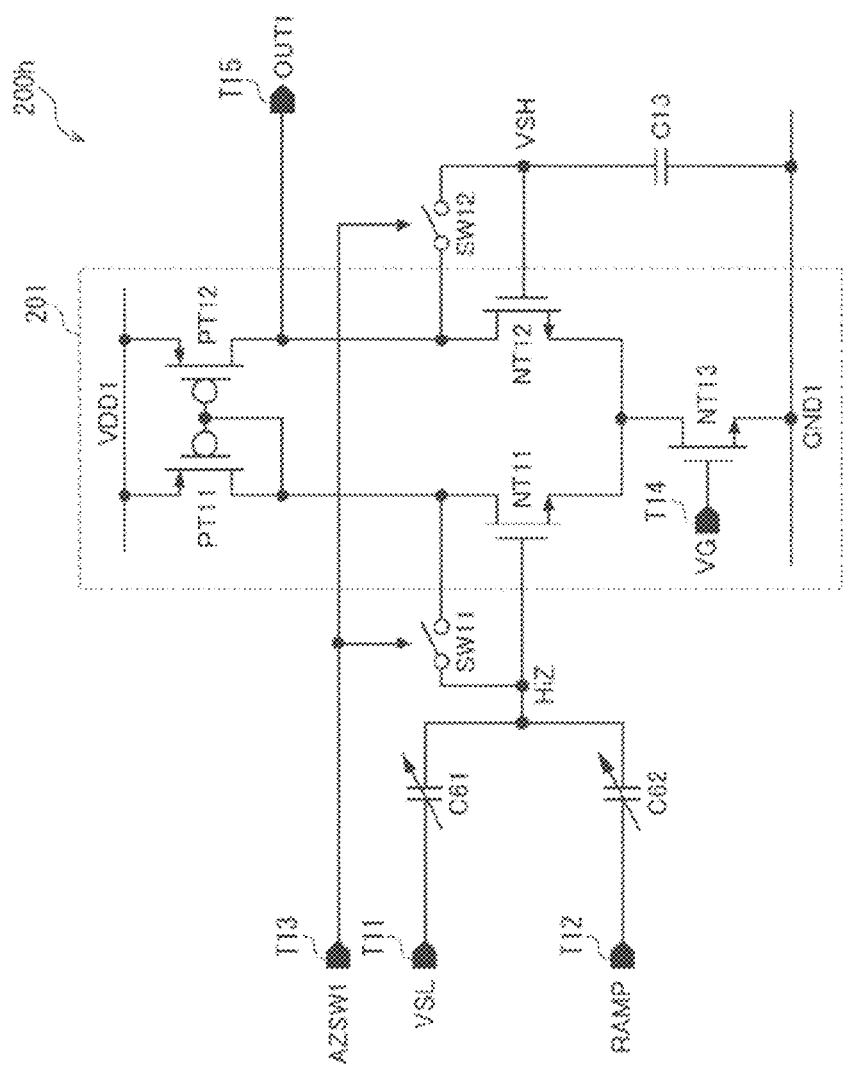
[FIG. 15]

[FIG. 16]
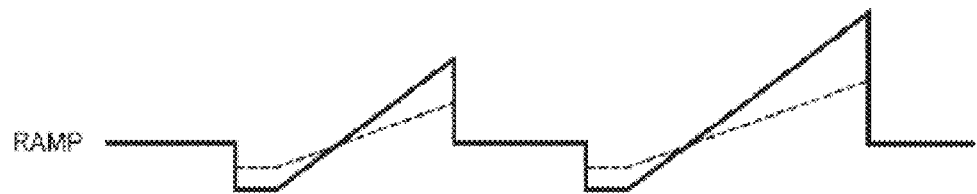

[FIG. 17]
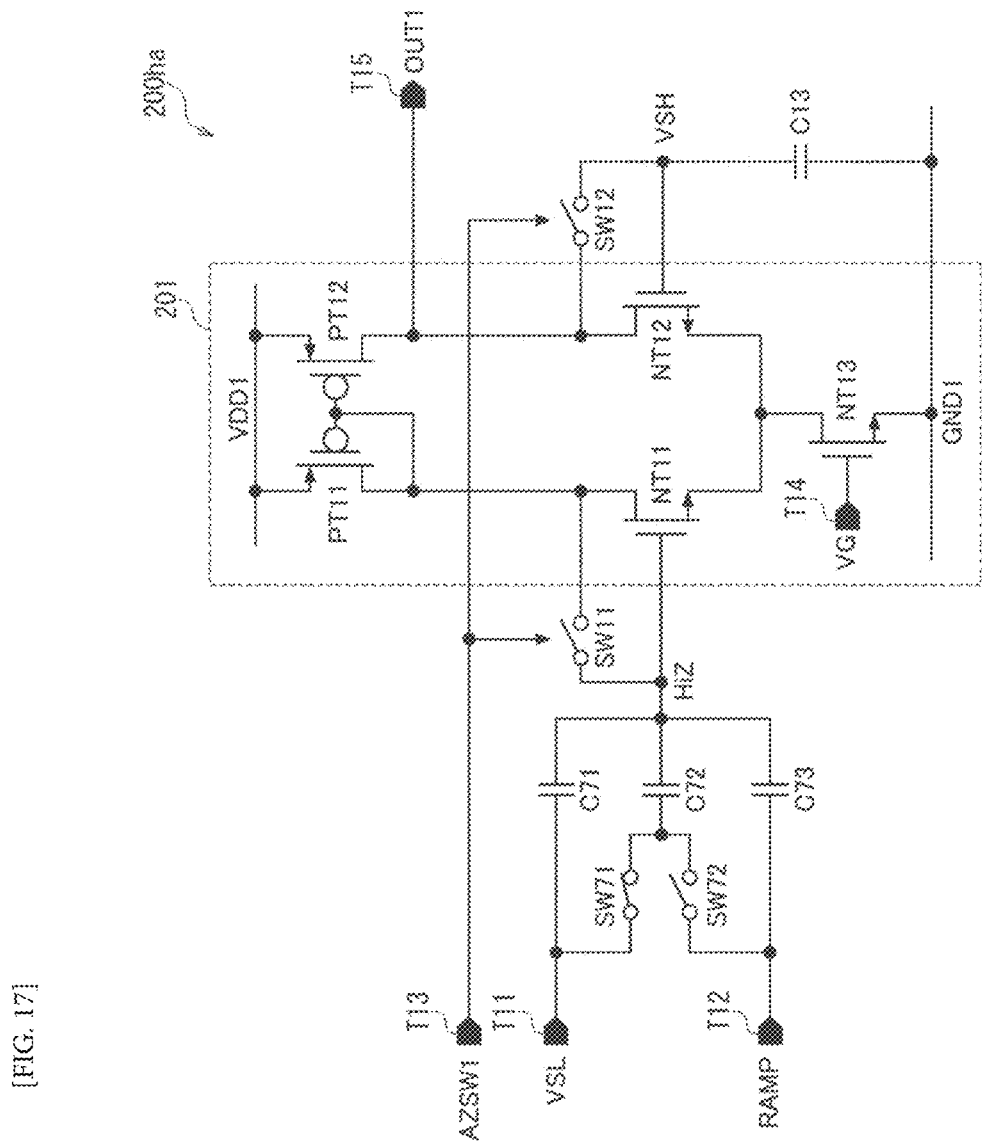

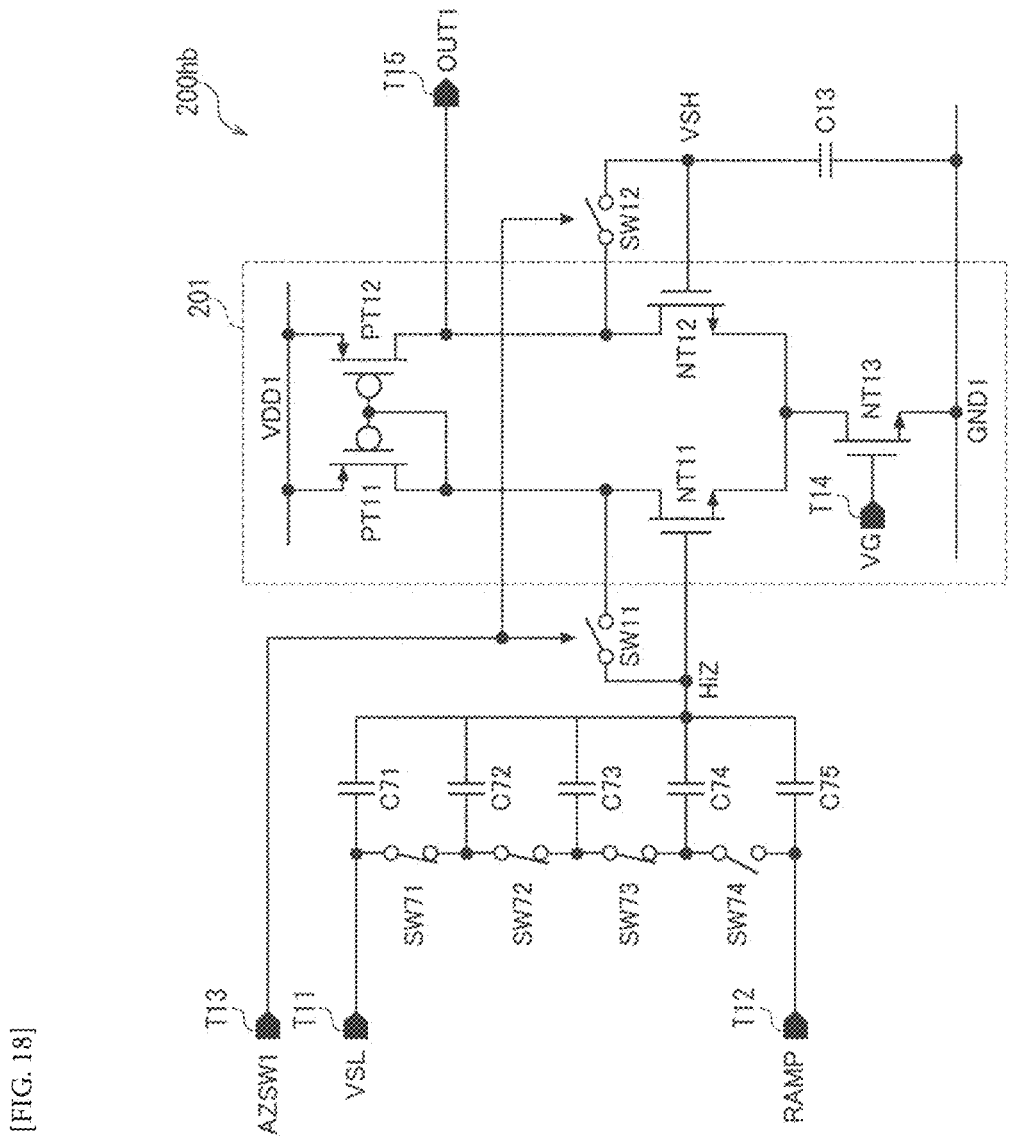
[FIG. 18]

[FIG. 19]
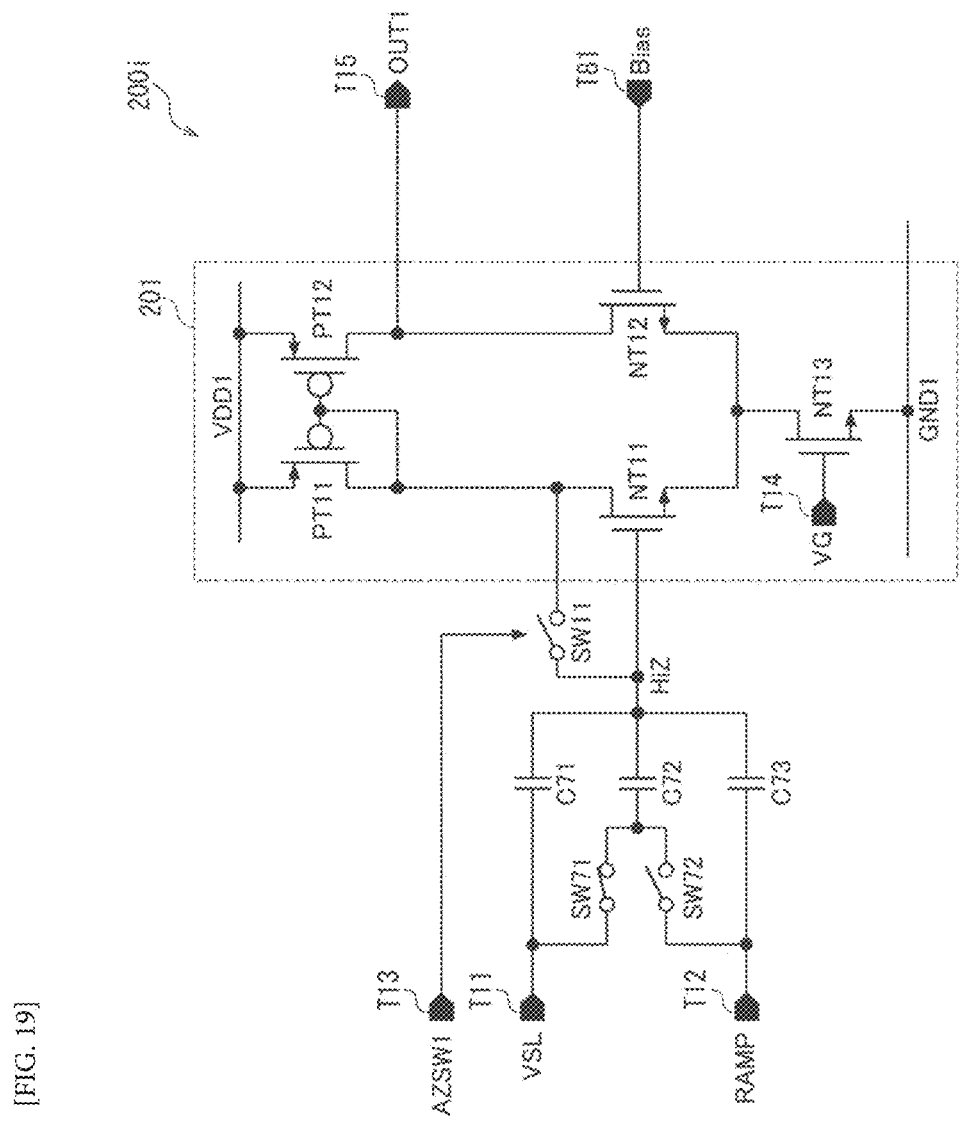

[FIG. 20]
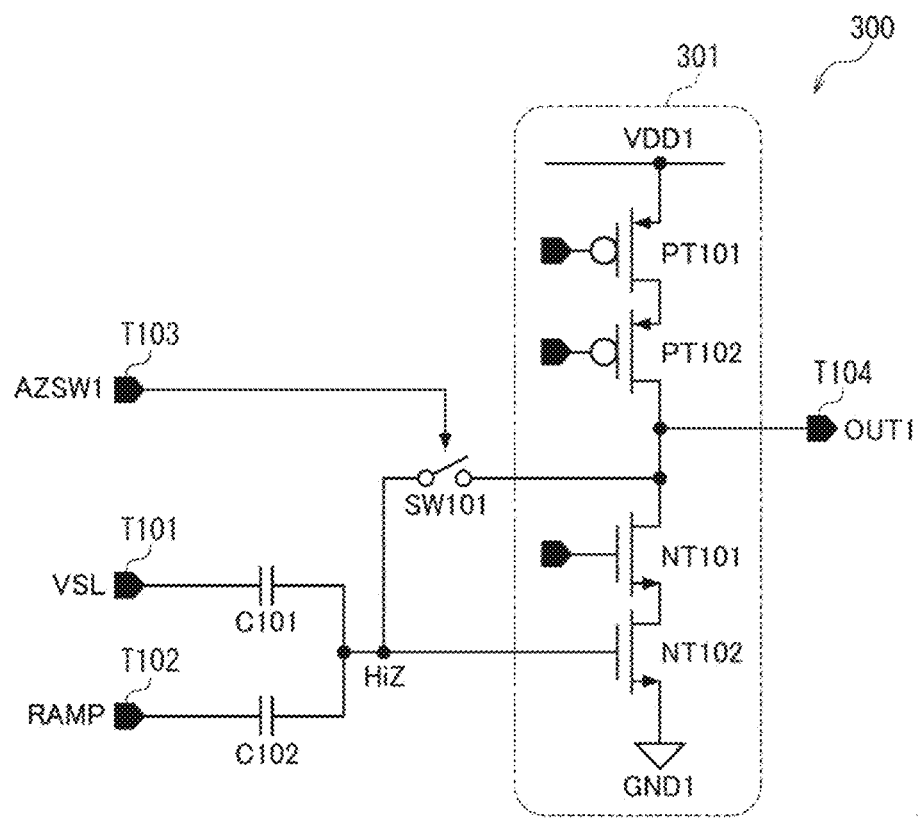

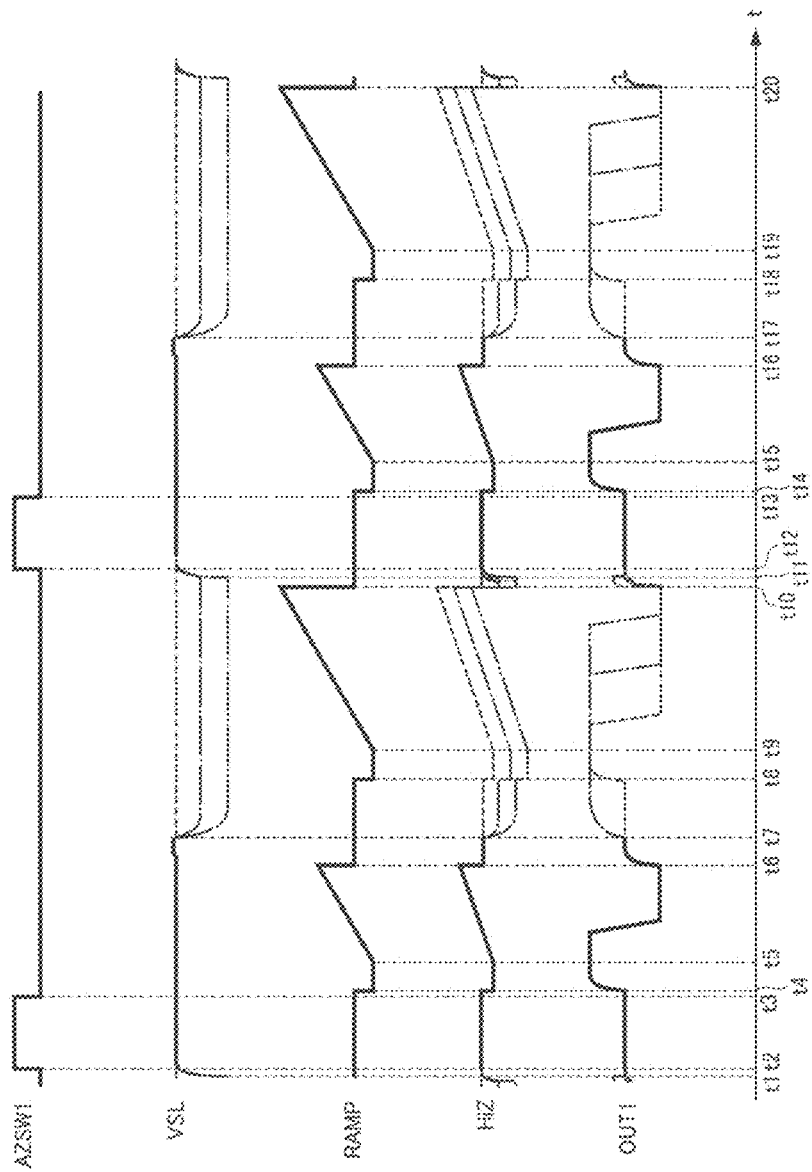
[FIG. 21]

[FIG. 22]
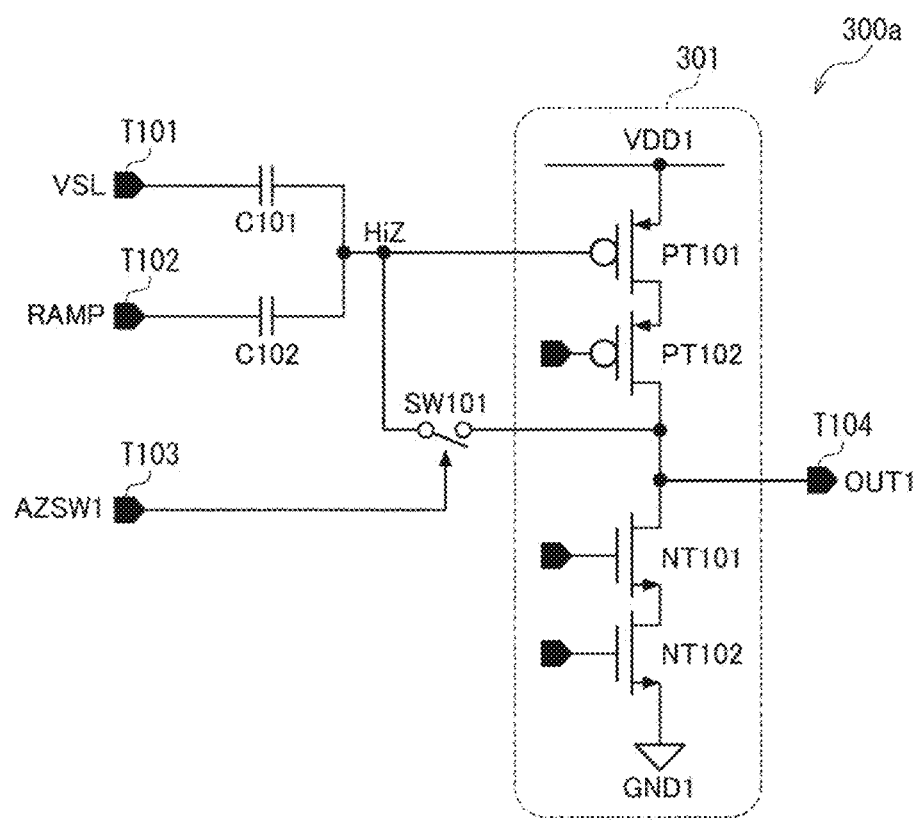

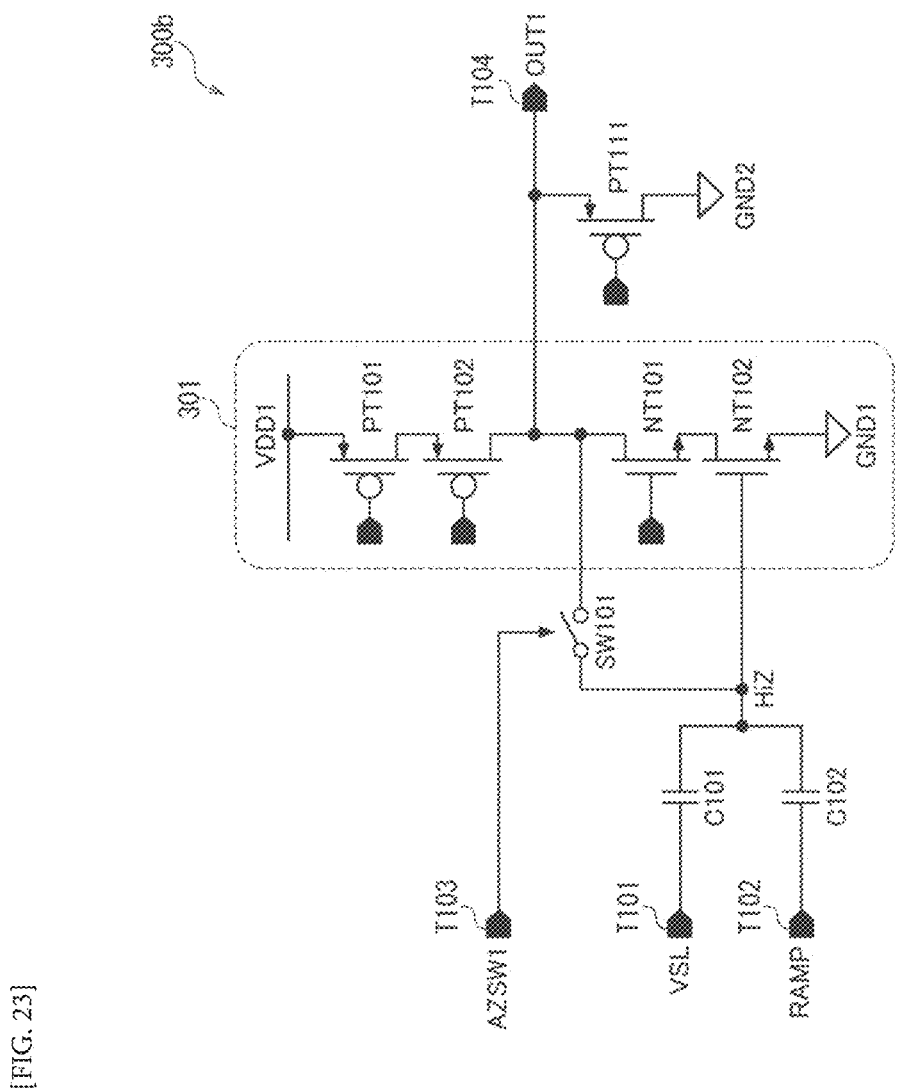
[FIG. 23]

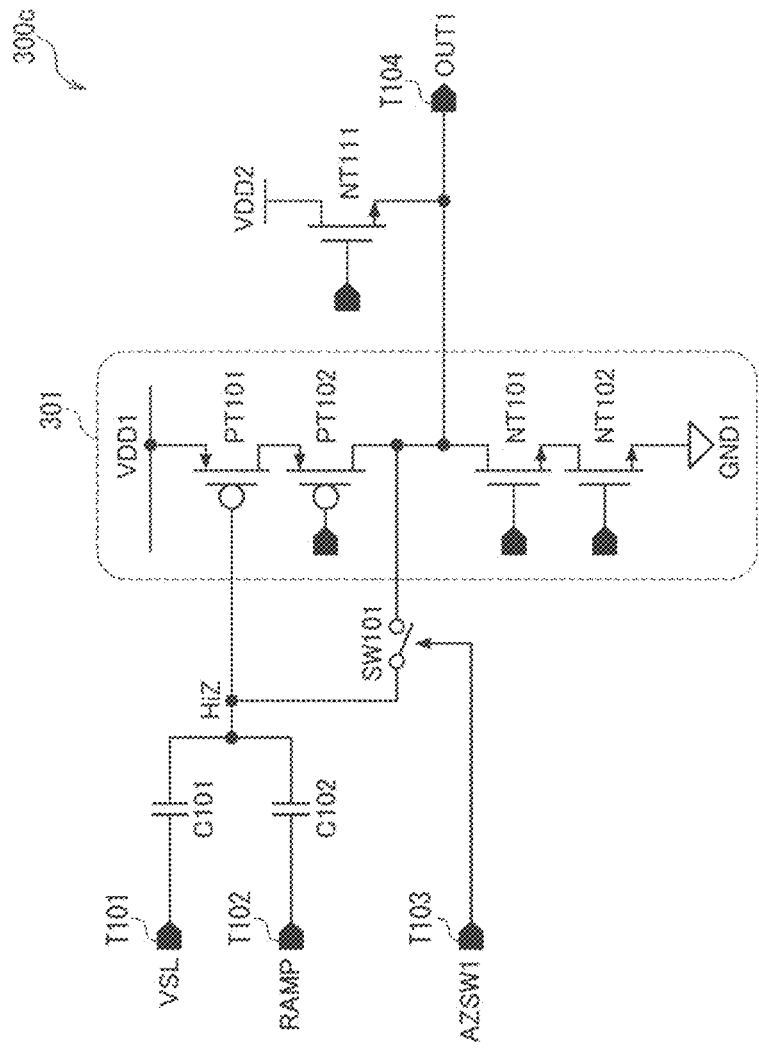
[FIG. 24]

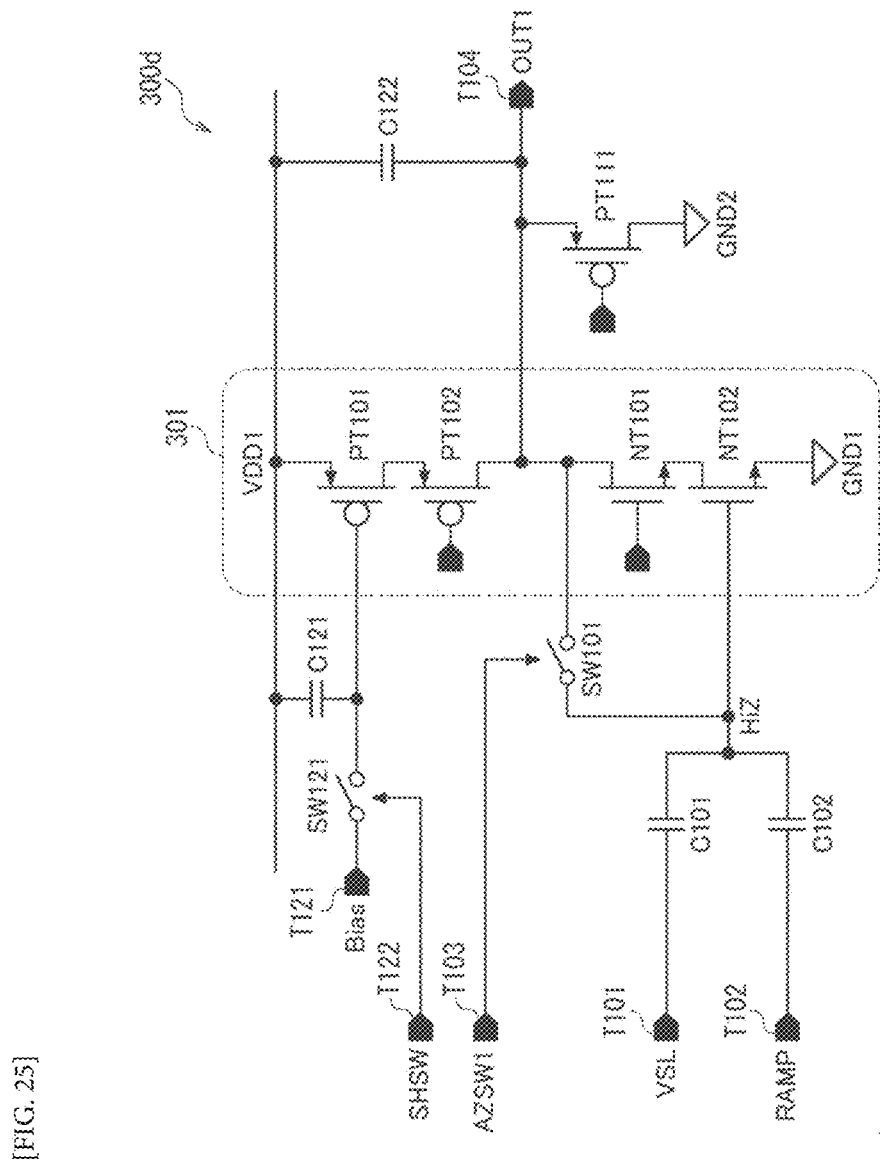
[FIG. 25]

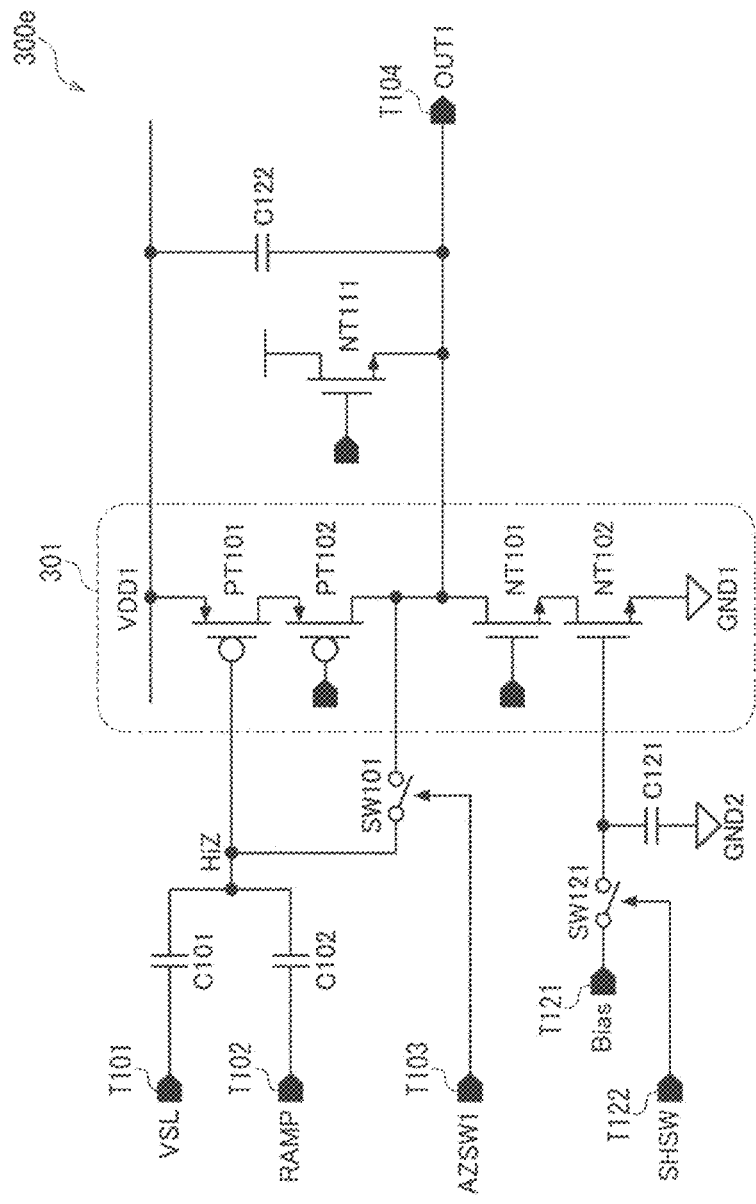
[FIG. 26]

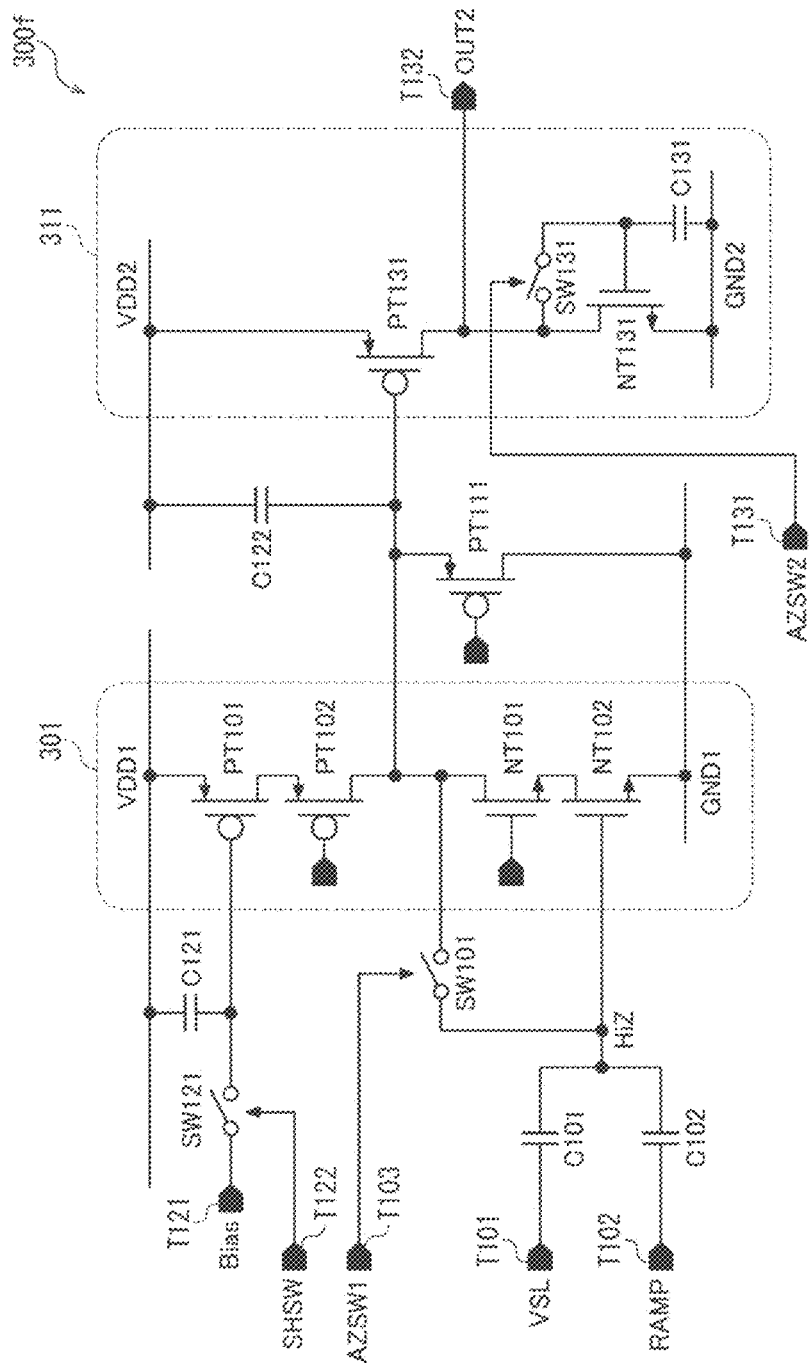
[FIG. 27]

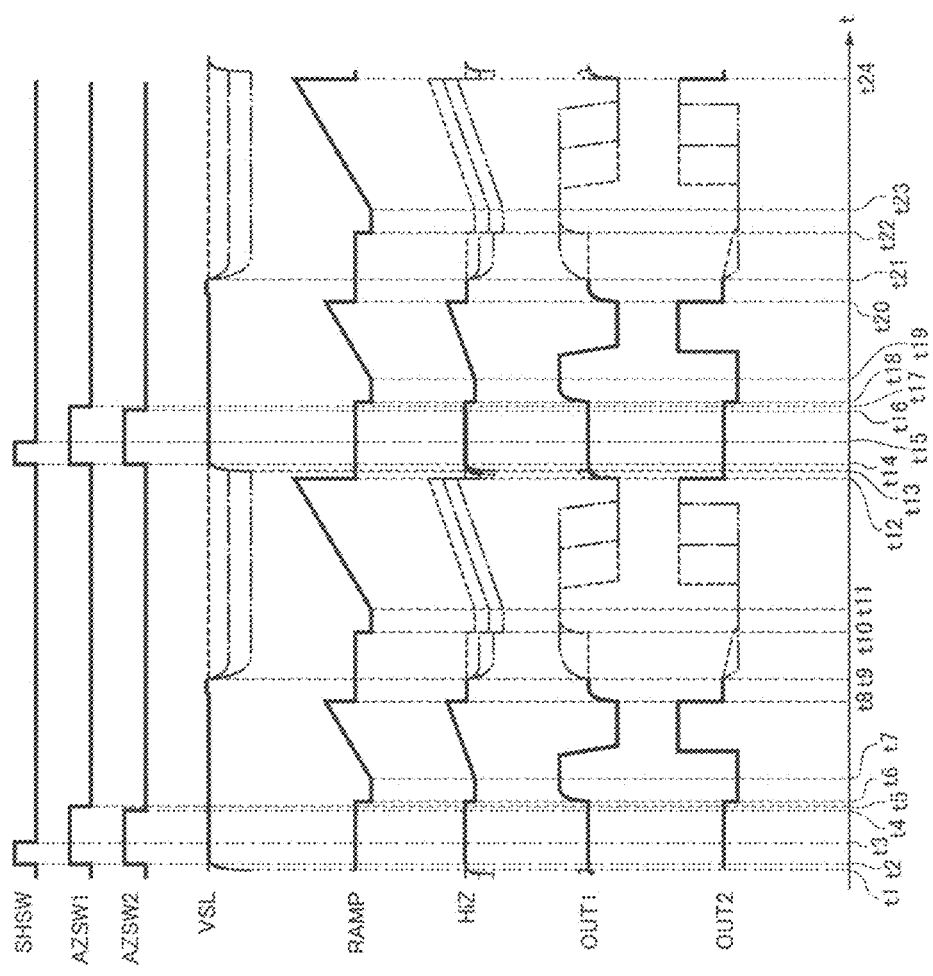
[FIG. 28]

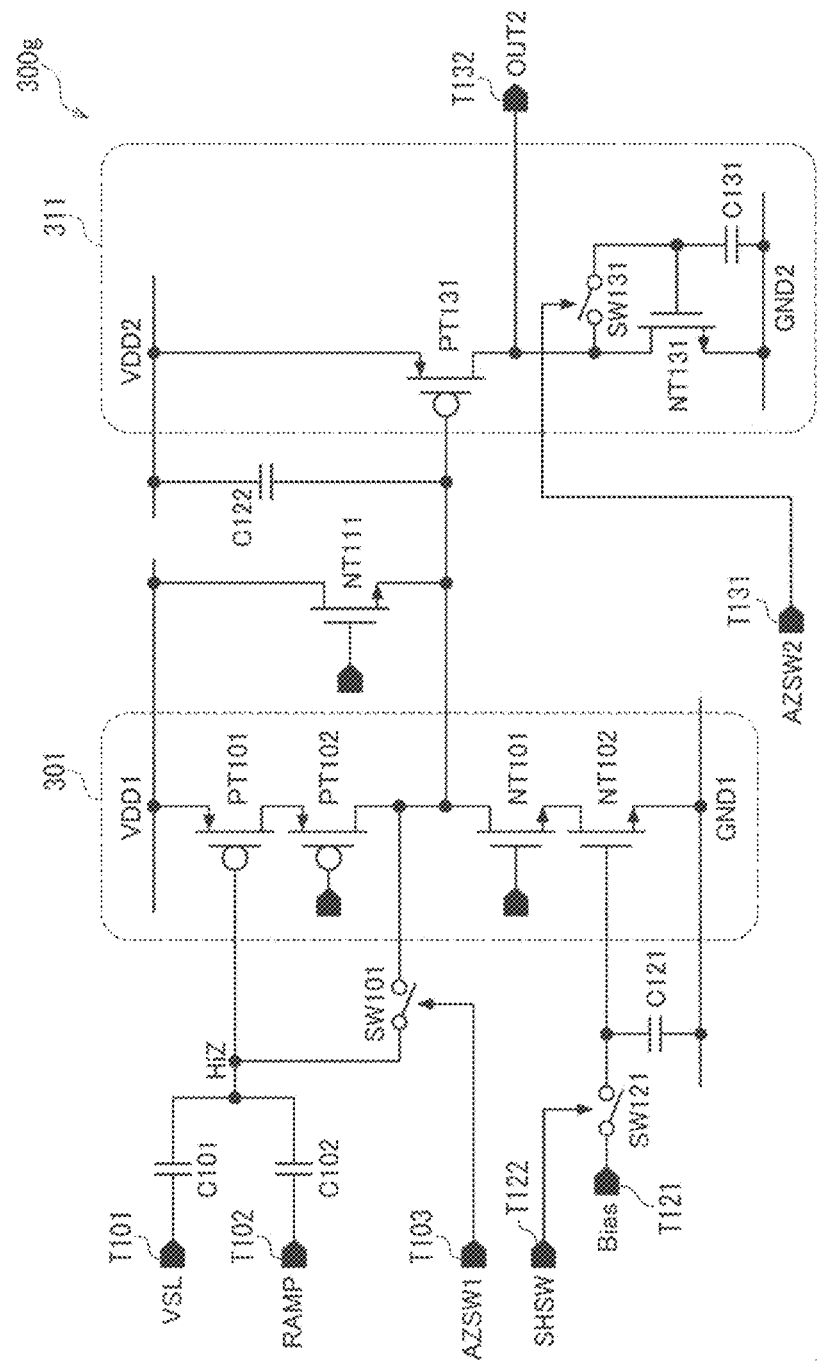
[FIG. 29]

[FIG. 30]
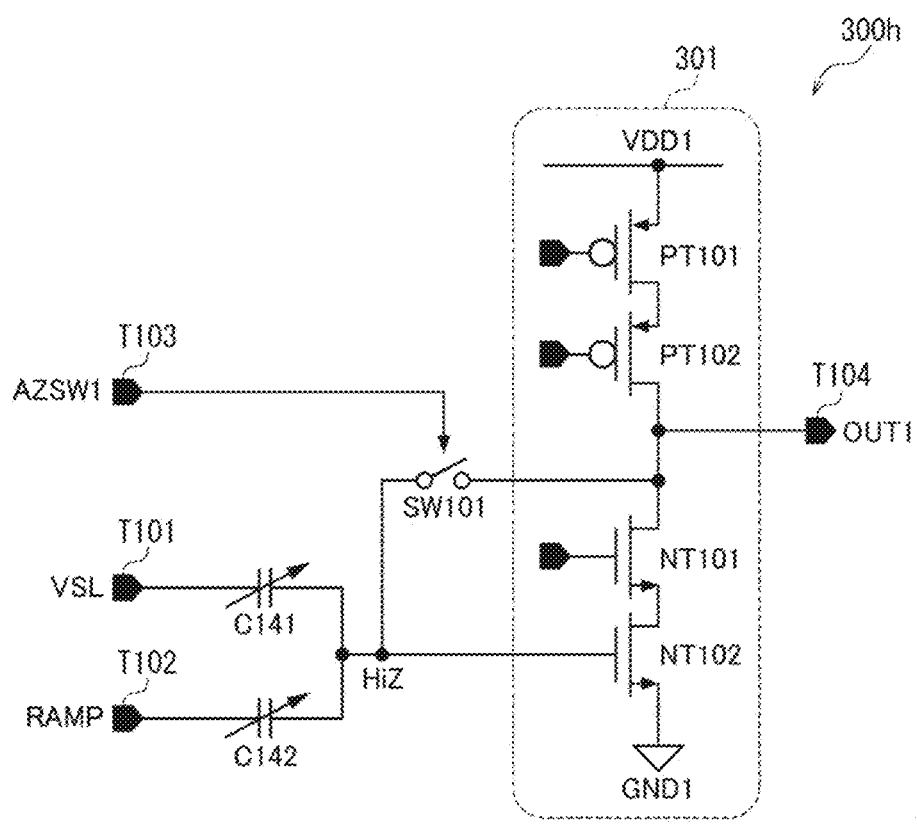

[FIG. 31]
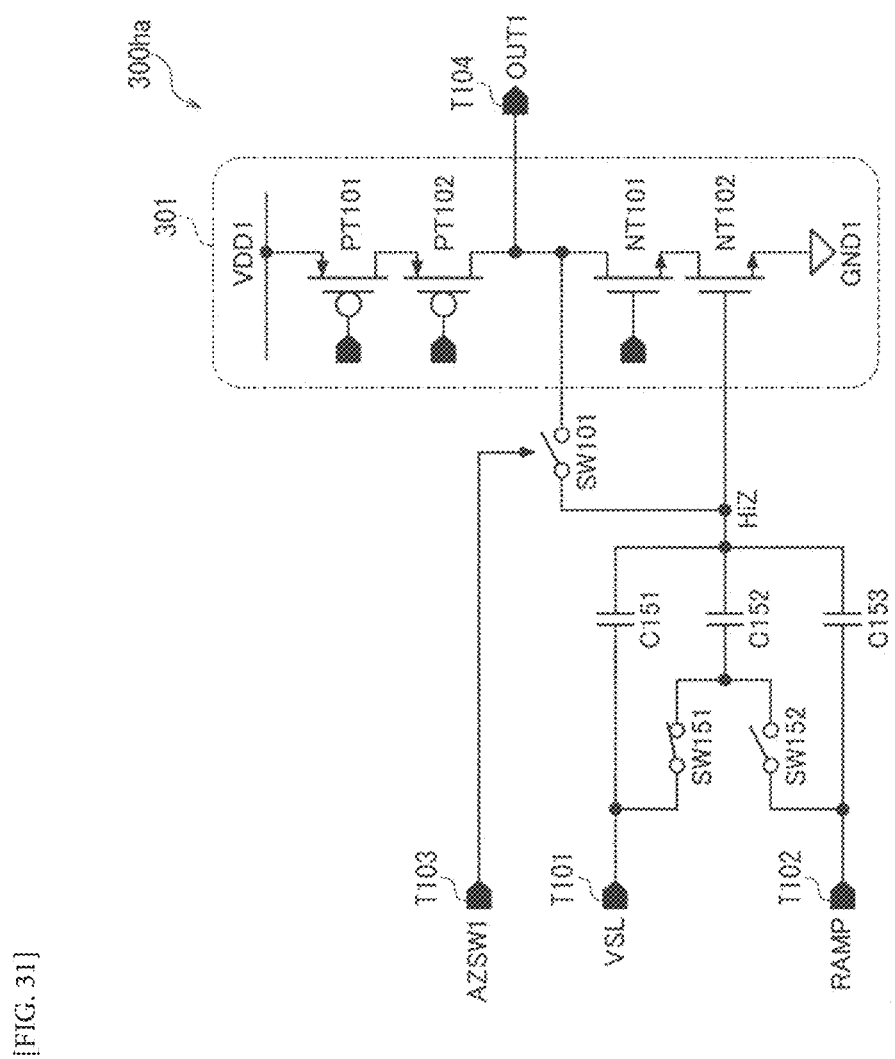

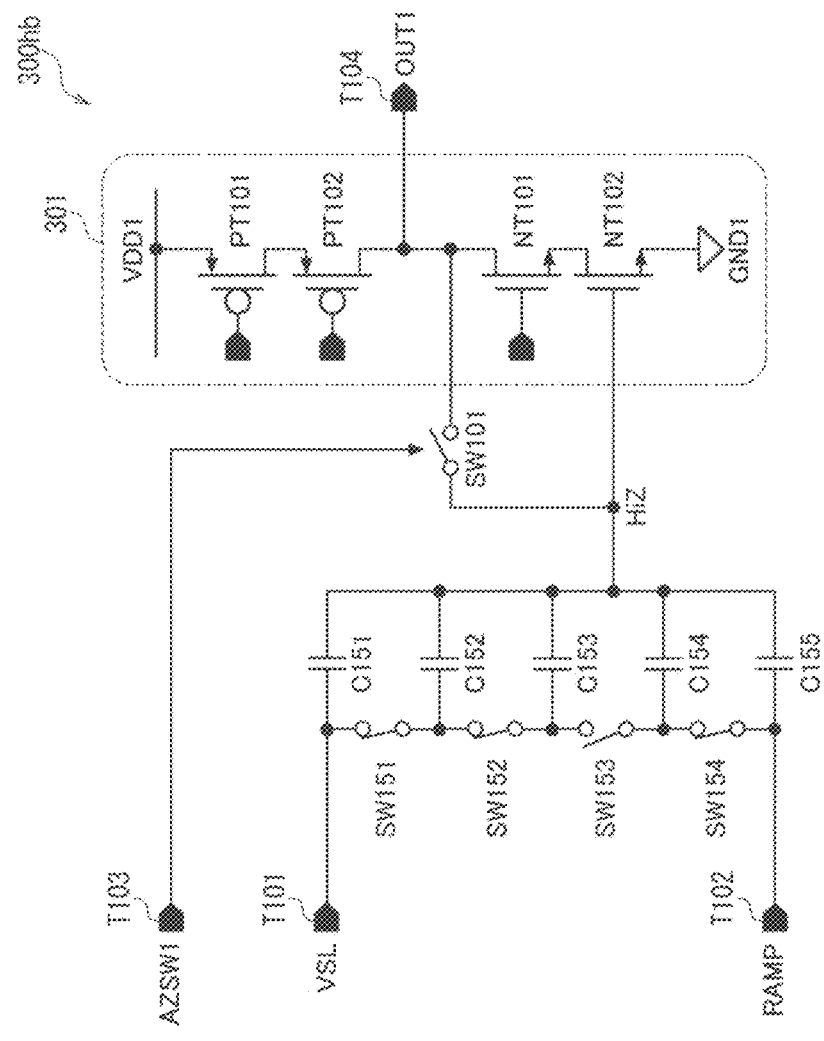
[FIG. 32]

[FIG. 33]
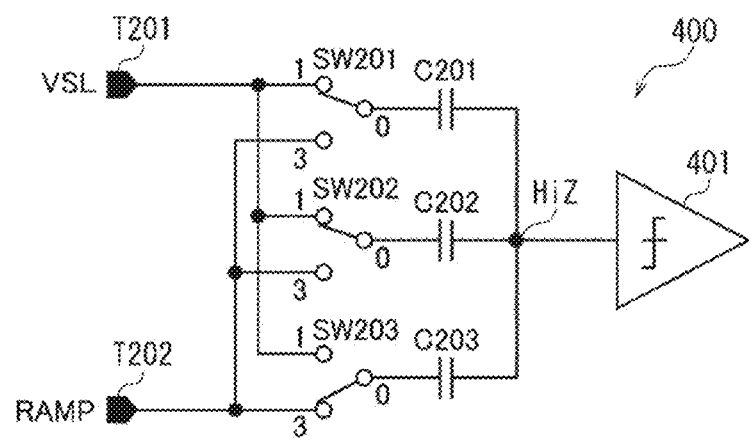

[FIG. 34]
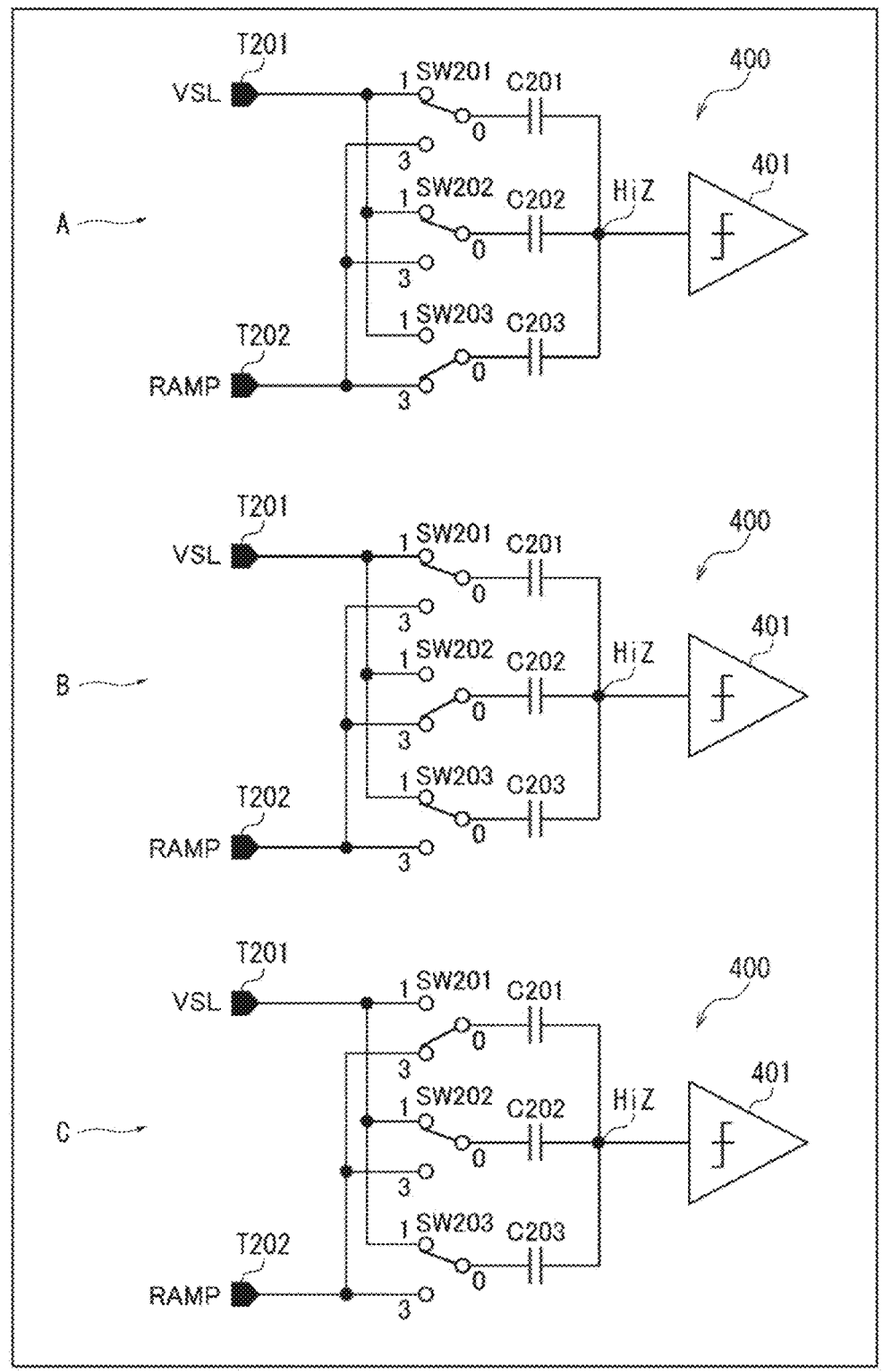

[FIG. 35]
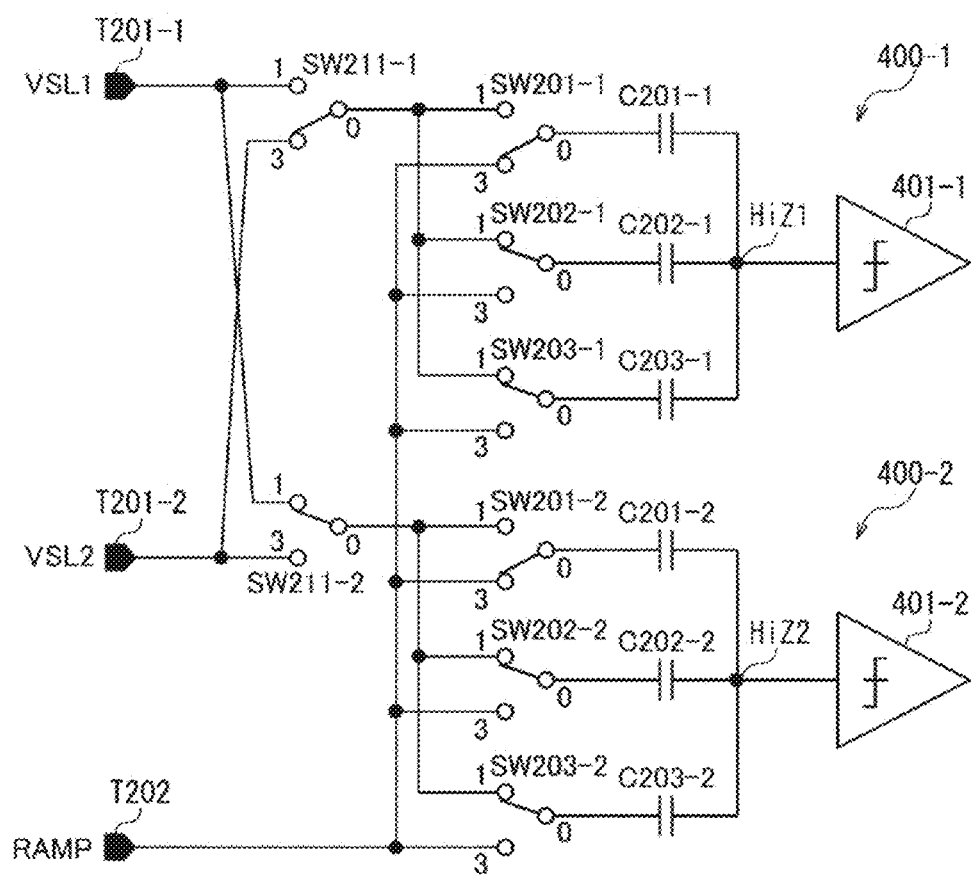

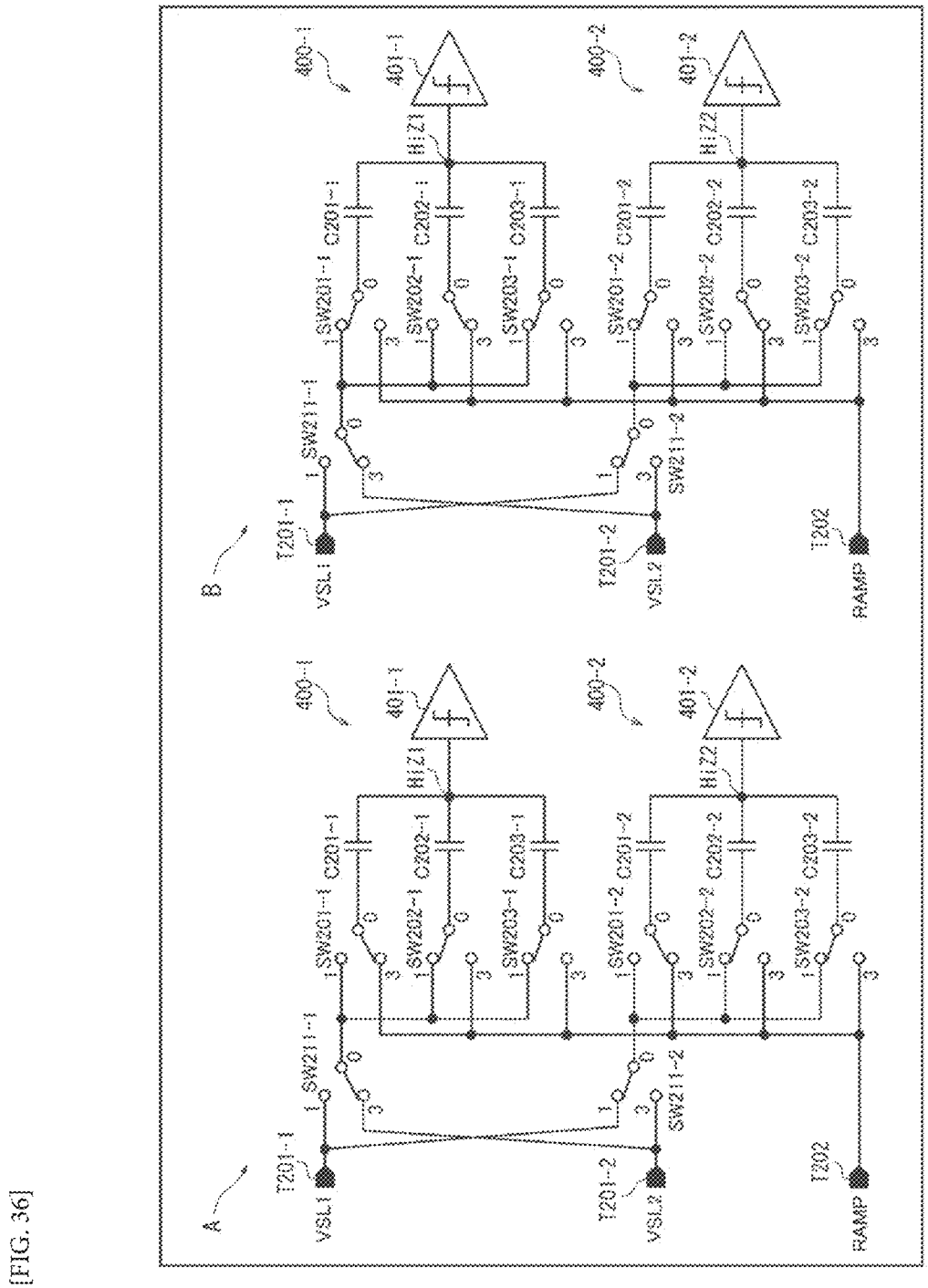
[FIG. 36]

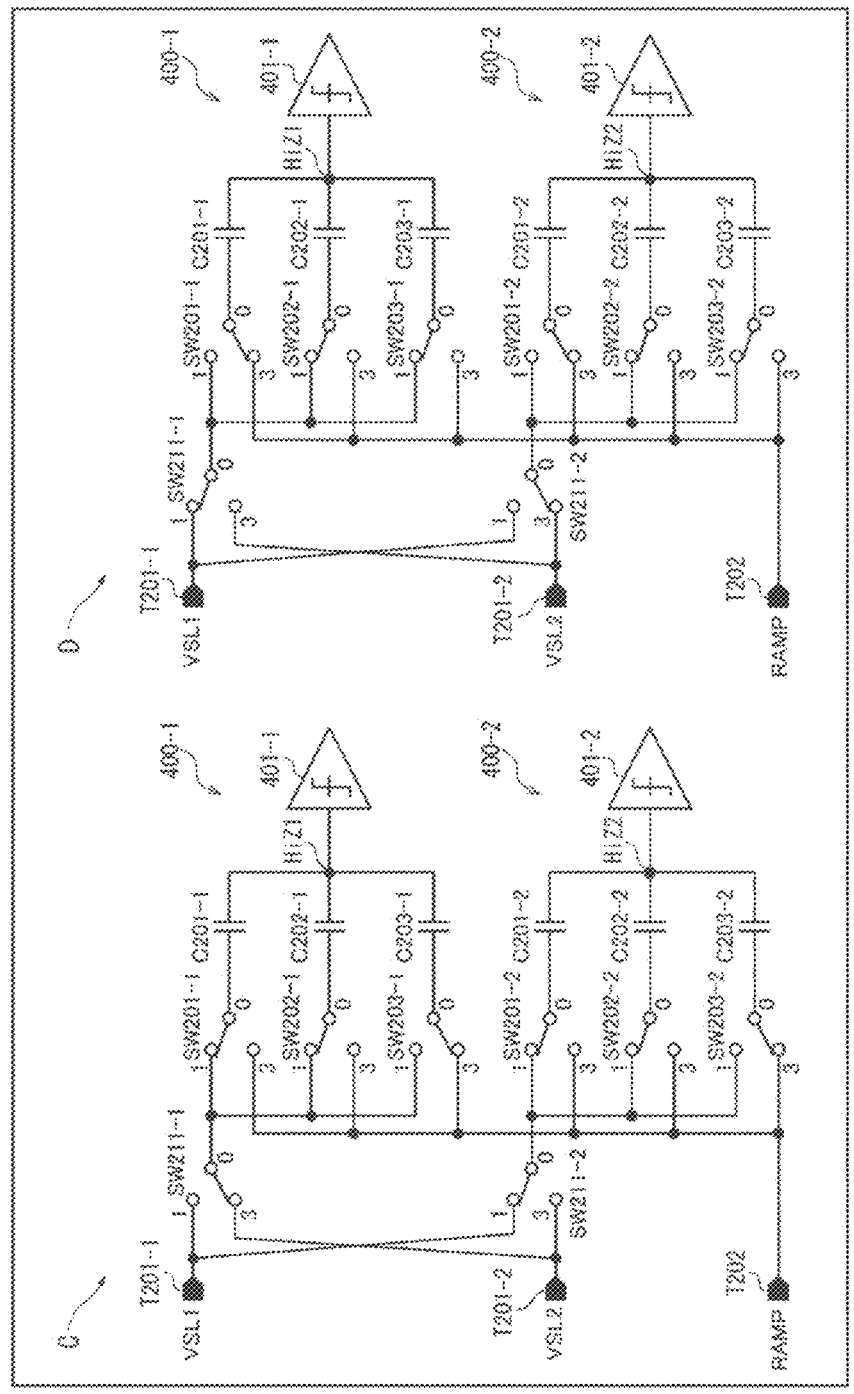
[FIG. 37]

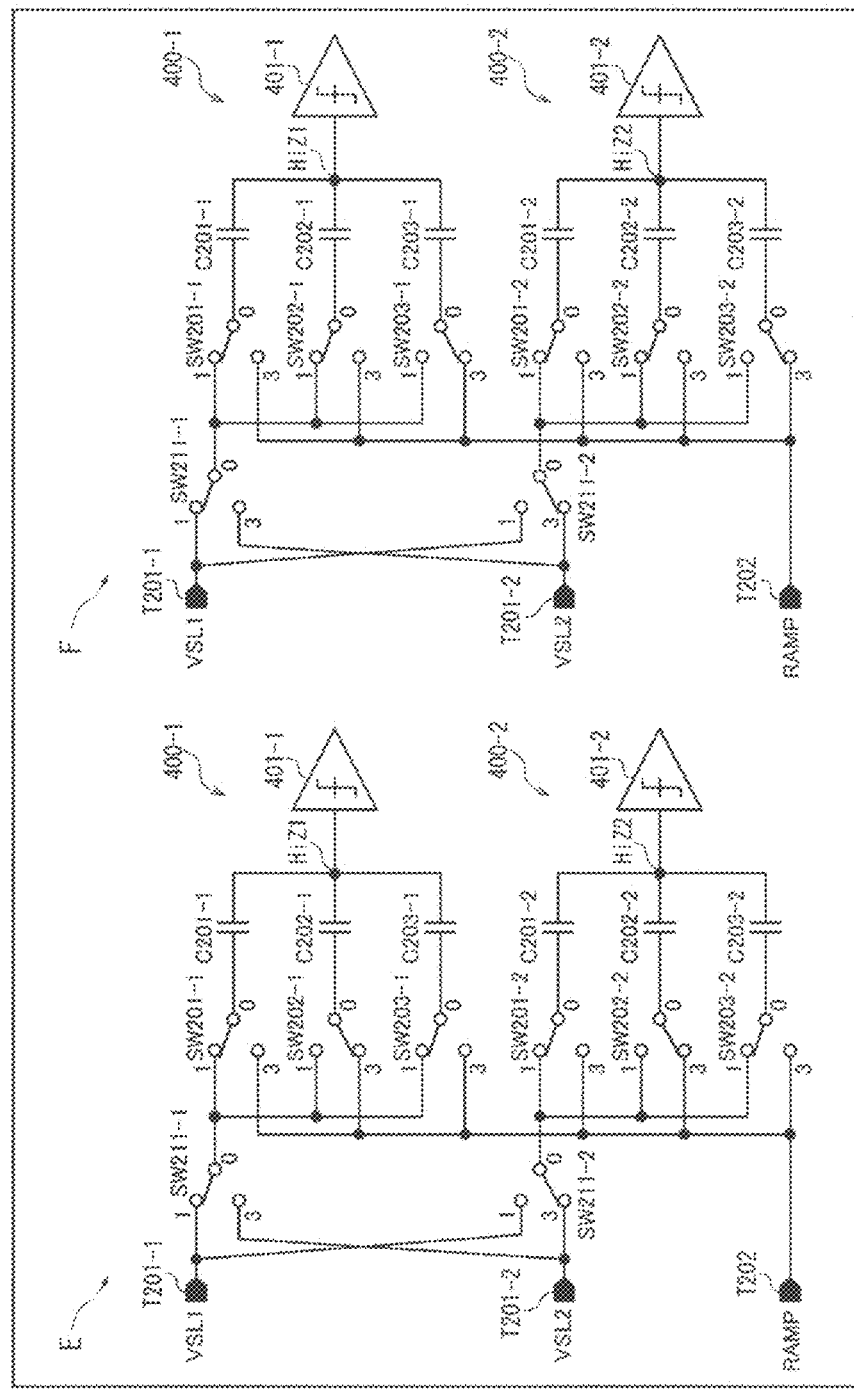
[FIG. 38]

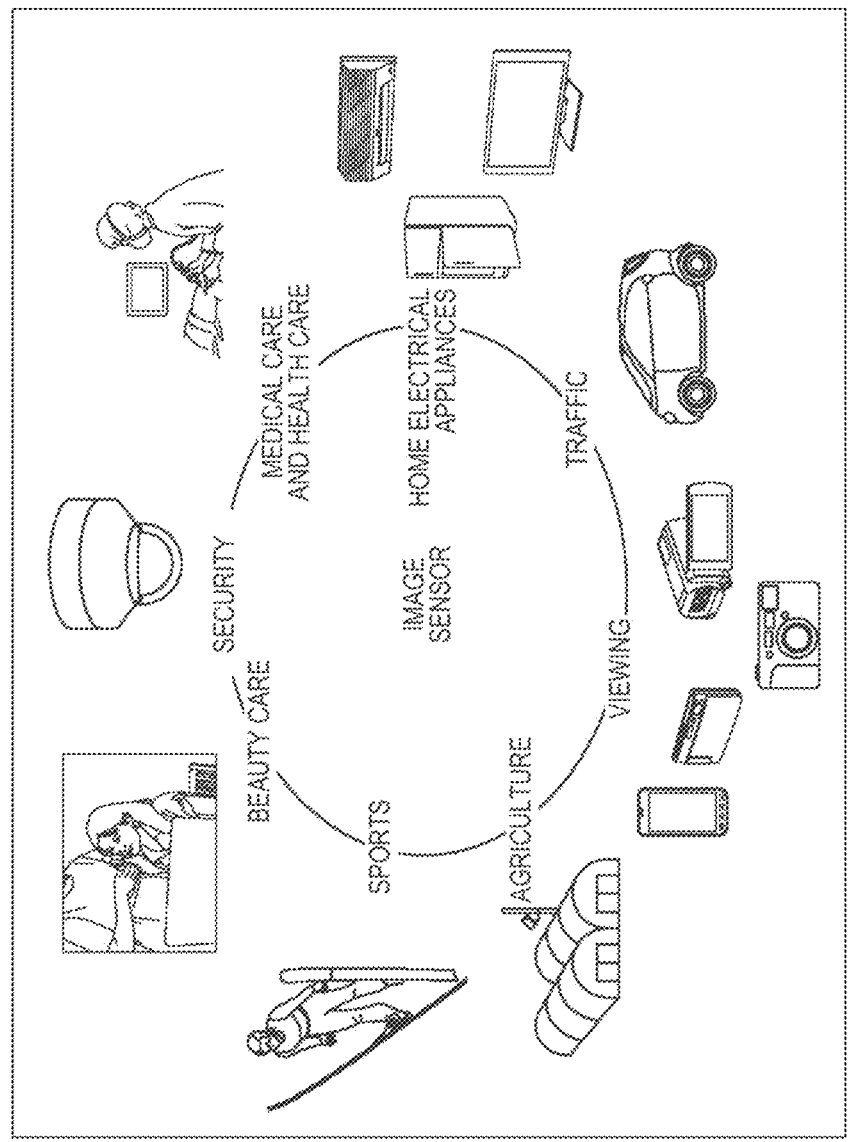
[FIG. 39]

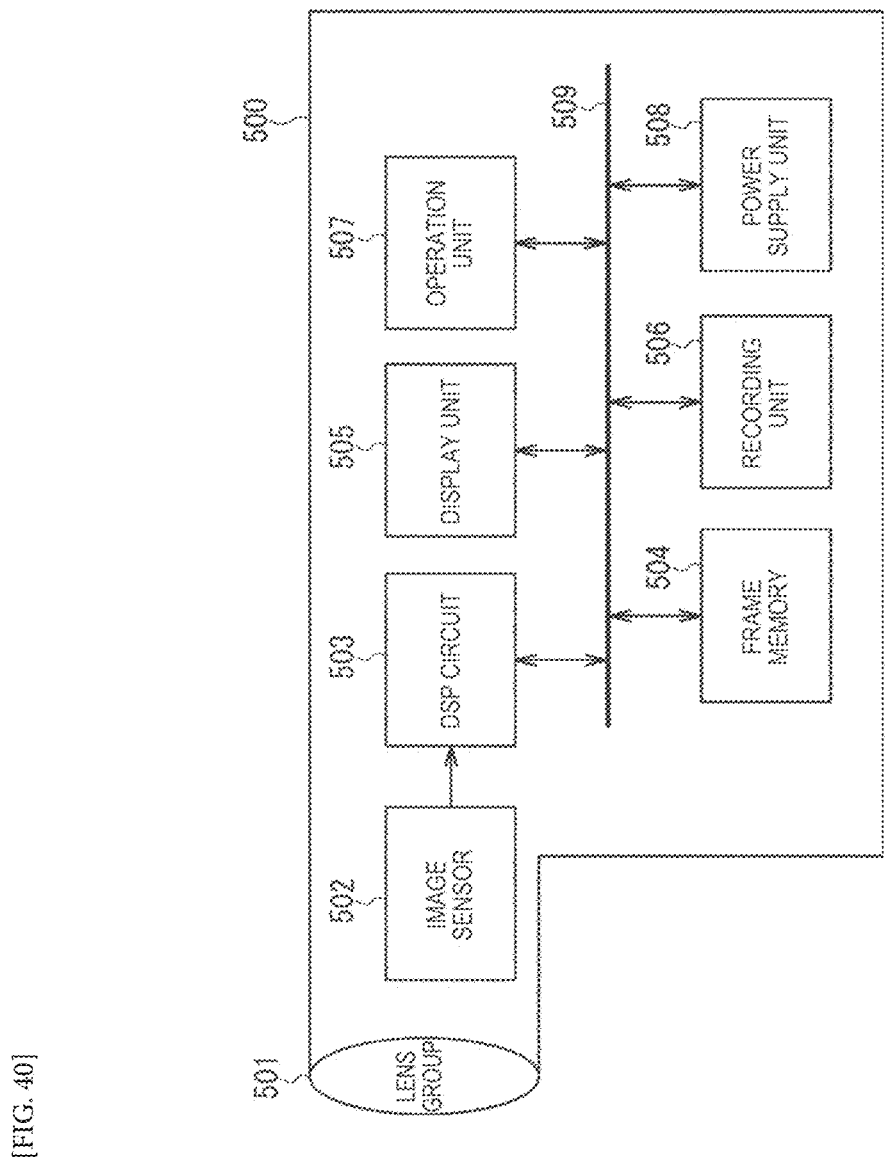
[FIG. 40]

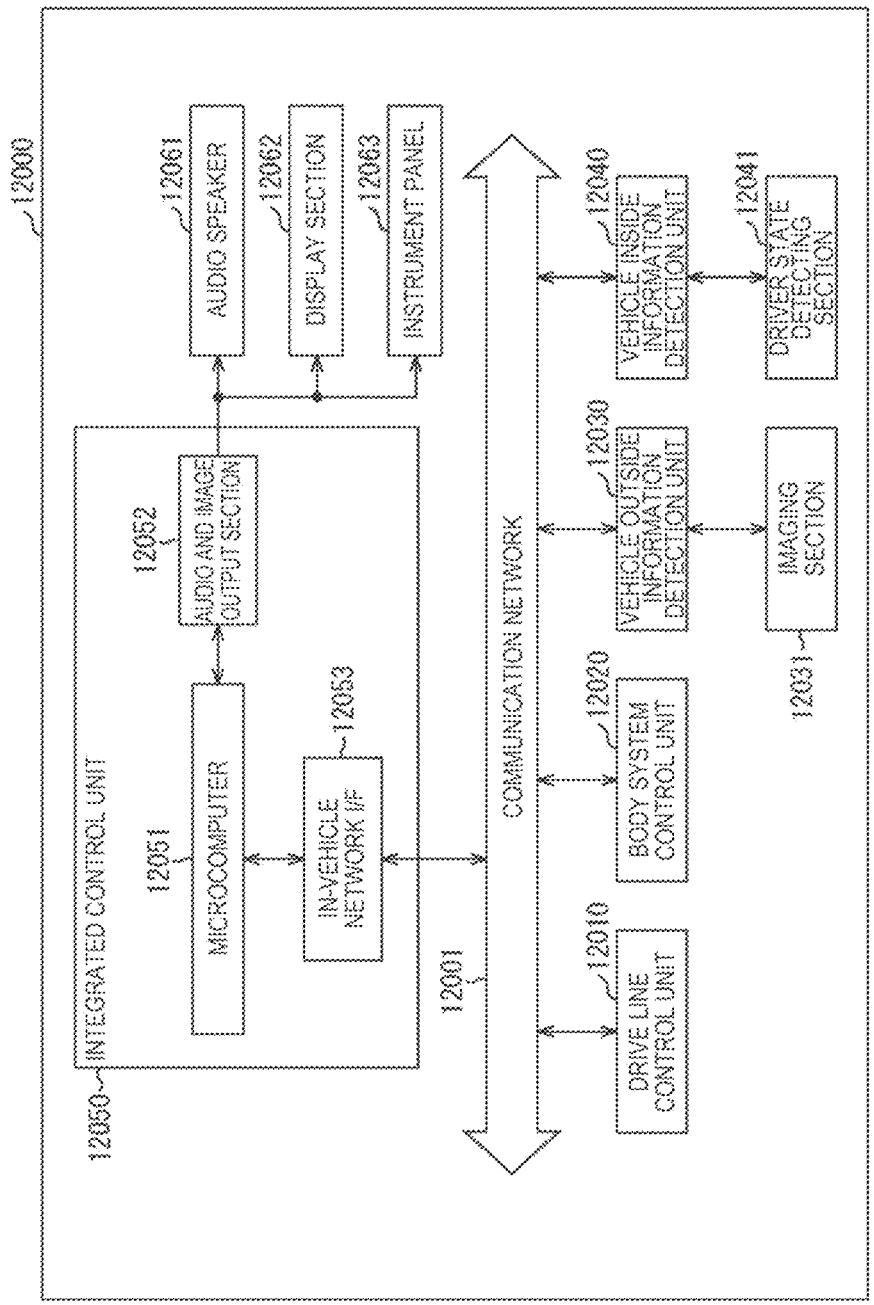
[FIG. 41]

[FIG. 42]
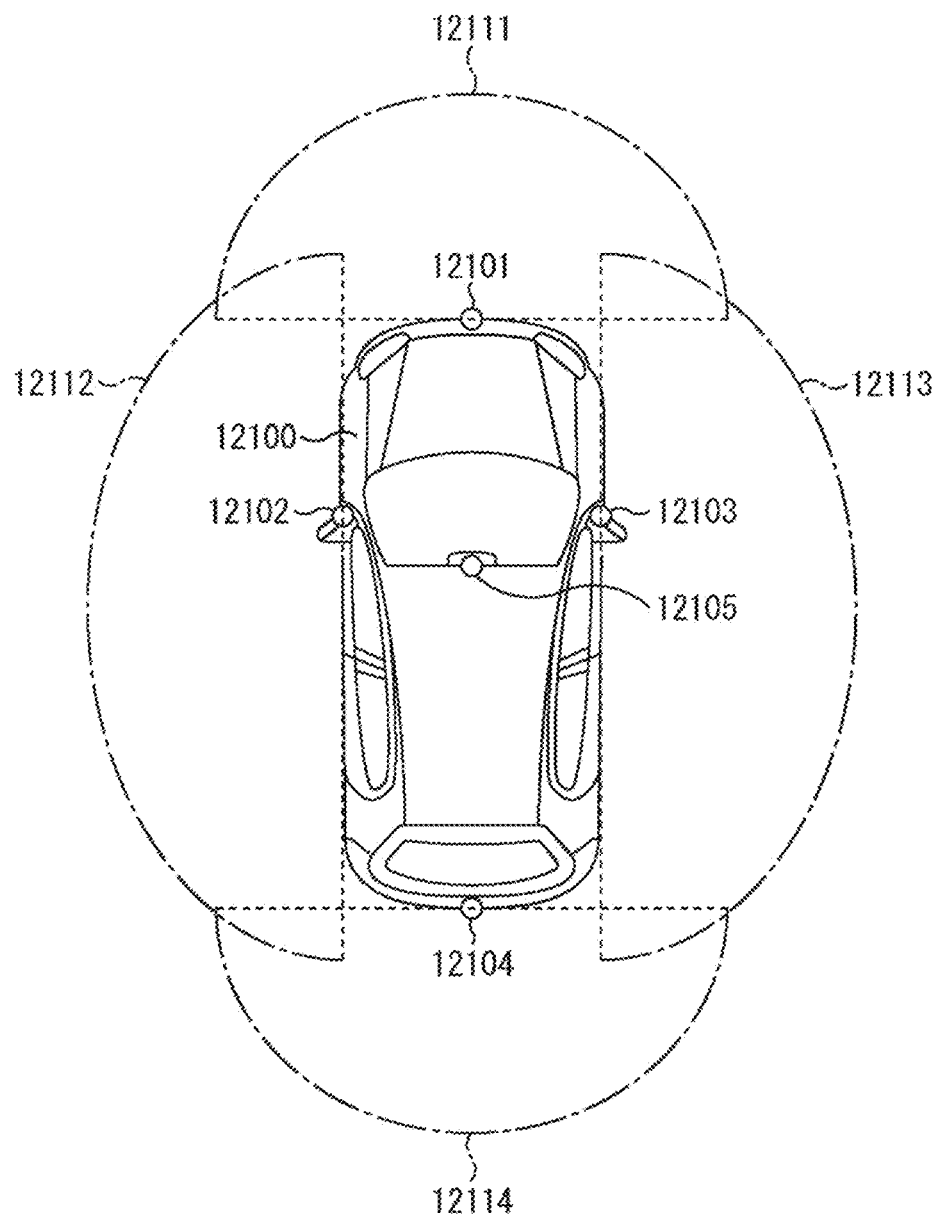

[FIG. 43]
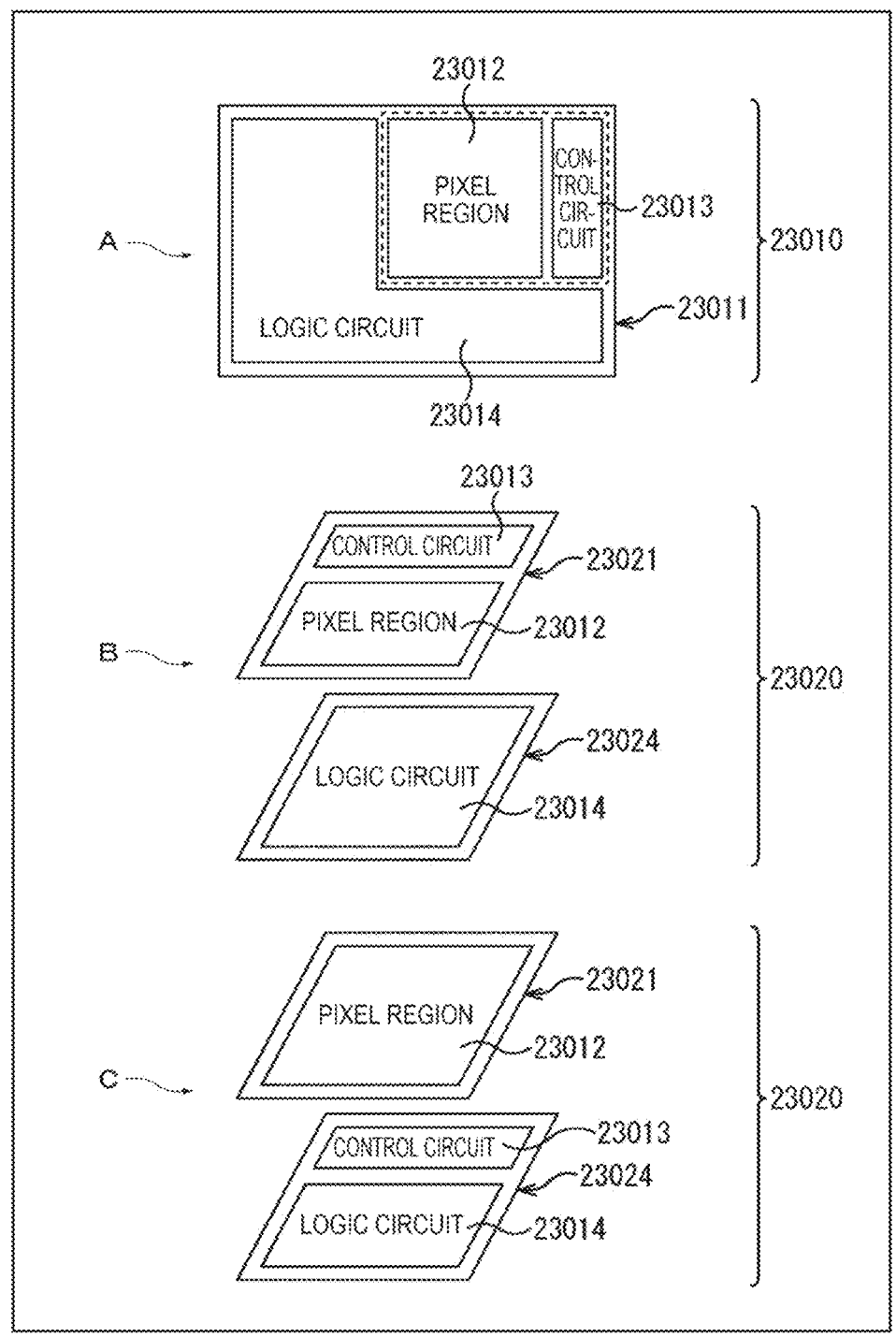

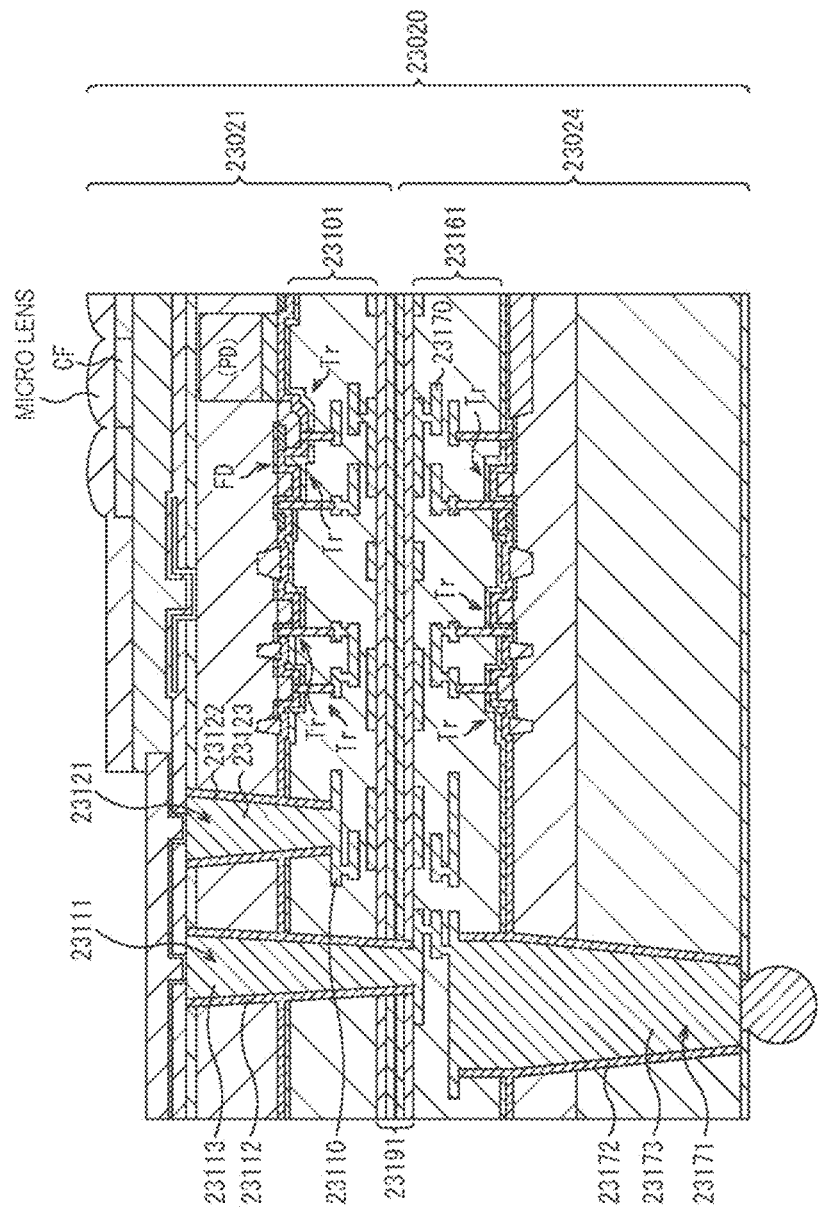
[FIG. 44]

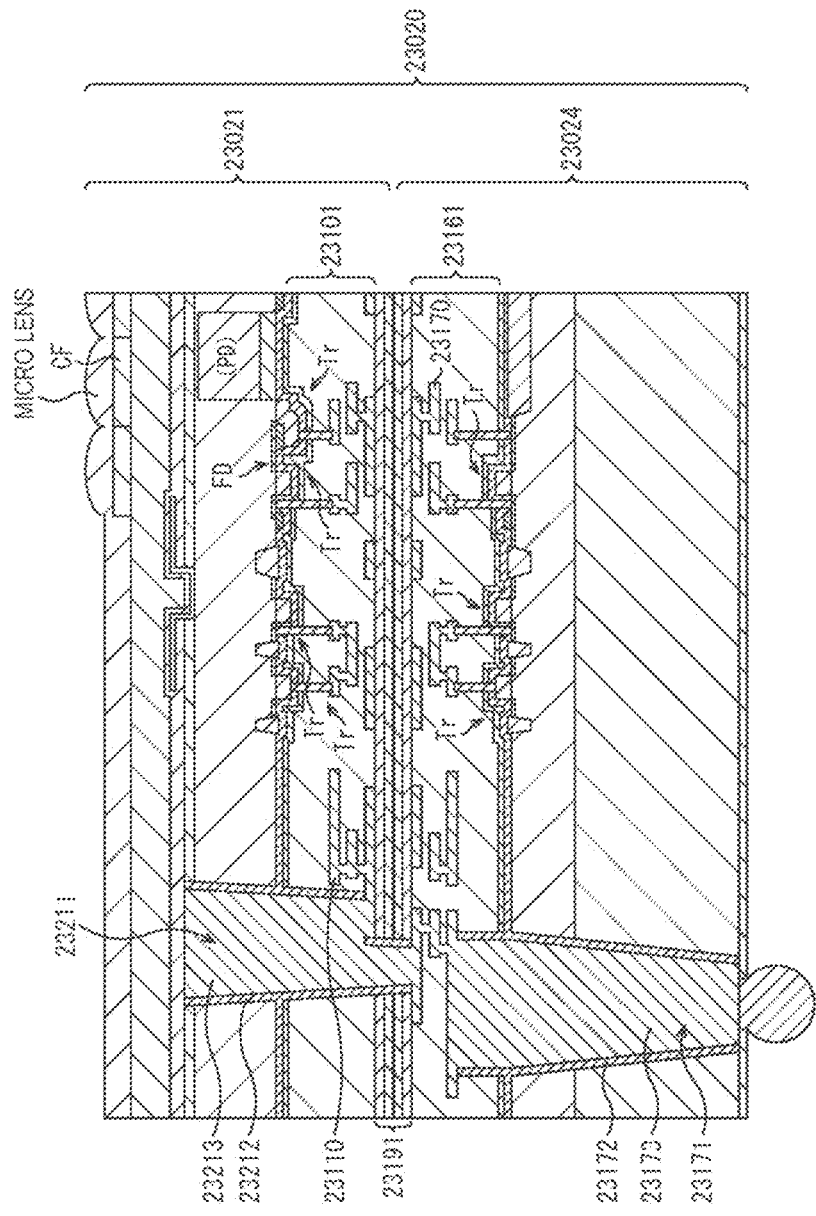
[FIG. 45]

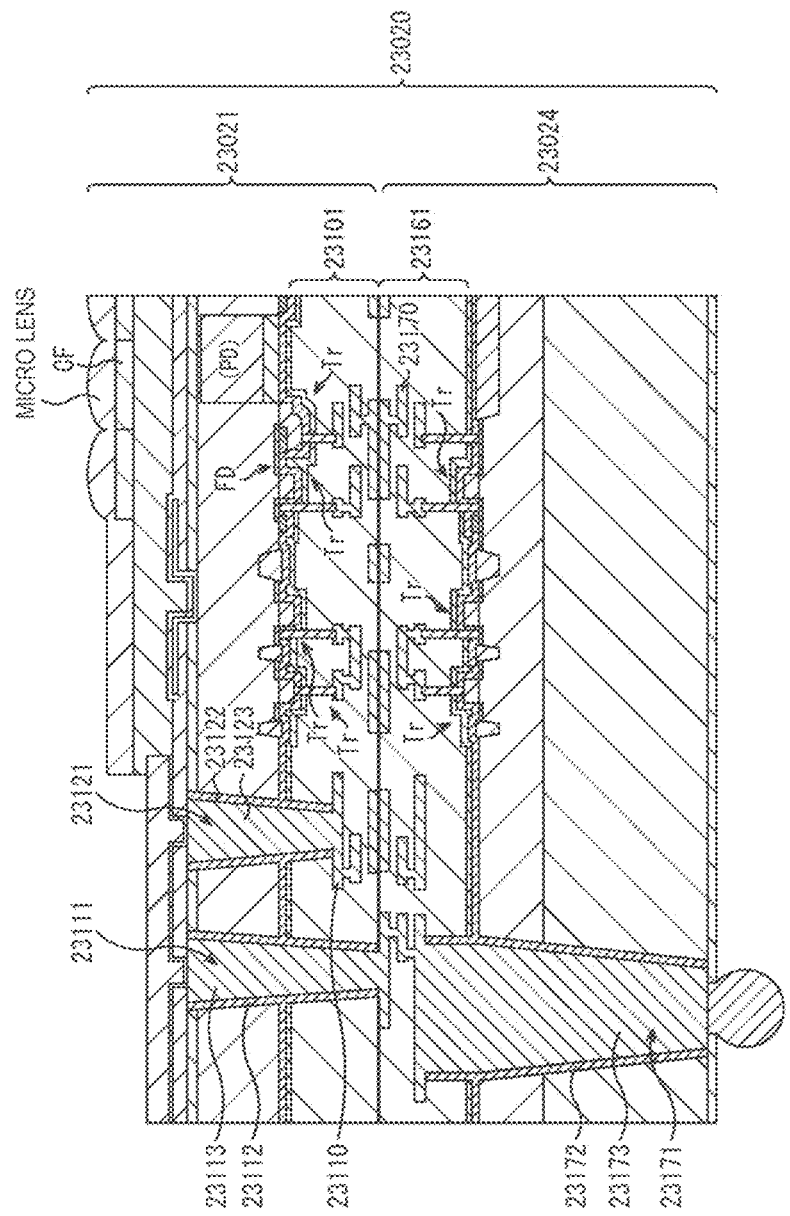
[FIG. 46]

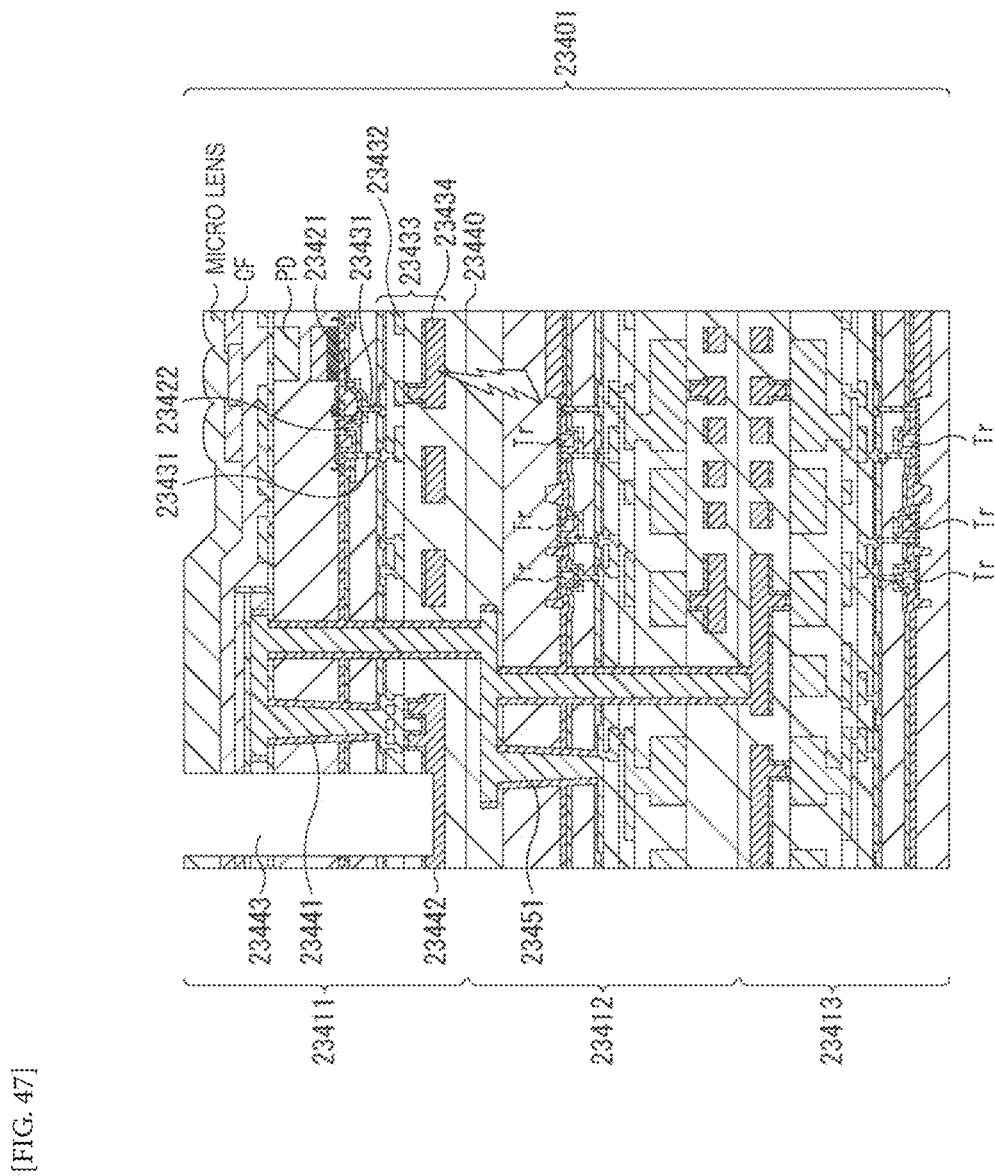
[FIG. 47]

IMAGE SENSOR, METHOD OF CONTROLLING IMAGE SENSOR, AND ELECTRONIC DEVICE

CROSS REFERENCE TO RELATED APPLICATIONS

The present application claims the benefit under 35 U.S.C. § 120 as a continuation application of U.S. application Ser. No. 16/488,734, filed on Aug. 26, 2019, now U.S. Pat. No. 11,039,098, which claims the benefit under 35 U.S.C. § 371 as a U.S. National Stage Entry of International Application No. PCT/JP2018/005650, filed in the Japanese Patent Office as a Receiving Office on Feb. 19, 2018, which claims priority to Japanese Patent Application Number JP2017-117453, filed in the Japanese Patent Office on Jun. 15, 2017, and Japanese Patent Application Number JP2017-039337, filed in the Japanese Patent Office on Mar. 2, 2017, each of which is hereby incorporated by reference in its entirety.

TECHNICAL FIELD

The present disclosure relates to an image sensor, a method of controlling an image sensor, and an electronic device, and particularly to an image sensor, a method of controlling an image sensor, and an electronic device that reduce power consumption.

BACKGROUND ART

In the related art, there is a CMOS image sensor that performs analog-to-digital (AD) conversion on a pixel signal by causing a comparator to compare an analog pixel signal with a reference signal with a ramp waveform that linearly decreases and counting time until the reference signal becomes less than the pixel signal (see Patent Literature 1, for example).

CITATION LIST

Patent Literature

[PTL 1]
JP 2009-124513A

SUMMARY

Technical Problem

Some conventional analog-to-digital converter (ADC) used in image sensors suffer from large power consumptions, a large portion of which can be attributed to the ADC's comparators. Other types of ADCs used in image sensors suffer from the fact that the ADC's comparators introduce undesirable distortions in the output signals. These distortions can be attributed, among other possible factors, to artifacts arising in the comparator's signals when inversion operations are performed.

Some embodiments of the present technology have been made in view of such circumstances and are adapted to reduce power consumption. Other embodiments of the present technology have been made in view of such circumstances and are adapted to reduce the formation of undesired artifacts in the comparator's signals when inversion operations are performed.

Solution to Problem

According to a first embodiment of the present technology, there is provided an imaging device comprising a pixel configured to generate a pixel signal, and a comparator. The comparator comprises a first capacitor configured to receive the pixel signal, a second capacitor configured to receive a reference signal, a node coupled to the first capacitor and the second capacitor, a first transistor having a gate coupled to the node, a second transistor coupled to the first transistor, and a third capacitor coupled between a gate of the second transistor and a first line supplied with a first voltage.

According to a second embodiment of the present technology, there is provided an imaging device comprising a pixel configured to generate a pixel signal and a comparator. The comparator comprises a first capacitor configured to receive the pixel signal, a second capacitor configured to receive a reference signal, a node coupled to the first capacitor and the second capacitor, a first transistor having a gate coupled to the node, a second transistor disposed between a first line supplied with a first fixed voltage and the first transistor, wherein the first transistor is coupled between the second transistor and a second line supplied with a second fixed voltage different from the first fixed voltage, and wherein a gate of the second transistor is isolated from the node.

Advantageous Effects of Invention

According to the first to second embodiments of the present disclosure, it is possible to reduce power consumption. According to the second embodiment, formation of undesired artifacts in the comparator's signals when inversion operations are performed can be reduced.

Note that the effects described here are not necessarily limited, and any effect that is desired to be described in the present disclosure may be exhibited.

BRIEF DESCRIPTION OF DRAWINGS

FIG. 1 is a block diagram illustrating an embodiment of an image sensor to which the present technology is applied.

FIG. 2 is a circuit diagram illustrating a configuration example of a unit pixel.

FIG. 3 is a circuit diagram illustrating a first embodiment of a comparator in FIG. 1.

FIG. 4 is a timing chart for explaining operations of the comparator.

FIG. 5 is a diagram for explaining operations of a comparator in the related art.

FIG. 6 is a diagram for explaining effects of the comparator illustrated in FIG. 3.

FIG. 7 is a circuit diagram illustrating a first modification example of the comparator illustrated in FIG. 3.

FIG. 8 is a circuit diagram illustrating a second modification example of the comparator illustrated in FIG. 3.

FIG. 9 is a circuit diagram illustrating a third modification example of the comparator illustrated in FIG. 3.

FIG. 10 is a circuit diagram illustrating a fourth modification example of the comparator illustrated in FIG. 3.

FIG. 11 is a timing chart for explaining operations of the comparator in FIG. 10.

FIG. 12 is a circuit diagram illustrating a fifth modification example of the comparator illustrated in FIG. 3.

FIG. 13 is a circuit diagram illustrating a sixth modification example of the comparator illustrated in FIG. 3.

FIG. 14 is a circuit diagram illustrating a seventh modification example of the comparator illustrated in FIG. 3.

FIG. 15 is a circuit diagram illustrating an eighth modification example of the comparator illustrated in FIG. 3.

FIG. 16 is a diagram for explaining changes in a reference signal to be input to a difference amplifier depending on a ratio of input capacitances.

FIG. 17 is a circuit diagram illustrating a first specific example of the comparator illustrated in FIG. 15.

FIG. 18 is a circuit diagram illustrating a second specific example of the comparator illustrated in FIG. 15.

FIG. 19 is a circuit diagram illustrating a ninth modification example of the comparator illustrated in FIG. 3.

FIG. 20 is a circuit diagram illustrating a second embodiment of the comparator illustrated in FIG. 1.

FIG. 21 is a timing chart for explaining operations of the comparator illustrated in FIG. 20.

FIG. 22 is a circuit diagram illustrating a first modification example of the comparator illustrated in FIG. 20.

FIG. 23 is a circuit diagram illustrating a second modification example of the comparator illustrated in FIG. 20.

FIG. 24 is a circuit diagram illustrating a third modification example of the comparator illustrated in FIG. 20.

FIG. 25 is a circuit diagram illustrating a fourth modification example of the comparator illustrated in FIG. 20.

FIG. 26 is a circuit diagram illustrating a fifth modification example of the comparator illustrated in FIG. 20.

FIG. 27 is a circuit diagram illustrating a sixth modification example of the comparator illustrated in FIG. 20.

FIG. 28 is a timing chart for explaining operations of the comparator illustrated in FIG. 27.

FIG. 29 is a circuit diagram illustrating a seventh modification example of the comparator illustrated in FIG. 20.

FIG. 30 is a circuit diagram illustrating a eighth modification example of the comparator illustrated in FIG. 20.

FIG. 31 is a circuit diagram illustrating a first specific example of the comparator illustrated in FIG. 30.

FIG. 32 is a circuit diagram illustrating a second specific example of the comparator illustrated in FIG. 30.

FIG. 33 is a circuit diagram illustrating a third embodiment of the comparator illustrated in FIG. 1.

FIG. 34 is a timing chart for explaining operations of the comparator illustrated in FIG. 33.

FIG. 35 is a circuit diagram illustrating a modification example of the third embodiment of the comparator illustrated in FIG. 1.

FIG. 36 is a timing chart for explaining operations of the comparator illustrated in FIG. 35.

FIG. 37 is a timing chart for explaining operations of the comparator illustrated in FIG. 35.

FIG. 38 is a timing chart for explaining operations of the comparator illustrated in FIG. 35.

FIG. 39 illustrates usage examples of an image sensor.

FIG. 40 is a block diagram illustrating a configuration example of an electronic device.

FIG. 41 is a block diagram illustrating an example of a schematic configuration of a vehicle control system.

FIG. 42 is an explanatory diagram illustrating an example of installation positions of a vehicle outside information detecting section and the imaging section.

FIG. 43 is a diagram illustrating an outline of a configuration example of a stack type solid-state imaging device to which the technology according to an embodiment of the present disclosure can be applied.

FIG. 44 is a sectional view illustrating a first configuration example of the stack type solid-state imaging device.

FIG. 45 is a sectional view illustrating a second configuration example of the stack type solid-state imaging device.

FIG. 46 is a sectional view illustrating a third configuration example of the stack type solid-state imaging device.

FIG. 47 is a sectional view illustrating another configuration example of a stack type solid-state imaging device to which the technology according to an embodiment of the present disclosure can be applied.

DESCRIPTION OF EMBODIMENTS

Hereinafter, embodiments for carrying out the present technology (hereinafter referred to as "embodiments") will be described in detail with reference to the drawings. The description will be given in the following order.
1. First embodiment (Example in which differential type amplifier is used for comparator)
2. Modification examples of first embodiment
3. Second embodiment (Example in which single type amplifier is used for comparator)
4. Modification examples of second embodiment
5. Third Embodiment
6. Modification example of third embodiment
7. Other modification examples
8. Application examples of image sensor 1. First Embodiment First, a first embodiment of the present technology will be described with reference to FIGS. 1 to 6.
<Configuration Example of Image Sensor>

FIG. 1 is a block diagram illustrating an embodiment of an image sensor 100 to which the present technology is applied.

The image sensor 100 includes a pixel section 101, a timing control circuit 102, a vertical scanning circuit 103, a digital-to-analog conversion device (DAC) 104, an analog-to-digital conversion device (ADC) group 105, a horizontal transfer scanning circuit 106, an amplifier circuit 107, and a signal processing circuit 108.

Unit pixels (hereinafter, also simply referred to as pixels) including photoelectric conversion element that performs photoelectric conversion of incident light into the amount of electric charge in accordance with the light intensity are arranged in a matrix shape in the pixel section 101. A specific circuit configuration of the unit pixels will be described later with reference to FIG. 2. Also, a pixel drive line 109 is arranged in a right-left direction in the drawing (a pixel arrangement direction of a pixel row/horizontal direction) for each row, and a vertical signal line 110 is arranged in an up-down direction in the drawing (pixel arrangement direction of a pixel column/vertical direction) for each column in the pixel arrangement in the matrix shape. One end of the pixel drive line 109 is connected to an output end corresponding to each row of the vertical scanning circuit 103. Although one pixel drive line 109 is illustrated for each pixel row in FIG. 1, two or more pixel drive lines 109 may be provided for each pixel row.

The timing control circuit 102 includes a timing generator (not shown) configured to generate various timing signals. The timing control circuit 102 controls driving of the vertical scanning circuit 103, the DAC 104, the ADC group 105, the horizontal transfer scanning circuit 106, and the like on the basis of the various timing signals generated by the timing generator on the basis of control signals and the like provided from the outside.

The vertical scanning circuit 103 is formed of a shift register, an address decoder, and the like. Although a specific configuration is omitted in the drawing herein, the vertical scanning circuit 103 includes a reading scanning system and a sweep scanning system.

The reading scanning system performs selective scanning in units of rows of unit pixels, from which signals are read, in order. Meanwhile, the sweep scanning system performs sweep scanning of sweeping (resetting) unnecessary electric charges from the photoelectric conversion elements in unit pixels on a reading row, on which the reading scanning system performs reading scanning, before the reading scanning by the time of a shutter speed. A so-called electronic shutter operation is performed by sweeping (resetting) unnecessary charges by the sweep scanning system. Here, the electronic shutter operation means an operation of discarding photoelectric charges of the photoelectric conversion elements and newly starting exposure (starting accumulation of photoelectric charges). A signal read by the reading scanning system through the reading operation corresponds to intensity of light that is incident after the previous reading operation or the electronic shutter operation. The period from the timing of reading through the previous reading operation or the timing of wiping through the electronic shutter operation to the timing of reading through the reading operation performed this time is photoelectric charge accumulation time (exposure time) in the unit pixels.

A pixel signal VSL output from each unit pixel in a pixel row selectively scanned by the vertical scanning circuit 103 is supplied to the ADC group 105 via the vertical signal line 110 in each column.

The DAC 104 generates a reference signal RAMP that is a signal with a ramp waveform that linearly increases and supplies the reference signal RAMP to the ADC group 105.

The ADC group 105 includes comparators 121-1 to 121-*n*, counters 122-1 to 122-*n*, and latches 123-1 to 123-*n*. Hereinafter, the comparators 121-1 to 121-*n*, the counters 122-1 to 122-*n* and the latches 123-1 to 123-*n* will be simply referred to as a comparator 121, a counter 122, and a latch 123 in a case in which individual distinction is not necessary.

One comparator 121, one counter 122, and one latch 123 are provided for each column of the pixel section 101 and form an ADC. That is, the ADC is provided for each column of the pixel section 101 in the ADC group 105.

The comparator 121 compares a voltage of a signal obtained by adding, via capacitances, the pixel signal VSL output from each pixel and the reference signal RAMP with a predetermined reference voltage and supplies an output signal indicating a result of the comparison to the counter 122.

The counter 122 converts the analog pixel signal to a digital pixel signal represented by a count value by counting time until the signal obtained by adding, via the capacitances, the pixel signal VSL and the reference signal RAMP exceeds the predetermined reference voltage, on the basis of the output signal of the comparator 121. The counter 122 supplies the count value to the latch 123.

The latch 123 holds the count value supplied from the counter 122. The latch 123 performs correlated double sampling (CDS) by acquiring a difference between a count value in a phase D corresponding to the pixel signal in a signal level and a count value in a phase P corresponding to the pixel signal in a reset level.

The horizontal transfer scanning circuit 106 is formed of a shift register, an address decoder, and the like and selectively scans the circuit portions corresponding to the pixel columns in the ADC group 105 in order. The digital pixel signal held by the latch 123 is transferred to the amplifier circuit 107 via the horizontal transfer line 111 in order by the horizontal transfer scanning circuit 106 performing the selective scanning.

The amplifier circuit 107 amplifies the digital pixel signal supplied from the latch 123 and supplies the digital pixel signal to the signal processing circuit 108.

The signal processing circuit 108 performs predetermined signal processing on the digital pixel signal supplied from the amplifier circuit 107 and generates two-dimensional image data. For example, the signal processing circuit 108 performs correction of vertical line defects and point defects or signal clamping or performs digital signal processing such as parallel-serial conversion, compression, encoding, addition, averaging, and an intermittent operation. The signal processing circuit 108 outputs the generated image data to a device in a later stage.

<Configuration Example of Pixel>

FIG. 2 is a circuit diagram illustrating a configuration example of a pixel 150 provided in the pixel section 101.

The pixel 150 includes a photodiode 151 as a photoelectric conversion element and includes four transistors, that is, a transfer transistor 152, an amplification transistor 154, a selection transistor 155, and a reset transistor 156 as active elements for the photodiode 151.

The photodiode 151 performs photoelectric conversion on the incident light into electric charge (here, electrons) of an amount in accordance with the light intensity thereof.

The transfer transistor 152 is connected between the photodiode 151 and a floating diffusion (FD) 153. The transfer transistor 152 transfers the electric charge accumulated in the photodiode 151 to the FD 153 when the transfer transistor 152 is brought into an ON state by a drive signal TX supplied from the vertical scanning circuit 103.

A gate of the amplification transistor 154 is connected to the FD 153. The amplification transistor 154 is connected to the vertical signal line 110 via the selection transistor 155 and forms a source follower with a constant current source 157 outside the pixel section 101. If the selection transistor 155 is turned on by a drive signal SEL supplied from the vertical scanning circuit 103, then the amplification transistor 154 amplifies a potential of the FD 153 and outputs the pixel signal indicating a voltage in accordance with the potential to the vertical signal line 110. Then, the pixel signal output from each pixel 150 is supplied to each comparator 121 in the ADC group 105 via the vertical signal line 110.

The reset transistor 156 is connected between a power source VDD and the FD 153. When the reset transistor 156 is turned on by a drive signal RST supplied from the vertical scanning circuit 103, the potential of the FD 153 is reset to the potential of the power source VDD.

<Configuration Example of Comparator>

FIG. 3 is a circuit diagram illustrating a configuration example of a comparator 200 that is applied to the comparator 121 illustrated in FIG. 1.

The comparator 200 includes a difference amplifier 201, capacitors C11 to C13, a switch SW11, and a switch SW12. The difference amplifier 201 includes a PMOS transistor PT11, a PMOS transistor PT12, and NMOS transistors NT11 to NT13.

A source of the PMOS transistor PT11 and a source of the PMOS transistor PT12 are connected to the power source VDD1. A drain of the PMOS transistor PT11 is connected to a gate of the PMOS transistor PT11 and a drain of the NMOS transistor NT11. A drain of the PMOS transistor PT12 is connected to a drain of the NMOS transistor NT12 and an output terminal T15 of an output signal OUT1. A source of the NMOS transistor NT11 is connected to a source of the NMOS transistor NT12 and a drain of the NMOS transistor NT13. A source of the NMOS transistor NT13 is connected to a ground GND1.

Also, the PMOS transistor PT11 and the PMOS transistor PT12 form a current mirror circuit. The NMOS transistors NT11 to NT13 form a differential comparison unit. That is, the NMOS transistor NT13 operates as a current source by a bias voltage VG input from the outside via an input terminal T14, and the NMOS transistor NT11 and the NMOS transistor NT112 operate as differential transistors.

The capacitor C11 is connected between an input terminal T11 of the pixel signal VSL and the gate of the NMOS transistor NT11 and serves as an input capacitance with respect to the pixel signal VSL.

The capacitor C12 is connected between an input terminal T12 of the reference signal RAMP and the gate of the NMOS transistor NT11 and serves as an input capacitance with respect to the reference signal RAMP.

The switch SW11 is connected between the drain and the gate of the NMOS transistor NT11 and is turned on or off by a drive signal AZSW1 input from the timing control circuit 102 via an input terminal T13.

The switch SW12 is connected between the drain and the gate of the NMOS transistor NT12 and is turned on or off by the drive signal AZSW1 input from the timing control circuit 102 via the input terminal T13.

The capacitor C13 is connected between the gate of the NMOS transistor NT12 and the ground GND1.

Hereinafter, a connection point of the capacitor C11, the capacitor C12, and the switch SW11 will be referred to as a node HiZ. Hereinafter, a connection point of the gate of the NMOS transistor NT12, the capacitor C13, and the switch SW12 will be referred to as a node VSH.

<Operations of Comparator>

Next, operations of the comparator 200 will be described with reference to the timing chart in FIG. 4. FIG. 4 is a timing chart of the drive signal AZSW1, the reference signal RAMP, the pixel signal VSL, the node VSH, the node HiZ, and the output signal OUT1.

At a time t1, the drive signal AZSW1 is set to a high level. Then, the switch SW11 and the switch SW12 are turned on, and the drain and the gate of the NMOS transistor NT11 and the drain and the gate of the NMOS transistor NT12 are connected. The reference signal RAMP is set to a predetermined reset level. Furthermore, the FD 153 of the pixel 150 as a target of reading is reset, and the pixel signal VSL is set to the reset level.

In this manner, an automatic zero operation of the difference amplifier 201 is started. That is, the drain and the gate of the NMOS transistor NT11 and the drain and the gate of the NMOS transistor NT12 converge on a predetermined same voltage (hereinafter referred to as a reference voltage). In this manner, the voltages of the node HiZ and the node VSH are set to the reference voltage.

Next, the drive signal AZSW1 is set to a low level at a time t2, and the switch SW11 and the switch SW12 are turned off. In this manner, the automatic zero operation by the difference amplifier 201 ends. The voltage of the node HiZ is held at the reference voltage since the pixel signal VSL and the reference signal RAMP do not change. The voltage of the node VSH is held at the reference voltage by the electric charge accumulated in the capacitor C13.

At a time t3, the voltage of the reference signal RAMP is lowered from a reset level by a predetermined value. In this manner, the voltage of the node HiZ is lowered below the voltage of the node VSH (reference voltage), and the output signal OUT1 of the difference amplifier 201 is changed to a low level.

At a time t4, the reference signal RAMP starts linear increase. In accordance with this, the voltage of the node HiZ also linearly increases. Also, the counter 122 starts counting.

Thereafter, when the voltage of the node HiZ exceeds the voltage of the node VSH (reference voltage), the output signal OUT1 of the difference amplifier 201 is inverted and is changed to a high level. Then, a count value of the counter 122 when the output signal OUT1 is inverted to the high level is held as a value of the pixel signal VSL in the phase P (reset level) in the latch 123.

At a time t5, the voltage of the reference signal RAMP is set to the reset voltage. Also, the transfer transistor 152 of the pixel 150 is turned on, the electric charge accumulated in the photodiode 151 during the exposure period is transferred to the FD 153, and the pixel signal VSL is set to the signal level. In this manner, the voltage of the node HiZ decreases by a value corresponding to the signal level and becomes less than the voltage of the node VSH (reference voltage), and the output signal OUT1 of the difference amplifier 201 is inverted to the low level.

At a time t6, the voltage of the reference signal RAMP is lowered from the reset level by a predetermined value in the same manner as at the time t3. In this manner, the voltage of the node HiZ further decreases.

At a time t7, the reference signal RAMP starts linear increase in the same manner as at the time t4. In accordance with this, the voltage of the node HiZ linearly increases. Also, the counter 122 starts counting.

Thereafter, when the voltage of the node HiZ exceeds the voltage of the node VSH (reference voltage), the output signal OUT1 of the difference amplifier 201 is inverted to a high level. Then, the count value of the counter 122 when the output signal OUT1 is inverted to the high level is held as a value of the pixel signal VSL in the phase D (signal level) in the latch 123. The latch 123 performs CDS by acquiring a difference between the pixel signal VSL in the phase D and the pixel signal VSL in the phase P read between the time t4 and the time t5. The AD conversion of the pixel signal VSL is performed in this manner.

Thereafter, the same operations as those from the time t1 to the time t7 are repeated from a time t8.

In this manner, it is possible to reduce the power consumption of the ADC group 105 and to reduce the power consumption of the image sensor 100 as a result by reducing the voltage of the voltage VDD1.

For example, the upper diagram in FIG. 5 illustrates a configuration of a comparator used in Reference Literature 1 and the like.

In the comparator illustrated in FIG. 5, the reference signal RAM with a ramp waveform that linearly decreases is input to one input (the gate of the NMOS transistor NT11) of the difference amplifier 201 via a capacitor C21. The pixel signal VSL is input to the other input (the gate of the NMOS transistor NT12) of the difference amplifier 201 via a capacitor C22.

Then, the reference signal RAMP and the pixel signal VSL are compared, and a result of the comparison is output as the output signal OUT as illustrated in the lower diagram in FIG. 5. At this time, an input voltage of the difference amplifier 201 (the voltages of the reference signal RAMP and the pixel signal VSL) when the output signal OUT is inverted varies depending on the voltage of the pixel signal VSL. Therefore, there is a concern that the input voltage of the difference amplifier 201 when the output signal OUT is inverted will exceed the input dynamic range of the comparator and linearity of the AD conversion will not be able to be secured if the voltage of the power source VDD for driving the comparator is lowered.

Meanwhile, the comparator 200 outputs a result of comparison between the voltage of the signal, which is obtained by adding, via input capacitances, the pixel signal VSL and the reference signal RAMP (voltage of the node HiZ) and the voltage of the node VSH (reference voltage), as the output signal OUT1 as described above. At this time, the input voltage of the difference amplifier 201 (the voltages of the node HiZ and the node VSH) when the output signal OUT1 is inverted does not vary but becomes constant.

In the image sensor 100, the direction in which the reference signal RAMP changes is opposite to that of the reference signal RAMP of the comparator illustrated in FIG. 5, and the reference signal RAMP linearly changes in the direction opposite to that of the pixel signal VSL. Here, the change in the direction opposite to that of the pixel signal VSL means that the reference signal RAMP changes in a direction opposite to a direction in which the pixel signal VSL changes as the signal component becomes larger. For example, the pixel signal VSL changes in a negative direction as the signal component becomes larger while the reference signal RAMP changes in the positive direction, which is the opposite direction, in this example. Therefore, the voltage of the node HiZ (the input voltage of the difference amplifier 201) becomes a voltage corresponding to the difference between the pixel signal VSL and the reference signal RAMP in FIG. 5, and an amplitude becomes smaller.

Since the input voltage of the difference amplifier 201 when the output signal OUT1 is inverted becomes constant and the amplitude of the input voltage becomes smaller as described above, it is possible to narrow the input dynamic range of the difference amplifier 201.

Therefore, it is possible to lower the voltage of the power source VDD1 for driving the comparator 200 as compared with that of the comparator in FIG. 5, to reduce the power consumption of the ADC group 105, and to reduce the power consumption of the image sensor 100 as a result.

2. Modification Examples of First Embodiment

Next, modification examples of the first embodiment, particularly, modification examples of the comparator 200, will be described with reference to FIGS. 7 to 19.

First Modification Example

FIG. 7 is a circuit diagram illustrating a configuration example of a comparator 200a according to a first modification example of the comparator 200. In the drawing, the same reference numerals are given to parts corresponding to those in the comparator 200 in FIG. 3, and description thereof will be appropriately omitted.

The comparator 200a is different from the comparator 200 in that a difference amplifier 211 is provided instead of the difference amplifier 201.

The difference amplifier 211 includes PMOS transistors PT31 to PT33, an NMOS transistor NT31, and an NMOS transistor NT32.

A source of the NMOS transistor NT31 and a source of the NMOS transistor NT32 are connected to a ground GND1. A drain of the NMOS transistor NT31 is connected to a gate of the NMOS transistor NT31 and a drain of the PMOS transistor PT31. A drain of the NMOS transistor NT32 is connected to a drain of the PMOS transistor PT32 and an output terminal T15 of an output signal OUT1. A source of the PMOS transistor PT31 is connected to a source of the PMOS transistor PT32 and a drain of the PMOS transistor PT33. A source of the PMOS transistor PT33 is connected to a power source VDD1.

The NMOS transistor NT31 and the NMOS transistor NT32 form a current mirror circuit. Also, the PMOS transistors PT31 to PT33 form a difference comparison unit. That is, the PMOS transistor PT33 operates as a current source by a bias voltage VG input from the outside via an input terminal T14, and the PMOS transistor PT31 and the PMOS transistor PT32 operate as difference transistors.

A capacitor C11 is connected between an input terminal T11 of a pixel signal VSL and the gate of the PMOS transistor PT31 and serves as an input capacitance with respect to the pixel signal VSL.

A capacitor C12 is connected between an input terminal T12 of a reference signal RAMP and the gate of the PMOS transistor PT31 and serves as an input capacitance with respect to the reference signal RAMP.

A switch SW11 is connected between the drain and the gate of the PMOS transistor PT31 and is turned on or off by a drive signal AZSW1 input from a timing control circuit 102 via an input terminal T13.

A switch SW12 is connected between the drain and the gate of the PMOS transistor PT32 and is turned on or off by the drive signal AZSW1 input from the timing control circuit 102 via the input terminal T13.

A capacitor C13 is connected between the power source VDD1 and the gate of the PMOS transistor PT32.

The comparator 200a is designed such that the polarity of the transistor is opposite to that in the comparator 200 and performs the same operations as those of the comparator 200. Also, it is possible to lower the voltage of the power source VDD1 and to realize low power consumption in the same manner as in the case in which the comparator 200 is used, by using the comparator 200a.

Second Modification Example

FIG. 8 is a circuit diagram illustrating a configuration example of a comparator 200b according to a second modification example of the comparator 200. In the drawing, the same reference numerals are given to parts corresponding to those in the comparator 200 in FIG. 3, and description thereof will be appropriately omitted.

The comparator 200b is different from the comparator 200 in that drive signals are individually input to a switch SW11 and a switch SW12. That is, a drive signal AZSW1A is input to the switch SW11 from a timing control circuit 102 via an input terminal T13A, and a drive signal AZSW1B is input to the switch SW12 from the timing control circuit 102 via an input terminal T13B. In this manner, the switch SW11 and the switch SW12 are individually controlled, and a voltage of a node HiZ and a voltage of a node VSH can be individually controlled at the time of an automatic zero operation, for example.

Third Modification Example

FIG. 9 is a circuit diagram illustrating a configuration example of a comparator 200c according to a third modification example of the comparator 200. In the drawing, the same reference numerals are given to parts corresponding to those in the comparator 200a in FIG. 7, and description thereof will be appropriately omitted.

The comparator 200c is different from the comparator 200a in that drive signals are individually input to a switch SW11 and a switch SW12 in the same manner as in the comparator 200b illustrated in FIG. 8. That is, a drive signal AZSW1A is input to the switch SW11 from a timing control circuit 102 via an input terminal T13A, and a drive signal AZSW1B is input to the switch SW12 from the timing control circuit 102 via an input terminal T13B. In this manner, the switch SW11 and the switch SW12 are individually controlled, and a voltage of a node HiZ and a voltage of a node VSH can be individually controlled at the time of the automatic zero operation, for example.

Fourth Modification Example

FIG. 10 is a circuit diagram illustrating a configuration example of a comparator 200d according to a fourth modification example of the comparator 200. In the drawing, the same reference numerals are given to parts corresponding to those in the comparator 200 in FIG. 3, and description thereof will be appropriately omitted.

The comparator 200d is obtained by adding an output amplifier 221 and a capacitor C42 to the comparator 200.

The output amplifier 221 functions as a buffer that buffers an output signal OUT1 of a difference amplifier 201 to output the output signal OUT1 at a level appropriate for the circuit in the later stage. That is, the output amplifier 221 amplifies the output signal OUT1 of the difference amplifier 201 with a predetermined gain and outputs an output signal OUT2, which is obtained as a result, from an output terminal T42.

The output amplifier 221 includes a PMOS transistor PT41, an NMOS transistor NT41, a capacitor C41, and a switch SW41.

A source of the PMOS transistor PT41 is connected to a power source VDD1, a gate thereof is connected to an output of the difference amplifier 201, and a drain thereof is connected to a drain of the PMOS transistor PT41 and the output terminal T42. A source of the NMOS transistor NT41 is connected to a ground GND1, and a gate thereof is connected to the ground GND1 via the capacitor C41. The switch SW41 is connected between the drain and the gate of the NMOS transistor NT41 and is turned on or off by a drive signal AZSW2 input from a timing control circuit 102 via an input terminal T41.

The capacitor C42 is connected between the power source VDD1 and the drain of the PMOS transistor PT12 (the output of the difference amplifier 201). The capacitor C42 removes a high-frequency component from the output signal OUT1 of the difference amplifier 201.

Next, operations of the comparator 200d will be described with reference to the timing chart illustrated in FIG. 11. FIG. 11 illustrates a timing chart of a drive signal AZSW1, the drive signal AZSW2, a reference signal RAMP, a pixel signal VSL, a node VSH, a node HiZ, the output signal OUT1, and the output signal OUT2.

At a time t1, the drive signal AZSW1 is set to a high level, the reference signal RAMP is set to a reset level, and an FD 153 of a pixel 150 that is a target of reading is reset in the same manner as at the time t1 in FIG. 4. In this manner, the aforementioned automatic zero operation of the difference amplifier 201 is performed.

Also, the drive signal AZSW2 is set to a high level. Then, the switch SW41 is turned on, and the drain and the gate of the PMOS transistor PT41 are connected.

In this manner, the automatic zero operation of the output amplifier 221 is started. That is, a voltage of the capacitor C41 becomes equal to a drain voltage of the PMOS transistor PT 41, and electric charge is accumulated in the capacitor C41.

At a time t2, the drive signal AZSW2 is set to a low level. Then, the switch SW41 is turned off, and the automatic zero operation of the output amplifier 221 is completed. Even after the switch SW41 is turned off, the voltage of the capacitor C41 is held with no change and is then applied to the gate of the NMOS transistor NT41. Therefore, the NMOS transistor NT41 functions as a current source that causes substantially the same current as that when the switch SW41 is turned on to flow.

At a time t3 to a time t8, the same operations as those performed at the time t2 to the time t7 in FIG. 4 are performed. At this time, when the output signal OUT1 of the difference amplifier 201 is changed to the high level, the PMOS transistor PT41 of the output amplifier 221 is turned off, and the output signal OUT2 is changed to the low level. Meanwhile, when the output signal OUT1 of the difference amplifier 201 is changed to the low level, the PMOS transistor PT41 of the output amplifier 221 is turned on, and the output signal OUT2 is changed to the high level. That is, the output amplifier 221 outputs the output signal OUT1 of the difference amplifier 201 in such a manner that the level thereof is inverted.

Thereafter, the same operations as those at the time t1 to the time t8 are repeated from a time t9.

Fifth Modification Example

FIG. 12 is a circuit diagram illustrating a configuration example of a comparator 200e according to a fifth modification example of the comparator 200. In the drawing, the same reference numerals are given to parts corresponding to those in the comparator 200a in FIG. 7 and in the comparator 200d in FIG. 10, and description thereof will be appropriately omitted.

The comparator 200e is obtained by adding an output amplifier 231 and a capacitor C42 to the comparator 200a.

The output amplifier 231 includes a PMOS transistor PT51, an NMOS transistor NT51, a capacitor C51, and a switch SW51.

A source of the NMOS transistor NT51 is connected to a ground GND1, a gate thereof is connected to an output of a difference amplifier 211, and a drain thereof is connected to a drain of the PMOS transistor PT51 and an output terminal T42. A source of the PMOS transistor PT41 is connected to a power source VDD1, and a gate thereof is connected to the power source VDD1 via the capacitor C51. The switch SW51 is connected between the drain and the gate of the PMOS transistor PT51 and is turned on or off by a drive signal AZSW2 input from a timing control circuit 102 via an input terminal T41.

The output amplifier 231 is designed such that the polarity of the transistor is opposite to that of the output amplifier 221 in FIG. 10, amplifies an output signal OUT1 of the difference amplifier 211 with a predetermined gain in the same manner as the output amplifier 221, and outputs an output signal OUT2, which is obtained as a result, from the output terminal T42.

Sixth Modification Example

FIG. 13 is a circuit diagram illustrating a configuration example of a comparator 200f according to a sixth embodiment of the comparator 200. In the drawing, the same reference numerals are given to parts corresponding to those in the comparator 200 in FIG. 10, and description thereof will be appropriately omitted.

The comparator 200f is different from the comparator 200d in that separate power sources are provided for a difference amplifier 201 and an output amplifier 221.

Specifically, a source of a PMOS transistor PT41 of the output amplifier 221 is connected to a power source VDD2 which is different from a power source VDD1. A source of an NMOS transistor NT41 of the output amplifier 221 and an end of a capacitor C41 are connected to a ground GND2 which is different from a ground GND1.

In this manner, it is possible to set a drive voltage of the difference amplifier 201 and a drive voltage of the output amplifier 221 to different values, for example.

Also, it is also possible to connect an end of a capacitor C42 to the power source VDD2 instead of the power source VDD1.

Seventh Modification Example

FIG. 14 is a circuit diagram illustrating a configuration example of a comparator 200g according to a seventh modification example of the comparator 200. In the drawing, the same reference numerals are given to parts corresponding to those in the comparator 200e in FIG. 12, and description thereof will be appropriately omitted.

The comparator 200g is different from the comparator 200e in that separate power sources are provided for a difference amplifier 211 and an output amplifier 231.

Specifically, a source of a PMOS transistor PT51 of the output amplifier 231 and an end of a capacitor C51 are connected to a power source VDD2 which is different from a power source VDD1. Also, a source of an NMOS transistor NT51 of the output amplifier 231 is connected to a ground GND2 which is different from a ground GND1.

In this manner, it is possible to set a drive voltage of the difference amplifier 201 and a drive voltage of the output amplifier 231 to different values.

It is also possible to connect one end of a capacitor C42 to the ground GND2 instead of a ground GND1.

Eighth Modification Example

FIG. 15 is a circuit diagram illustrating a configuration example of a comparator 200h according to an eighth modification example of the comparator 200. In the drawing, the same reference numerals are given to parts corresponding to those in the comparator 200 in FIG. 3, and description thereof will be appropriately omitted.

The comparator 200h is different from the comparator 200d in that a variable capacitor C61 and a variable capacitor C62 with variable capacitances are provided instead of the capacitor C11 and the capacitor C12. That is, a pixel signal VSL is input to a gate of an NMOS transistor NT11 of a difference amplifier 201 via the variable capacitor C61, and a reference signal RAMP is input to a gate of an NMOS transistor NT11 of the difference amplifier 201 via the variable capacitor C62.

If it is assumed that the capacitance of the variable capacitor C61 is C61 and the capacitance of the variable capacitor is C62, an amplitude $\Delta$VSL of a voltage of the pixel signal VSL is $\Delta$VSL×C61/(C61+C62) in a node HiZ. Therefore, if it is assumed that the capacitance C61=capacitance C62, for example, the pixel signal VSL input to the difference amplifier 201 is attenuated to about ½. As a result, input referred noise increases. In response to this, it is possible to suppress attenuation of the pixel signal VSL input to the difference amplifier 201 and to suppress the input referred noise by raising a ratio of the capacitance C61 (input capacitance of the pixel signal VSL) with respect to the capacitance C62 (input capacitance of the reference signal RAMP).

However, the amount of attenuation of the reference signal RAMP input to the difference amplifier 201 conversely increases if the ratio of the input capacitance of the pixel signal VSL with respect to the input capacitance of the reference signal RAMP is raised.

FIG. 16 is a diagram illustrating a comparison of the reference signal RAMP input to the difference amplifier 201 in a case in which the ratio of the input capacitance of the pixel signal VSL with respect to the input capacitance of the reference signal RAMP is raised and reduced. The waveform represented by the dotted line in FIG. 16 represents a waveform of the reference signal RAMP input to the difference amplifier 201 in a case of raising the ratio, and the waveform represented by the solid line represents a waveform of the reference signal RAMP input to the difference amplifier 201 in a case of reducing the ratio.

In this manner, the amplitude of the reference signal RAMP input to the difference amplifier 201 decreases if the ratio of the input capacitance of the pixel signal VSL with respect to the input capacitance of the reference signal RAMP is raised. As a result, a dynamic range of the ADC is reduced.

In contrast, it is considered that the decrease in the dynamic range of the ADC is suppressed by increasing the amplitude of the reference signal RAMP output from the DAC 104, for example, to increase the amplitude of the reference signal RAMP input to the difference amplifier 201.

However, the maximum value of the amplitude of the reference signal RAMP is restricted by a specification and the like of the DAC 104. Since the amplitude of the reference signal RAMP is set to be small in a high gain mode, it is possible to increase the amplitude of the reference signal RAMP. Meanwhile, since the amplitude of the reference signal RAMP is set to be large in advance in a low gain mode, it is difficult to further increase the amplitude of the reference signal RAMP in some cases.

Therefore, it is considered to raise the ratio of the input capacitance of the pixel signal VSL with respect to the input capacitance of the reference signal RAMP as much as possible and to increase the amplitude of the reference signal RAMP in the high gain mode. In this manner, it is possible to suppress the attenuation of the pixel signal VSL input to the difference amplifier 201 and to suppress an influence of the noise in the high gain mode in which the influence of the noise tends to be large.

Meanwhile, it is considered to set the input capacitance of the reference signal RAMP and the input capacitance of the pixel signal VSL to be similar values in the low gain mode, for example.

Next, specific configuration examples of the variable capacitor C61 and the variable capacitor C62 will be described with reference to FIG. 17.

FIG. 17 is a circuit diagram illustrating a configuration example of a comparator 200ha.

In the comparator 200ha, the variable capacitor C61 and the variable capacitor C62 in FIG. 15 include capacitors C71 to C73, a switch SW71, and a switch SW72.

One end of the capacitor C72 is connected to an input terminal T11 and an end of the capacitor C71 via the switch SW71, and is connected to an input terminal T12 and an end of the capacitor C73 via the switch SW72. The other ends of the capacitors C71 to C73 are connected to the gate of the NMOS transistor NT11.

For example, the capacitances of the capacitors C71 to C73 are set to the same value. Then, a ratio between the input capacitance of the pixel signal VSL and the input capacitance of the reference signal RAMP is controlled by controlling states of the switch SW71 and the switch SW72.

Specifically, the switch SW71 and the switch SW72 are controlled such that at least one is turned off. In a case in which the switch SW71 is turned on, and the switch SW72 is turned off, the ratio between the input capacitance of the pixel signal VSL and the input capacitance of the reference signal RAMP is 2:1, and the pixel signal VSL input to the difference amplifier 201 is attenuated to about ⅔. In a case in which the switch SW71 is turned off, and the switch SW72 is turned on, the ratio between the input capacitance of the pixel signal VSL and the input capacitance of the reference signal RAMP is 1:2, and the pixel signal VSL input to the difference amplifier 201 is attenuated to about ⅓. In a case in which both the switch SW71 and the switch SW72 are turned off, the ratio between the input capacitance of the pixel signal VSL and the input capacitance of the reference signal RAMP is 1:1, and the pixel signal VSL input to the difference amplifier 201 is attenuated to about ½.

The number of arrays in which the capacitors are aligned can be arbitrarily set.

Five capacitors C71 to C75 may be connected in parallel as the comparator 200hb illustrated in FIG. 18, for example.

Specifically, one end of the capacitor C72 is connected to the input terminal T11 and an end of the capacitor C71 via the switch SW71 and is connected to one end of the capacitor C73 via the switch SW72. One end of the capacitor C74 is connected to the one end of the capacitor C73 via the switch SW73 and is connected to the input terminal T12 and one end of the capacitor C75 via the switch SW74. The other ends of the capacitors C71 to C75 are connected to the gate of the NMOS transistor NT11.

For example, the capacitors C71 to C75 are capacitors with the same capacitance. The ratio between the input capacitance of the pixel signal VSL and the input capacitance of the reference signal RAMP is controlled by controlling states of the switches SW1 to SW74. The switches SW71 to SW74 are controlled such that at least one is turned off.

It is possible to set the input capacitance of the pixel signal VSL and the input capacitance of the reference signal RAMP to be variable by the same method even in other comparators.

Alternatively, the ratio between the input capacitance of the pixel signal VSL and the input capacitance of the reference signal RAMP may be adjusted by fixing one of the input capacitance of the pixel signal VSL and the input capacitance of the reference signal RAMP and setting the other to be variable.

Ninth Modification Example

FIG. 19 is a circuit diagram illustrating a configuration example of a comparator 200i according to a ninth modification example of the comparator 200. In the drawing, the same reference numerals are given to parts corresponding to those in the comparator 200ha in FIG. 17, and description thereof will be appropriately omitted.

The comparator 200i is obtained by deleting the capacitor C13 and the switch SW12 from the comparator 200ha and connecting the gate of the NMOS transistor NT12 to the input terminal T81. Therefore, a reference voltage is set by a bias voltage input from the outside via an input terminal T81 in the comparator 200i.

The reference voltage is set by the bias voltage input from the outside by the same method even in other comparators.

3. Second Embodiment

Next, a second embodiment of the present technology will be described with reference to FIGS. 20 and 21.

The second embodiment is different from the first embodiment in a configuration of a comparator. Specifically, a single type amplifier is used in a comparator 121 in the second embodiment while a difference type amplifier (the difference amplifier 201 or the difference amplifier 211) is used in the comparator in the first embodiment.

<Configuration Example of Comparator>

FIG. 20 is a circuit diagram illustrating a configuration example of a comparator 300 that is applied to the comparator 121 in the image sensor 100 illustrated in FIG. 1 according to the second embodiment of the present technology.

The comparator 300 includes a single type amplifier 301, a capacitor C101, a capacitor C102, and a switch SW101. The amplifier 301 includes a PMOS transistor PT101, a PMOS transistor PT102, an NMOS transistor NT101, and an NMOS transistor NT102.

A source of the PMOS transistor PT101 is connected to a power source VDD1, and a drain thereof is connected to a source of the PMOS transistor PT102. A drain of the PMOS transistor PT102 is connected to a drain of the NMOS transistor NT101 and an output terminal T104 of an output signal OUT1. A drain of the NMOS transistor NT102 is connected to a source of the NMOS transistor NT101, and a source thereof is connected to a ground GND1.

The PMOS transistor PT101 and the PMOS transistor PT102 form a current source.

Also, the PMOS transistor PT102 and the NMOS transistor NT101 serve as a cascode device for preventing kicking-back from the output to the input of the comparator 300. The cascode device prevents the kicking-back from influencing other ADCs via lines for the reference signal RAMP and prevents streaking from occurring. In a case in which degradation of performance is allowed, it is also possible to delete the PMOS transistor PT102 and the NMOS transistor NT101.

The capacitor C101 is connected between an input terminal T101 of the pixel signal VSL and the gate of the NMOS transistor NT102 and serves as an input capacitance with respect to the pixel signal VSL.

The capacitor C102 is connected between an input terminal T102 of the reference signal RAMP and the gate of the NMOS transistor NT102 and serves as an input capacitance with respect to the reference signal RAMP.

The switch SW101 is connected between the drain of the NMOS transistor NT101 and the gate of the NMOS transistor NT102 and is turned on or off by a drive signal AZSW1 input from a timing control circuit 102 via an input terminal T103.

Hereinafter, a connect point of the capacitor C11, the capacitor C12, and the switch SW101 will be referred to as a node HiZ.

<Operations of Comparator>

Next, operations of the comparator 300 will be described with reference to the timing chart in FIG. 21. FIG. 21 is a timing chart of the drive signal AZSW1, the pixel signal VSL, the reference signal RAMP, the node HiZ, and the output signal OUT1.

At a time t1, an FD 153 of a pixel 150 as a target of reading is reset, and the pixel signal VSL is set to a reset level. At this time, the reference signal RAMP is set to a predetermined reset level.

At a time t2, the drive signal AZSW1 is set to a high level, and an automatic zero operation of the amplifier 301 is performed. Specifically, the switch SW101 is turned on, connection between the node HiZ and an output terminal T104 is established, and the input and the output of the amplifier 301 are short-circuited. In this manner, the voltage of the node HiZ and the voltage of the output signal OUT1 converge to a voltage near an intermediate between the high level and the low level of the output signal OUT1. The voltage after converging becomes a reference voltage. That is, if the voltage of the node HiZ (the input voltage of the amplifier 301) becomes greater than the reference voltage after the switch SW101 is turned off, the voltage of the output signal OUT1 is lowered to the low level. Meanwhile, if the voltage of the node HiZ (the input voltage of the amplifier 301) becomes less than the reference voltage, the voltage of the output signal OUT1 rises to the high level.

At a time t3, the drive signal AZSW1 is set to the low level, the switch SW101 is turned off, and the automatic zero operation of the amplifier 301 is completed. The voltage of the node HiZ and the voltage of the output signal OUT1 are held at the reference voltage.

At a time t4, the voltage of the reference signal RAMP is lowered from the reset level by a predetermined value. In this manner, the voltage of the node HiZ becomes less than the reference voltage, and the output signal OUT1 is changed into high level.

At a time t5, the reference signal RAMP starts linear increase. In accordance with this, the voltage of the node HiZ also linearly increases. Also, a counter 122 starts counting.

Thereafter, when the voltage of the node HiZ exceeds the reference voltage, the voltage of the output signal OUT1 is inverted into the low level. Then, a count value of the counter 122 when the output signal OUT1 is inverted into the low level is held by a latch 123 as a value of the pixel signal VSL in the phase P (reset level).

At a time t6, the voltage of the reference signal RAMP is set to the reset voltage. In this manner, the voltage of the node HiZ is returned to the reference voltage, and the voltage of the output signal OUT1 becomes substantially the same as the reference voltage.

At a time t7, a transfer transistor 152 of the pixel 150 is turned on, and electric charge accumulated in a photodiode 151 during an exposure period is transferred to the FD 153. In this manner, the pixel signal VSL is set to the signal level, and the voltage of the node HiZ is lowered from the reference voltage by a value corresponding to the signal level. As a result, the output signal OUT1 is changed into the high level. However, in a case in which the signal level of the pixel signal VSL is small, the voltage of the output signal OUT1 is held at a value that is substantially the same as the reference voltage in some cases.

At a time t8, the voltage of the reference signal RAMP is lowered from the reset level by a predetermined value in the same manner as at the time t4. The voltage of the node HiZ is further lowered in this manner.

The reference signal RAMP starts linear increase at a time t9 in the same manner as at the time t5. In accordance with this, the voltage of the node HiZ also linearly increases. Also, the counter 122 starts counting.

Thereafter, when the voltage of the node HiZ becomes greater than the reference voltage, the output signal OUT1 is inverted into the low level. Then, a count value of the counter 122 when the output signal OUT1 is inverted into the low level is held as a value of the pixel signal VSL in a phase D (signal level) by the latch 123. The latch 123 performs CDS by acquiring a difference between the pixel signal VSL in the phase D and the pixel signal VSL in the phase P read between the time t5 and the time t6. The AD conversion of the pixel signal VSL is performed in this manner.

At a time t10, the voltage of the reference signal RAMP is set to the reset voltage in the same manner as at the time t6. In this manner, the voltage of the node HiZ is returned to the reference voltage, and the voltage of the output signal OUT1 becomes substantially the same as the reference voltage.

Thereafter, the same operations as those at the time t1 to the time t10 are repeated at and after a time tn.

In the comparator 300, it is possible to reduce current consumption to about a half of that in a case in which a difference type amplifier is used by using the single type amplifier 301, and to reduce power consumption.

Also, since the amplifier 301 is a source-grounded type, and a bias current is constant, the current is less varied, and occurrence of streaking is suppressed as compared with a case in which an inverter type amplifier is used.

Furthermore, in the comparator 300, the input voltage of the amplifier 301 is a voltage corresponding to the difference between the pixel signal VSL and the reference signal RAMP illustrated in FIG. 5, and the amplitude becomes smaller in the same manner as the comparator 200 illustrated in FIG. 3. In this manner, it is possible to narrow the input dynamic range of the amplifier 301. Therefore, it is possible to lower the voltage of the power source CDD1 for driving the comparator 300, to reduce power consumption of the ADC group 105, and to reduce power consumption of the image sensor 100 as a result.

4. Modification Examples of Second Embodiments

Next, modification examples of the second embodiment, in particular, modification examples of the comparator 300 will be described with reference to FIGS. 22 to 32.

First Modification Example

FIG. 22 is a circuit diagram illustrating a configuration example of a comparator 300a according to a first modification example of the comparator 300. In the drawing, the same reference numerals are given to parts corresponding to those in the comparator 300 in FIG. 20, and description thereof will be appropriately omitted.

The comparator 300a is different from the comparator 300 in an input position of the amplifier 301. Specifically, a capacitor C101 is connected between an input terminal T101 and a gate of a PMOS transistor PT101. A capacitor C102 is connected between an input terminal T102 and the gate of the PMOS transistor PT101. A switch SW101 is connected between the gate of the PMOS transistor PT101 and a drain of a PMOS transistor PT102.

The comparator 300a is different only in the input position of the amplifier 301 and performs the same operations as those of the comparator 300.

In the comparator 300a, the NMOS transistor NT101 and the NMOS transistor NT102 form a current source of the amplifier 301.

Second Modification Example

FIG. 23 is a circuit diagram illustrating a configuration example of a comparator 300b according to a second modification example of the comparator 300. In the drawing, the same reference numerals are given to parts corresponding to those in the comparator 300 in FIG. 20, and description thereof will be appropriately omitted.

The comparator 300b is obtained by adding a clamping circuit formed of a PMOS transistor PT111 to the comparator 300. Specifically, a source of the PMOS transistor PT111 is connected to an output terminal T104, and a drain thereof is connected to a ground GND2.

For example, if a drain voltage of a PMOS transistor P101 and a PMOS transistor PT102, which form a current source, rises and exceeds a predetermined threshold value, the PMOS transistor PT111 is turned on, and the increase in the drain voltage of the current source is suppressed. In this manner, change in the current of the current source and thus occurrence of streaking is suppressed.

The ground GND1 and the ground GND2 may be commonly provided.

Third Modification Example

FIG. 24 is a circuit diagram illustrating a configuration example of a comparator 300c according to a third embodiment of the comparator 300. In the drawing, the same reference numerals are given to parts corresponding to those in the comparator 300a in FIG. 22, and description thereof will be appropriately omitted.

The comparator 300c is obtained by adding a clamping circuit, which is formed of an NMOS transistor NT111, to the comparator 300a. Specifically, a source of the NMOS transistor NT111 is connected to an output terminal T104, and a drain thereof is connected to a power source VDD2.

For example, if a drain voltage of an NMOS transistor NT101 and an NMOS transistor NT102, which form a current source, is lowered below a predetermined threshold value, the NMOS transistor NT111 is turned on, and the decrease in the drain voltage of the current source is suppressed. In this manner, change in the current of the current source and thus occurrence of streaking is suppressed.

A power source VDD1 and the power source VDD2 may be commonly provided.

Fourth Modification Example

FIG. 25 is a circuit diagram illustrating a configuration example of a comparator 300d according to a fourth modification example of the comparator 300. In the drawing, the same reference numerals are given to parts corresponding to those in the comparator 300b in FIG. 23, and description thereof will be appropriately omitted.

The comparator 300d is obtained by adding a sample and hold circuit, which is formed of a capacitor C121 and a switch SW121, and a band limited capacitance, which is formed of a capacitor C122, to the comparator 300b.

Specifically, the capacitor C121 is connected between a power source VDD1 and a gate of a PMOS transistor PT101. The switch SW121 is connected between an input terminal T121 and the gate of the PMOS transistor PT101. The switch SW121 is turned on or off by a drive signal SHSW input from a timing control circuit 102 via an input terminal T122.

A bias voltage (a gate voltage of the PMOS transistor PT101) input from the input terminal T121 via the switch SW121 is held by the capacitor C121 even after the switch SW121 is turned off. In this manner, the gate of the PMOS transistor PT101 is disconnected from other comparators 300d, and occurrence of streaking and lateral noise is suppressed.

The capacitor C122 is connected between the power source VDD1 and an output terminal T104. This capacitor C122 removes a high-frequency component from an output signal OUT1.

Fifth Modification Example

FIG. 26 is a circuit diagram illustrating a configuration example of a comparator 300e according to a fifth modification example of the comparator 300. In the drawing, the same reference numerals are given to parts corresponding to those in the comparator 300c in FIG. 24 and in the comparator 300d in FIG. 25, and description thereof will be appropriately omitted.

The comparator 300e is obtained by adding a sample and hold circuit, which is formed of a capacitor C121 and a switch SW121, and a band limited capacitance, which is formed of a capacitor C122, to the comparator 300c in FIG. 24 in the same manner as the comparator 300d in FIG. 25.

Specifically, the capacitor C121 is connected between a gate of an NMOS transistor NT102 and a ground GND2. The switch SW121 is connected between an input terminal T121 and the gate of the NMOS transistor NT102. The switch SW121 is turned on or off by a drive signal SHSW input from a timing control circuit 102 via an input terminal T122.

A bias voltage (a gate voltage of the NMOS transistor NT102) input from the input terminal T121 via the switch SW121 is held by the capacitor C121 even after the switch SW121 is turned off. In this manner, the gate of the NMOS transistor NT102 is disconnected from other comparators 300e, and occurrence of streaking and lateral noise is suppressed.

A ground GND1 and the ground GND2 may be commonly provided.

Sixth Modification Example

FIG. 27 is a circuit diagram illustrating a configuration example of a comparator 300f according to a sixth embodiment of the comparator 300. In the drawing, the same reference numerals are given to parts corresponding to those in the comparator 300d in FIG. 25, and description thereof will be appropriately omitted.

The comparator 300f is obtained by adding an output amplifier 311 to the comparator 300d. The output amplifier 311 has the same circuit configuration as that of the output amplifier 221 in FIG. 10 and has the same functions as those of the output amplifier 221.

Specifically, the output amplifier 311 includes a PMOS transistor PT131, an NMOS transistor NT131, a capacitor C131, and a switch SW131.

A source of the PMOS transistor PT131 is connected to a power source VDD2, a gate thereof is connected to an output of an amplifier 301, and a drain thereof is connected to a drain of the NMOS transistor NT131 and an output terminal T132. A source of the NMOS transistor NT131 is connected to a ground GND2, and a gate thereof is connected to the ground GND2 via the capacitor C131. The switch SW131 is connected between the drain and the gate of the NMOS transistor NT131 and is turned on or off by a drive signal AZSW2 input from a timing control circuit 102 via an input terminal T131.

The capacitor C122 is connected between the power source VDD2 and the gate of the PMOS transistor PT131.

Next, operations of the comparator 300f will be described with reference to the timing chart in FIG. 28. FIG. 28 is a timing chart of the drive signal SHSW, a drive signal AZSW1, the drive signal AZSW2, a pixel signal VSL, a reference signal RAMP, a node HiZ, an output signal OUT1, and an output signal PUT2.

At a time t1, a FD 153 of a pixel 150 as a target of reading is reset in the same manner as at the time t1 in FIG. 21.

At a time t2, the drive signal SHSW, the drive signal AZSW1, and the drive signal AZSW2 are set to a high level.

In this manner, a bias voltage is input from an input terminal T122 to the gate of the PMOS transistor T101, and electric charge corresponding to the bias voltage is accumulated in the capacitor C121.

Also, an automatic zero operation by the amplifier 301 is performed in the same manner as at the time t2 in FIG. 21.

Furthermore, the automatic zero operation of the amplifier 311 is performed in the same manner as at the time t1 in FIG. 11.

At a time t3, the drive signal SHSW is set to a low level. In this manner, the input of the bias voltage from the input terminal T122 is stopped, and the bias voltage is input to the gate of the PMOS transistor PT101 by the electric charge accumulated in the capacitor C121.

At a time t4, the drive signal AZSW2 is set to a low level, and the automatic zero operation of the output amplifier 311 is completed.

Thereafter, the same operations as those at the time t3 to the time t10 in FIG. 21 are performed at a time t5 to a time t12. At this time, the output signal OUT2 output from the output terminal T132 of the output amplifier 311 is a signal obtained by inverting and amplifying the output signal OUT1 of the amplifier 301.

Thereafter, the same operations as those at the time t1 to the time t12 are repeated at a time t13.

The power source VDD1 and the power source VDD2 may be commonly provided. Also, a ground GND1 and the ground GND2 may be commonly provided.

Seventh Modification Example

FIG. 29 is a circuit diagram illustrating a configuration example of a comparator 300g according to a seventh modification example of the comparator 300. In the drawing, the same reference numerals are given to parts corresponding to those in the comparator 300e in FIG. 26 and in the comparator 300f in FIG. 27, and description thereof will be appropriately omitted.

The comparator 300g is obtained by adding an output amplifier 311 to the comparator 300e in FIG. 26 in the same manner as the comparator 300f in FIG. 27.

Specifically, an output of an amplifier 301 is connected to a gate of a PMOS transistor PT131 of the output amplifier 311. A capacitor C122 is connected between a power source VDD2 and a gate of the PMOS transistor PT131.

A power source VDD1 and a power source VDD2 may be commonly provided. Also, a ground GND1 and a ground GND2 may be commonly provided.

Eighth Modification Example

FIG. 30 is a circuit diagram illustrating a configuration example of a comparator 300h according to an eighth modification example of the comparator 300. In the drawing, the same reference numerals are given to parts corresponding to those in the comparator 300 in FIG. 20, and description thereof will be appropriately omitted.

The comparator 300h is designed such that an input capacitance of a pixel signal VSL and an input capacitance of a reference signal RAMP are variable in the same manner as the comparator 200h in FIG. 15. Specifically, a variable capacitor C141 is connected between an input terminal T101 and a gate of an NMOS transistor NT102. A variable capacitor C142 is connected between an input terminal T102 and the gate of the NMOS transistor NT102.

In this manner, input referred noise is suppressed by adjusting the input capacitance of the pixel signal VSL and the input capacitance of the reference signal RAMP in the same manner as in the comparator 200h in FIG. 15.

FIGS. 31 and 32 illustrate specific configuration examples of the variable capacitor C141 and the variable capacitor C142 in FIG. 30.

Specifically, in the comparator 300ha in FIG. 31, the variable capacitor C141 and the variable capacitor C142 are formed of the same circuits as those in the comparator 200ha in FIG. 17.

That is, one end of a capacitor C152 is connected to an input terminal T101 and one end of a capacitor C151 via a switch SW151 and is connected to an input terminal T102 and an end of the capacitor C153 via a switch SW152. The other ends of the capacitors C151 to C153 are connected to the gate of the NMOS transistor NT102.

In a comparator 300hb in FIG. 32, the variable capacitor C141 and the variable capacitor C142 are formed of the same circuits as those in the comparator 200hb in FIG. 18.

That is, one end of the capacitor C152 is connected to the input terminal T101 and one end of the capacitor C151 via the switch SW151 and is connected to one end of the capacitor C153 via the switch SW152. One end of a capacitor C154 is connected to one end of the capacitor C153 via a switch SW153 and is connected to the input terminal T102 and one end of a capacitor C155 via a switch SW154. The other ends of the capacitors C151 to C155 are connected to the gate of the NMOS transistor NT102.

It is possible to set the input capacitance of the pixel signal VSL and the input capacitance of the reference signal RAMP to be variable even in other comparators according to the second embodiment in the same manner.

5. Third Embodiment

In the image sensor 100 illustrated in FIG. 1, the ADC is provided for each pixel column in the pixel section 101. That is, the same ADC performs the AD conversion on pixel signals VSL of pixels 150 in the same pixel column, and different ADCs perform the AD conversion on pixel signals VSL of pixels 150 in different pixel columns. Therefore, if there is mismatch (variations) between the input capacitance (for example, the capacitor C11 in FIG. 3) of the pixel signal VSL of the comparator 121 that forms the ADC of each pixel column and the input capacitance (for example, the capacitor C12 in FIG. 3) of the reference signal RAMP, mismatch (variations) occurs in gains of the ADCs for the respective pixel columns (hereinafter, referred to as AD conversion gains). There is a concern that the mismatch in the AD conversion gains between the pixel columns causes vertical streaks in image data.

For example, the AD conversion gain of the ADC including the comparator 200ha illustrated in FIG. 17 is represented by the following Equation (1) in a case in which the switch SW71 of the comparator 200ha is turned on and the switch SW72 is turned off.

[Math. 1]

$$\text{Ad conversion gain} = \frac{C71(1+\Delta C71)+C72(1+\Delta C72)}{C73(1+\Delta C73)} \quad (1)$$
$$\approx \frac{C71+C72}{C73}(1+\Delta C71+\Delta C72-\Delta C73)$$

C71 to C73 in Equation (1) represent statistical values (ideal capacitances) of the capacitances of the capacitors C71 to C73, respectively. $\Delta C71$ to $\Delta C73$ represent errors of the capacitances of the capacitors C71 to C73 with respect to the statistical values, respectively. Therefore, an actual capacitance of the capacitor C71 is $C71+\Delta C71$, an actual capacitance of the capacitor C72 is $C72+\Delta C72$, and an actual capacitance of the capacitor C73 is $C73+\Delta C73$.

Here, if the errors $\Delta C71$ to $\Delta C73$ vary between the pixel columns and mismatch occurs among the capacitances of the capacitors C71 to C73, mismatch occurs in the AD conversion gains between the ADCs of the respective arrays. There is a concern that the mismatch of the AD conversion gains between the pixel columns causes vertical streaks in image data.

A third embodiment is for suppressing the occurrence of vertical streaks in image data.

<Configuration Example of Comparator>

FIG. 33 is a circuit diagram illustrating a configuration example of a comparator 400 that is applied to the comparator 121 in the image sensor 100 illustrated in FIG. 1, according to the third embodiment of the present technology.

The comparator 400 includes a comparison circuit 401, capacitors C201 to C203, and switches SW201 to SW203.

Although simply illustrated in the drawing, the comparison circuit 401 is formed of a circuits of a node HiZ and after the node HiZ of either the aforementioned comparators 200 to 200i or the comparators 300 to 300hb.

A terminal 1 of the switch SW201 is connected to an input terminal T201, and a terminal 3 thereof is connected to an input terminal T202. A terminal 1 of the switch SW202 is connected to the input terminal T201, and a terminal 3 thereof is connected to the input terminal T202. A terminal 1 of the switch SW203 is connected to the input terminal T201, and a terminal 3 thereof is connected to the input terminal T202.

States of the switches SW201 to SW203 are controlled by a timing control circuit 102, for example.

The capacitor C201 is connected between a terminal 0 of the switch SW201 and the node HiZ. The capacitor C202 is connected between a terminal 0 of the switch SW202 and the node HiZ. The capacitor C203 is connected between a terminal 0 of the switch SW203 and the node HiZ.

Although it is ideal that the capacitances of the capacitors C201 to C203 are set to the same value, variations occur due to capacitance errors in practice. Specifically, the capacitance of the capacitor C201 is $C201+\Delta C201$, the capacitance of the capacitor C202 is $C202+\Delta C202$, and the capacitance of the capacitor C203 is $C203+\Delta C203$. C201 to C203 represent designed values of the capacitances of the capacitors C201 to C203, respectively, and C201=C202=C203 is satisfied. $\Delta C201$ to $\Delta C203$ represent errors of the capacitors C201 to C203, respectively, and variations occur among the capacitors.

In the comparator 400, a ratio between the input capacitance of the pixel signal VSL and the input capacitance of the reference signal RAMP is controlled by controlling the states of the switches SW201 to SW203 in the same manner as in the comparator 200ha in FIG. 17 and in the comparator 300ha in FIG. 31.

As illustrated in FIG. 34, for example, occurrence of vertical streaks in image data is suppressed by controlling the states of the switches SW201 to SW203.

In a case in which the AD conversion is performed on pixel signals VSL of pixels 150 on 3n−2-th rows (the first row, the fourth row, the seventh row, . . . ) in the pixel section 101, states of the switches SW201 to SW203 are set as illustrated in FIG. 34A. That is, the capacitor C201 is connected to the terminal T201 via the switch SW201, the capacitor C202 is connected to the terminal T201 via the switch SW202, and the capacitor C203 is connected to the terminal T202 via the switch SW203.

In this manner, the input capacitance of the pixel signal VLS is formed by the capacitor C201 and the capacitor C202, and the input capacitance of the reference signal RAMP is formed by the capacitor C203. The AD conversion gain of the ADC including the comparator 400 at this time is represented by the following Equation (2).

[Math. 2]

$$\text{Ad conversion gain} \approx \frac{C201+C202}{C203}(1+\Delta C201+\Delta C202-\Delta C203) \quad (2)$$
$$= 2(1+\Delta C201+\Delta C202-\Delta C203)$$

In a case in which the AD conversion is performed on pixel signals VSL of pixels 150 on 3n−1-th rows (the second row, the fifth row, the eighth row, . . . ) in the pixel section 101, states of the switches SW201 to SW203 are set as illustrated in FIG. 34B. That is, the capacitor C201 is connected to the terminal T201 via the switch SW201, the capacitor C202 is connected to the terminal T202 via the switch SW202, and the capacitor C203 is connected to the terminal T201 via the switch SW203.

In this manner, the input capacitance of the pixel signal VSL is formed by the capacitor C201 and the capacitor C203, and the input capacitance of the reference signal RAMP is formed by the capacitor C202. The AD conversion gain of the ADC including the comparator 400 is represented by the following Equation (3).

[Math. 3]

$$\text{Ad conversion gain} \approx \frac{C201+C203}{C202}(1+\Delta C201-\Delta C202+\Delta C203) \quad (3)$$
$$= 2(1+\Delta C201-\Delta C202+\Delta C203)$$

In a case in which the AD conversion is performed on pixel signals VS of pixels 150 on 3n-th rows (the third row, the sixth row, the ninth row, . . . ) in the pixel section 101, states of the switches SW201 to SW203 are set as illustrated in FIG. 34C. That is, the capacitor C201 is connected to the terminal T202 via the switch SW201, the capacitor C202 is connected to the terminal T201 via the switch SW202, and the capacitor C203 is connected to the terminal T201 via the switch SW203.

In this manner, the input capacitance of the pixel signal VSL is formed by the capacitors C202 and C203, and the input capacitance of the reference signal RAMP is formed by the capacitor C201. The AD conversion gain of the ADC including the comparator 400 at this time is represented by the following Equation (4).

[Math. 4]

$$\text{Ad conversion gain} \approx \frac{C202 + C203}{C201}(1 - \Delta C201 + \Delta C202 + \Delta C203) \quad (4)$$
$$= 2(1 - \Delta C201 + \Delta C202 + \Delta C203)$$

As described above, a combination of the capacitors used for the input capacitance of the pixel signal VSL (hereinafter, referred to as capacitor for the pixel signal) and a combination of the capacitors used for the reference signal RAMP (hereinafter, referred to as capacitors for the reference signal) are changed every time the pixel rows in the pixel section 101 as a target of the AD conversion of the pixel signal VSL are switched. Since the ratio between the number of the capacitors for the pixel signal and the number of the capacitors for the reference signal is maintained to be constant at this time, the AD conversion gain is maintained to be substantially constant.

Meanwhile, mismatch of the AD conversion gain between the pixel columns, which accompanies the errors of the capacitances of the capacitors C201 to C203 varies for each pixel row by changing the combination of the capacitors for the pixel signal and the combination of the capacitors for the reference signal for each pixel row. Since the mismatch of the AD conversion gains between the pixel columns is dispersed and becomes non-uniform in this manner, occurrence of vertical streaks in image data is suppressed.

In the image sensor in the related art, a countermeasure of increasing the input capacitance of the pixel signal VSL and the input capacitance of the reference signal RAMP is employed in some cases in order to suppress occurrence of vertical streaks in image data, which are caused by mismatch of the AD conversion gains. However, since the capacitance elements tend not benefit from microfabrication in a process on an integrated circuit and has poor area efficiency, there is a concern in that the size of the image sensor increases.

Meanwhile, it is not necessary to increase the input capacitance of the pixel signal VSL and the input capacitance of the reference signal RAMP in the comparator 400, it is possible to suppress the increase in the size of the image sensor 100.

The number of arrays in which the capacitors are aligned in the comparator 400 is not limited to three and can be set to two, four, or more.

The designed values of all the capacitances of the respective capacitors in the comparator 400 are not necessarily set to be equal. The combination of the capacitors for the pixel signal and the combination of the capacitors for the reference signal are changed such that the ratio between the input capacitance of the pixel signal VSL and the input capacitance of the reference signal RAMP is maintained to be substantially constant even in a case in which the designed values of the capacitances of the respective capacitors are not constant.

Although the example in which the combination of the capacitors for the pixel signal and the combination of the capacitors for the reference signal are changed for each pixel column has been described above, it is possible to obtain the effect of suppressing occurrence of vertical streaks in image data by changing the combinations at least once or more in the middle of the pixel columns. For example, the combination of the capacitors for the pixel signal and the combination of the capacitors for the reference signal may be changed for every two or more pixel columns. However, since the dispersion of mismatch of the AD conversion gains between the pixel columns increases as the number of times the combination of the capacitors for the pixel signal and the combination of the capacitors for reference signal are changed increases, occurrence of vertical streaks in image data is further suppressed.

For example, one of the combination of the capacitors for the pixel signal and the combination for the capacitors for the reference signal may be changed while the other is be fixed. For example, the combination of the capacitors for the pixel signal may be changed by selecting two capacitors among three capacitors in order while the capacitors used as the capacitors for the reference signal are fixed.

6. Modification Examples of Third Embodiment

Next, modification examples of the third embodiment will be described with reference to FIGS. 35 to 38.

In this modification example, two adjacent pixel arrays share (an ADC including) a comparator 400-1 and (an ADC including) a comparator 400-2.

Specifically, the comparator 400-1 and the comparator 400-2 have the same configuration as that of the comparator 400 illustrated in FIG. 33. In the drawing, "−1" or "1" is added to the end of a reference numeral for each part of the comparator 400-1, and "−2" or "2" is added to the end of a reference numeral for each part of the comparator 400-2.

As compared to the configuration illustrated in FIG. 33, a switch SW211-1 and a switch SW211-2 are added.

A terminal 0 of the switch SW211-1 is connected to terminals 1 of the switches SW201-1 to SW203-1, a terminal 1 thereof is connected to a terminal T201-1, and a terminal 3 thereof is connected to a terminal T201-2.

A terminal 0 of the switch SW211-2 is connected to terminals 1 of the switches SW201-2 to SW203-2, a terminal 1 thereof is connected to the terminal T201-1, and a terminal 3 thereof is connected to the terminal T201-2.

States of the switch SW211-1 and the switch SW211-2 are controlled by a timing control circuit 102, for example.

A terminal T202 is connected to terminals 3 of the switches SW201-1 to SW203-2 and terminals 3 of the switches SW201-2 to SW203-2.

A pixel signal VSL1 of each pixel 150 on the first column in a pixel section 101, for example, is input to the terminal T201-1, and a pixel signal VSL2 of each pixel 150 on the second column in the pixel section 101, for example, is input to the terminal T201-2.

Then, a ratio between the input capacitance of the pixel signal VSL1 and the input capacitance of a reference signal RAMP and a ratio between the input capacitance of the pixel signal VSL2 and the reference signal RAMP are controlled by controlling states of the switches SW201-1 to SW203-1 and the switches SW201-2 to SW203-2 in the same manner as in the comparator 400 illustrated in FIG. 33.

As illustrated in FIGS. 36 to 38, for example, occurrence of vertical streaks in image data is suppressed by controlling states of the switches SW201-1 to SW203-1, the switches SW202-2 to SW203-2, the switches SW211-1, and the switch SW211-2.

In a case in which AD conversion is performed on the pixel signal VSL1 and the pixel signal VSL2 of 6n−5-th rows (the first row, the seventh row, the thirteenth row, . . .

) in the pixel section 101, for example, states of the respective switches are set as illustrated in FIG. 36A.

That is, the capacitor C201-1 is connected to the terminal 202 via the switch SW201-1. The capacitor C202-1 is connected to the terminal T201-2 via the switch SW202-1 and the switch SW211-1. The capacitor C203-1 is connected to the terminal T201-2 via the switch SW203-1 and the switch SW211-1. In this manner, the input capacitance of the pixel signal VSL2 is formed by the capacitor C202-1 and the capacitor C203-1, and the input capacitance of the reference signal RAMP is formed by the capacitor C201-1.

Also, the capacitor C201-2 is connected to the terminal T202 via the switch SW201-2. The capacitor C202-2 is connected to the terminal T201-1 via the switch SW202-2 and the switch SW211-2. The capacitor C203-2 is connected to the terminal T201-1 via the switch SW203-2 and the switch SW211-2. In this manner, the input capacitance of the pixel signal VSL1 is formed by the capacitor C202-2 and the capacitor C203-2, and the input capacitance of the reference signal RAMP is formed by the capacitor C201-2.

In a case in which AD conversion is performed on the pixel signal VSL1 and the pixel signal VSL2 of 6n–4-th rows (the second row, the eighth row, the fourteenth row, . . . ) in the pixel section 101, states of the respective switches are set as illustrated in FIG. 36B.

That is, the capacitor C201-1 is connected to the terminal T201-2 via the switch SW201-1 and the switch SW211-1. The capacitor C202-1 is connected to the terminal T202 via the switch SW202-1. The capacitor C203-1 is connected to the terminal T201-2 via the switch SW203-1 and the switch SW211-1. In this manner, the input capacitance of the pixel signal VSL2 is formed by the capacitor C201-1 and the capacitor C203-1, and the input capacitance of the reference signal RAMP is formed by the capacitor C202-1.

Also, the capacitor C201-2 is connected to the terminal T201-1 via the switch SW201-2 and the switch SW211-2. The capacitor C202-2 is connected to the terminal T202 via the switch SW202-2. The capacitor C203-2 is connected to the terminal T201-1 via the switch SW203-2 and the switch SW211-2. In this manner, the input capacitance of the pixel signal VSL1 is formed by the capacitor C201-2 and the capacitor C203-2, and the input capacitance of the reference signal RAMP is formed by the capacitor C202-2.

In a case in which AD conversion is performed on the pixel signal VSL1 and the pixel signal VSL2 of 6n–3-th rows (the third row, the ninth row, the fifteenth row, . . . ) in the pixel section 101, states of the respective switches are set as illustrated in FIG. 37C.

That is, the capacitor C201-1 is connected to the terminal T201-2 via the switch SW201-1 and the switch SW211-1. The capacitor C202-1 is connected to the terminal T201-2 via the switch SW202-1 and the switch SW211-1. The capacitor C203-1 is connected to the terminal T202 via the switch SW203-1. In this manner, the input capacitance of the pixel signal VSL2 is formed by the capacitor C201-1 and the capacitor C202-1, and the input capacitance of the reference signal RAMP is formed by the capacitor C203-1.

Also, the capacitor C201-2 is connected to the terminal T201-1 via the switch SW201-2 and the switch SW211-2. The capacitor C202-2 is connected to the terminal T201-1 via the switch SW202-2 and the switch SW211-2. The capacitor C203-2 is connected to the terminal T202 via the switch SW203-2. In this manner, the input capacitance of the pixel signal VSL1 is formed by the capacitor C201-2 and the capacitor C202-2, and the input capacitance of the reference signal RAMP is formed by the capacitor C203-2.

In a case in which AD conversion is performed on the pixel signal VSL1 and the pixel signal VSL2 of 6n–2-th rows (the fourth row, the tenth row, sixteenth row, . . . ) in the pixel section 101, states of the respective switches are set as illustrated in FIG. 37D.

That is, the capacitor C201-1 is connected to the terminal T202 via the switch SW201-1. The capacitor C202-1 is connected to the terminal T202-1 via the switch SW202-1 and the switch SW211-1. The capacitor C203-1 is connected to the terminal T201-1 via the switch SW203-1 and the switch SW211-1. In this manner, the input capacitance of the pixel signal VSL1 is formed by the capacitor C202-1 and the capacitor C203-1, and the input capacitance of the reference signal RAMP is formed by the capacitor C201-1.

Also, the capacitor C201-2 is connected to the terminal T202 via the switch SW201-2. The capacitor C202-2 is connected to the terminal T201-2 via the switch SW202-2 and the switch SW211-2. The capacitor C203-2 is connected to the terminal T201-2 via the switch SW203-2 and the switch SW211-2. In this manner, the input capacitance of the pixel signal VSL2 is formed by the capacitor C202-2 and the capacitor C203-2, and the input capacitance of the reference signal RAMP is formed by the capacitor C201-2.

In a case in which AD conversion is performed on the pixel signal VSL1 and the pixel signal VSL2 of 6n–1-th rows (the fifth row, the eleventh row, the seventeenth row, . . . ) in the pixel section 101, states of the respective switches are set as illustrated in FIG. 38E.

That is, the capacitor C201-1 is connected to the terminal T201-1 via the switch SW201-1 and the switch SW211-1. The capacitor C202-1 is connected to the terminal T202 via the switch SW202-1. The capacitor C203-1 is connected to the terminal T201-1 via the switch SW203-1 and the switch SW211-1. In this manner, the input capacitance of the pixel signal VSL1 is formed by the capacitor C201-1 and the capacitor C203-1, and the input capacitance of the reference signal RAMP is formed by the capacitor C202-1.

Also, the capacitor C201-2 is connected to the terminal T201-2 via the switch SW201-2 and the switch SW211-2. The capacitor C202-2 is connected to the terminal T202 via the switch SW202-2. The capacitor C203-2 is connected to the terminal T201-2 via the switch SW203-2 and the switch SW211-2. In this manner, the input capacitance of the pixel signal VSL2 is formed by the capacitor C201-2 and the capacitor C203-2, and the input capacitance of the reference signal RAMP is formed by the capacitor C202-2.

In a case in which AD conversion is performed on the pixel signal VSL1 and the pixel signal VSL2 of 6n-th rows (the sixth row, the twelfth row, the eighteenth row, . . . ) in the pixel section 101, states of the respective switches are set as illustrated in FIG. 38F.

That is, the capacitor C201-1 is connected to the terminal T201-1 via the switch SW201-1 and the switch SW211-1. The capacitor C202-1 is connected to the terminal T201-1 via the switch SW202-1 and the switch SW211-1. The capacitor C203-1 is connected to the terminal T202 via the switch SW203-1. In this manner, the input capacitance of the pixel signal VSL1 is formed by the capacitor C201-1 and the capacitor C202-1, and the input capacitance of the reference signal RAMP is formed by the capacitor C203-1.

Also, the capacitor C201-2 is connected to the terminal T201-2 via the switch SW201-2 and the switch SW211-2. The capacitor C202-2 is connected to the terminal T201-2 via the switch SW202-2 and the switch SW211-2. The capacitor C203-2 is connected to the terminal T202 via the switch SW203-2. In this manner, the input capacitance of the pixel signal VSL2 is formed by the capacitor C201-2 and the capacitor C202-2, and the input capacitance of the reference signal RAMP is formed by the capacitor C203-2.

In this manner, patterns of a combination of the capacitors for the pixel signal and a combination of the capacitors for the reference signal increases by sharing two ADCs (comparators 400) between two pixel arrays and switching the combination of the pixel column and the ADC in the middle of the pixel column. As a result, dispersion of the mismatch of the AD conversion gains between the pixel columns further increases, and occurrence of vertical streaks in image data is further suppressed.

Also, three or more ADCs (comparators 400) may be shared by three or more pixel columns.

Also, it is possible to obtain the effect of suppressing occurrence of vertical streaks in image data by changing the combination of the pixel column and the ADC in the middle of the pixel column at least once or more. However, since the dispersion of the mismatch of the AD conversion gains between the pixel columns increases as the number of times the combination of the pixel column and the ADC is changed increases, occurrence of vertical streaks in image data is further suppressed.

Furthermore, it is possible to obtain the effect of suppressing occurrence of vertical streaks in image data by changing only the combination of the pixel array and the ADC without changing the combination of the capacitors for the pixel signal and the combination of the capacitors for the reference signal in the comparator 400, for example.

7. Other Modification Examples

Hereinafter, modifications of the aforementioned embodiments of the present disclosure will be described.

An embodiment of the present technology can be generally applied to an image sensor that performs AD conversion on a pixel signal by using the pixel signal and a reference signal with a ramp waveform as well as the aforementioned image sensor.

Also, a configuration of the pixels 150 is not limited to the configuration illustrated in FIG. 2 and can be arbitrarily changed.

Although the example in which the ADC is provided for each pixel column in the pixel section 101 has been described above, a unit in which the ADCs are provided can be arbitrarily changed. For example, an ADC can be provided for each pixel 150, an ADC can be provided for every two or more pixel columns, or an ADC can be provided for each predetermined area in the pixel section 101.

8. Application Examples of Image Sensor

Hereinafter, an application example of the image sensor to which an embodiment of the present technology is applied will be explained.

<Usage Example of Image Sensor>

FIG. 39 illustrates the usage example of the above-described image sensor.

The above-described image sensor can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

<Application Examples of Image Sensor to Electronic Device>

FIG. 40 is a diagram illustrating a configuration example of an electronic device 500 to which the image sensor is applied.

The electronic device 500 is an electronic device including an imaging device such as a digital still camera or a video camera or a mobile terminal device such as a smartphone or a tablet terminal.

In FIG. 40, the electronic device 500 includes a lens 501, an image sensor 502, a DSP circuit 503, a frame memory 504, a display unit 505, a recording unit 506, an operation unit 507, and a power source unit 508. In the electronic device 500, the DSP circuit 503, the frame memory 504, the display unit 505, the recording unit 506, the operation unit 507, and the power source unit 508 are connected to each other via a bus line 509.

In addition, the image sensor 100 illustrated in FIG. 1 can be applied to the image sensor 502.

The DSP circuit 503 is a signal processing circuit that processes a signal supplied from the image sensor 502. The DSP circuit 503 outputs image data that is obtained by processing the signal from the image sensor 502. The frame memory 504 temporarily holds the image data processed by the DSP circuit 503 in units of frames.

The display unit 505 is formed of a panel display device such as a liquid crystal panel or an organic electroluminescence (EL) panel and displays a video image or a stationary image captured by the image sensor 502. The recording unit 506 records image data of the video image or the stationary image captured by the image sensor 502 in a recording medium such as a semiconductor memory or a hard disk.

The operation unit 507 outputs operation commands for various functions of the electronic device 500 in response to operations by a user. The power source unit 508 appropriately supplies various power sources that serve as operation power sources for the DSP circuit 503, the frame memory 504, the display unit 505, the recording unit 506, and the operation unit 507 to these supply targets.

<Application Example to Mobile Object>

For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

FIG. 41 is a block diagram illustrating a schematic configuration example of a vehicle control system which is an example of a mobile object control system to which a technology according to an embodiment of the present technology is applicable.

A vehicle control system 12000 includes a plurality of electronic control units connected via a communication network 12001. In the example illustrated in FIG. 41, the vehicle control system 12000 includes a drive line control unit 12010, a body system control unit 12020, a vehicle outside information detection unit 12030, a vehicle inside information detection unit 12040, and an integrated control unit 12050. In addition, as functional configurations of the integrated control unit 12050, a microcomputer 12051, an audio and image output section 12052, an in-vehicle network interface (I/F) 12053.

The drive line control unit 12010 controls the operation of devices related to the drive line of the vehicle in accordance with a variety of programs. For example, the drive line control unit 12010 functions as a control device for a driving force generating device such as an internal combustion engine or a driving motor that generates the driving force of the vehicle, a driving force transferring mechanism that transfers the driving force to wheels, a steering mechanism that adjusts the steering angle of the vehicle, a braking device that generates the braking force of the vehicle, and the like.

The body system control unit 12020 controls the operations of a variety of devices attached to the vehicle body in accordance with a variety of programs. For example, the body system control unit 12020 functions as a control device for a keyless entry system, a smart key system, a power window device, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 receives these radio waves or signals, and controls the vehicle door lock device, the power window device, the lights, or the like.

The vehicle outside information detection unit 12030 detects information regarding the outside of a vehicle on which the vehicle control system 12000 is mounted. For example, an imaging section 12031 is connected to the vehicle outside information detection unit 12030. The vehicle outside information detection unit 12030 causes the imaging section 12031 to capture an image outside of the vehicle and receives the captured image. The vehicle outside information detection unit 12030 may perform an object detection process or a distance detection process for a person, a vehicle, an obstacle, a sign, letters on a road, or the like on the basis of the received image.

The imaging section 12031 is a light sensor that receives light and outputs an electric signal in accordance with the amount of received light. The imaging section 12031 can output the electric signal as an image or distance measurement information. In addition, the light received by the imaging section 12031 may be the visible light or may be non-visible light such as infrared light.

The vehicle inside information detecting unit 12040 detects information on the inside of the vehicle. The vehicle inside information detecting unit 12040 is connected, for example, to a driver state detecting section 12041 that detects the state of the driver. The driver state detecting section 12041 may include, for example, a camera that images the driver. The vehicle inside information detecting unit 12040 may compute the degree of the driver's tiredness or the degree of the driver's concentration or determine whether the driver have a doze, on the basis of detection information input from the driver state detecting section 12041.

For example, the microcomputer 12051 can calculate a control target value of the driving force generating device, the steering mechanism, or the braking device on the basis of information acquired by the vehicle outside information detecting unit 12030 or the vehicle inside information detecting unit 12040 on the inside and outside of the vehicle, and output a control instruction to the drive line control unit 12010. For example, the microcomputer 12051 may perform cooperative control for the purpose of executing the functions of an advanced driver assistance system (ADAS) including vehicle collision avoidance or impact reduction, follow-up driving based on the inter-vehicle distance, constant vehicle speed driving, vehicle collision warning, vehicle lane departure warning, or the like.

Further, the microcomputer 12051 can control the driving force generating device, the steering mechanism, the braking device, or the like on the basis of information acquired by the vehicle outside information detecting unit 12030 or the vehicle inside information detecting unit 12040 on the areas around the vehicle, thereby performing cooperative control for the purpose of automatic driving or the like that allows the vehicle to autonomously travel irrespective of any operation of a driver.

In addition, the microcomputer 12051 can output a control instruction to the body system control unit 12020 on the basis of the information regarding the outside of the vehicle acquired by the vehicle outside information detection unit 12030. For example, the microcomputer 12051 can control a head lamp in accordance with the position of a preceding vehicle or an oncoming vehicle detected by the vehicle outside information detection unit 12030 and can perform cooperative control for the purpose of anti-glaring such as switching a high beam to a low beam.

The audio and image output section 12052 transmits an output signal of at least one of a sound and an image to an output device capable of visually or aurally notifying a passenger of the vehicle or the outside of the vehicle of information. In the example of FIG. 41, an audio speaker 12061, a display section 12062, and an instrument panel 12063 are exemplified as the output device. For example, the display section 12062 may include at least one of an onboard display and a head-up display.

FIG. 42 is a diagram illustrating an example of an installation position of the imaging section 12031.

In FIG. 42, the vehicle 12100 includes imaging sections 12101, 12102, 12103, 12104, and 12105 as the imaging section 12031.

Imaging sections 12101, 12102, 12103, 12104, and 12105 are positioned, for example, at the front nose, a side mirror, the rear bumper, the back door, and the upper part of the windshield in the vehicle compartment of a vehicle 12100. The imaging section 12101 attached to the front nose and the imaging section 12105 attached to the upper part of the windshield in the vehicle compartment chiefly acquire images of the area ahead of the vehicle 12100. The imaging sections 12102 and 12103 attached to the side mirrors chiefly acquire images of the areas on the sides of the vehicle 12100. The imaging section 12104 attached to the rear bumper or the back door chiefly acquires images of the area behind the vehicle 12100. The image of the front side obtained by the imaging sections 12101 and 12105 is used chiefly to detect a preceding vehicle, a pedestrian, an obstacle, a traffic light, a traffic sign, a lane, or the like.

Additionally, FIG. 42 illustrates an example of the imaging ranges of the imaging sections 12101 to 12104. An imaging range 12111 represents the imaging range of the imaging section 12101 attached to the front nose. Imaging ranges 12112 and 12113 respectively represent the imaging ranges of the imaging sections 12102 and 12103 attached to the side mirrors. An imaging range 12114 represents the imaging range of the imaging section 12104 attached to the rear bumper or the back door. For example, overlaying image data captured by the imaging sections 12101 to 12104 offers an overhead image that looks down on the vehicle 12100.

At least one of the imaging sections 12101 to 12104 may have a function of acquiring distance information. For example, at least one of the imaging sections 12101 to 12104 may be a stereo camera including a plurality of image sensors or may be an image sensor that includes pixels for phase difference detection.

For example, the microcomputer 12051 can extract a 3-dimensional object traveling at a predetermined speed (for example, 0 or more km/h) in substantially the same direction as the vehicle 12100 as a preceding vehicle by particularly using a closest 3-dimensional object on a travel road of the vehicle 12100 by obtaining a distance to each 3-dimensional object within the imaging ranges 12111 to 12114 and a temporal change in the distance (a relative speed to the vehicle 12100) on the basis of distance information obtained from the imaging sections 12101 to 12104. Further, the microcomputer 12051 can set an inter-vehicle distance to be ensured in advance before a preceding vehicle and perform automatic brake control (also including follow-up stop control) or automatic acceleration control (also including follow-up oscillation control). In this way, it is possible to perform cooperative control for the purpose of automatic driving or the like that allows the vehicle to autonomously travel irrespective of any operation of a driver.

For example, the microcomputer 12051 can classify and extract 3-dimensional object data regarding 3-dimensional objects as other 3-dimensional objects such as motorcycles, normal vehicles, large vehicles, pedestrians, and electric poles on the basis of the distance information obtained from the imaging sections 12101 to 12104 and can use the other 3-dimensional objects to automatically avoid obstacles. For example, the microcomputer 12051 identifies obstacles around the vehicle 12100 as obstacles which can be viewed by a driver of the vehicle 12100 and obstacles which are difficult to view. Then, the microcomputer 12051 can determine a collision risk indicating a danger of collision with each obstacle and output a warning to the driver via the audio speaker 12061 or the display section 12062 in a situation in which there is a collision possibility since the collision risk is set to be equal to or greater than a set value or can perform driving assistance for collision avoidance by performing forced deceleration or avoidance steering iv via the drive line control unit 12010.

At least one of the imaging sections 12101 to 12104 may be an infrared camera that detects infrared light. For example, the microcomputer 12051 can recognize a pedestrian by determining whether there is the pedestrian in captured images of the imaging sections 12101 to 12104. The pedestrian can be recognized, for example, in a procedure in which feature points are extracted in the captured images of the imaging sections 12101 to 12104 serving as infrared cameras and a procedure in which a series of feature points indicating a contour of an object are subjected to a pattern matching process to determine whether there is the pedestrian. The microcomputer 12051 determines that there is the pedestrian in the captured images of the imaging sections 12101 to 12104. When the pedestrian is recognized, the audio and image output section 12052 controls the display section 12062 such that a rectangular contour line for emphasis is superimposed to be displayed on the recognized pedestrian. In addition, the audio and image output section 12052 controls the display section 12062 such that an icon or the like indicating the pedestrian is displayed at a desired position.

The example of the vehicle control system to which the technology according to an embodiment of the present disclosure can be applied has been described above. An embodiment of the technology according to the present disclosure can be applied to the imaging section 12031 in the above-described configuration. Specifically, the image sensor 100 illustrated in FIG. 1 can be applied to the imaging section 12031. It is possible to reduce power consumption of the imaging section 12031 by applying the technology according to an embodiment of the present disclosure to the imaging section 12031 and to reduce the power consumption of the vehicle as a result.

<Configuration Example of Stack Type Solid-State Imaging Device to which Technology According to Embodiment of Present Disclosure can be Applied>

FIG. 43 is a diagram illustrating an overview of a configuration example of a stack type solid-state imaging device to which the technology according to an embodiment of the present disclosure can be applied.

A of FIG. 43 illustrates a schematic configuration example of a non-stack type solid-state imaging device. A solid-state imaging device 23010 includes one die (semiconductor substrate) 23011 as illustrated in A of FIG. 43. A pixel region 23012 in which pixels are arranged in an array form, a control circuit 23013 that performs driving of pixels and various kinds of other control, and a logic circuit 23014 for signal processing are disposed on the die 23011.

B and C of FIG. 43 illustrate schematic configuration examples of stack type solid-state imaging devices. As illustrated in B and C of FIG. 43, a solid-state imaging device 23020 includes two dies including a sensor die 23021 and a logic die 23024 which are stacked and electrically connected to each other and configured as a single semiconductor chip.

In B of FIG. 43, a pixel region 23012 and a control circuit 23013 are disposed on the sensor die 23021, and a logic circuit 23014 including a signal processing circuit that performs signal processing is disposed on the logic die 23024.

In C of FIG. 43, a pixel region 23012 is disposed on the sensor die 23021, and a control circuit 23013 and a logic circuit 23014 are disposed on the logic die 23024.

FIG. 44 is a cross-sectional view illustrating a first configuration example of the stack type solid-state imaging device 23020.

A photodiode (PD), a floating diffusion (FD), a Tr (MOS FET) constituting a pixel serving as the pixel region 23012, a Tr serving as the control circuit 23013, and the like are formed on the sensor die 23021. Further, a wiring layer 23101 including a plurality of layers, that is, three layers of wirings 23110 in this example, is formed on the sensor die 23021. The control circuit 23013 (the Tr serving thereas) may be configured on the logic die 23024 instead of the sensor die 23021.

The Tr constituting the logic circuit 23014 is formed on the logic die 23024. Further, a wiring layer 23161 including a plurality of layers, that is, three layers of wirings 23170 in in this example are formed on the logic die 23024. Further, in the logic die 23024, a contact hole 23171 in which an insulating film 23172 is formed on an inner wall surface thereof is formed, and the contact hole 23171 is filled with a connection conductor 23173 connected with a wiring 23170 or the like.

The sensor die 23021 and the logic die 23024 are attached to each other so that the wiring layers 23101 and 23161 face each other, and the stack type solid-state imaging device 23020 in which the sensor die 23021 and the logic die 23024 are stacked is constituted accordingly. A film 23191 such as a protection film is formed on the surface to which the sensor die 23021 and the logic die 23024 are attached.

A contact hole 23111 that extends from the back side of the sensor die 23021 (the side on which light is incident on the PD) (the upper side), penetrates the sensor die 23021, and reaches the wiring 23170 of the uppermost layer of the logic die 23024 is formed in the sensor die 23021. Further, in the sensor die 23021, a contact hole 23121 that extends from the back side of the sensor die 23021 and reaches the wiring 23110 of the first layer is formed at a position close to the contact hole 23111. An insulating film 23112 is formed on an inner wall surface of the contact hole 23111, and an insulating film 23122 is formed on an inner wall surface of the contact hole 23121. Further, the contact holes 23111 and 23121 are filled with connection conductors 23113 and 23123, respectively. The connection conductor 23113 and the connection conductor 23123 are electrically connected to each other on the back side of the sensor die 23021, and thus the sensor die 23021 and the logic die 23024 are electrically connected to each other via the wiring layer 23101, the contact hole 23121, the contact hole 23111, and the wiring layer 23161.

FIG. 45 is a cross-sectional view illustrating a second configuration example of the stack type solid-state imaging device 23020.

In the second configuration example of the solid-state imaging device 23020, ((the wiring 23110 of) the wiring layer 23101 of) the sensor die 23021 and ((the wiring 23170 of) the wiring layer 23161 of) the logic die 23024 are electrically connected to each other via one contact hole 23211 formed in the sensor die 23021.

In other words, in FIG. 45, the contact hole 23211 is formed to extend from the back side of the sensor die 23021, penetrate the sensor die 23021, reach the wiring 23170 of the uppermost layer of the logic die 23024, and reach the wiring 23110 of the uppermost layer of the sensor die 23021. An insulating film 23212 is formed on an inner wall surface of the contact hole 23211, and the contact hole 23211 is filled with a connection conductor 23213. In FIG. 44, the sensor die 23021 and the logic die 23024 are electrically connected to each other via the two contact holes 23111 and 23121, whereas in FIG. 45, the sensor die 23021 and the logic die 23024 are electrically connected to each other via one contact hole 23211.

FIG. 46 is a cross-sectional view illustrating a third configuration example of the stack type solid-state imaging device 23020.

The solid-state imaging device 23020 of FIG. 46 differs from that of FIG. 44 in which the film 23191 such as the protection film is formed on the surface to which the sensor die 23021 and the logic die 23024 are attached to each other in that the film 23191 such as the protection film is not formed on the surface to which the sensor die 23021 and the logic die 23024 are attached to each other.

The solid-state imaging device 23020 in FIG. 46 is configured such that the sensor die 23021 and the logic die 23024 overlap so that the wirings 23110 and 23170 are in direct contact with each other, and the wirings 23110 and 23170 are directly joined by heating while applying a necessary weight.

FIG. 47 is a cross-sectional view illustrating another configuration example of the stack type solid-state imaging device to which the technology according to an embodiment of the present disclosure can be applied.

In FIG. 47, a solid-state imaging device 23401 has a three-layer stacked structure in which three dies including a sensor die 23411, a logic die 23412, and a memory die 23413 are stacked.

The memory die 23413 includes, for example, a memory circuit that stores data which is temporarily necessary in signal processing performed by the logic die 23412.

In FIG. 47, the logic die 23412 and the memory die 23413 are stacked under the sensor die 23411 in the described order, but the logic die 23412 and the memory die 23413 may be stacked in reverse order, that is, the memory die 23413 and the logic die 23412 may be stacked under the sensor die 23411 in the described order.

In FIG. 47, a PD serving as a pixel photoelectric conversion units and a source/drain region of a pixel Tr are formed on the sensor die 23411.

A gate electrode is formed around the PD with a gate insulating film interposed therebetween, and a pixel Tr 23421 and a pixel Tr 23422 are formed by a source/drain region which forms a pair with the gate electrode.

The pixel Tr 23421 adjacent to the PD is a transfer Tr, and one of a pair of source/drain regions constituting the pixel Tr 23421 is an FD.

An inter-layer insulating film is formed on the sensor die 23411, and a contact hole is formed in the inter-layer insulating film. A connection conductor 23431 connected to the pixel Tr 23421 and the pixel Tr 23422 is formed in the contact hole.

Further, a wiring layer 23433 including a plurality of layers of wirings 23432 connected to the connection conductors 23431 is formed in the sensor die 23411.

An aluminum pad 23434 serving as an electrode for external connection is formed in the lowermost layer of the wiring layer 23433 of the sensor die 23411. In other words, in the sensor die 23411, the aluminum pad 23434 is formed at a position closer to a bonding surface 23440 with the logic die 23412 than the wiring 23432. The aluminum pad 23434 is used as one end of a wiring related to an input and output of a signal with the outside.

Further, a contact 23441 used for electrical connection with the logic die 23412 is formed on the sensor die 23411. The contact 23441 is connected to a contact 23451 of the logic die 23412 and also connected to the aluminum pad 23442 of the sensor die 23411.

In the sensor die 23411, a pad hole 23443 is formed to extend from the back side of the sensor die 23411 (the upper side) and reach the aluminum pad 23442.

The technology according to an embodiment of the present disclosure can be applied to the above-described solid-state imaging devices.

In addition, embodiments of the present disclosure are not limited to the above-described embodiments, and various alterations may occur insofar as they are within the scope of the present disclosure.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1)
An imaging device comprising:
a pixel configured to generate a pixel signal; and
a comparator comprising:
a first capacitor configured to receive the pixel signal; a second capacitor configured to receive a reference signal; a node coupled to the first capacitor and the second capacitor;
a first transistor having a gate coupled to the node; a second transistor coupled to the first transistor; and a third capacitor coupled between a gate of the second transistor and a first line supplied with a first voltage.

(2)
The imaging device according to (1), wherein the first and second capacitors are coupled to a terminal of the first transistor via a first switch and wherein the third capacitor is coupled to a terminal of the second transistor via a second switch.

(3)
The imaging device according to (2), wherein the terminal of the first transistor is a drain and the terminal of the second transistor is a drain.

(4)
The imaging device according to (2), wherein the first and second switches are controlled with a same drive signal.

(5)
The imaging device according to (2), wherein the first and second switches are controlled with different drive signals.

(6)
The imaging device according to (1), wherein the comparator further comprises a third transistor and a fourth transistor, the third transistor being coupled to the first transistor and a second line supplied with a second voltage different than the first voltage and the fourth transistor being coupled to the second transistor and the second line.

(7)
The imaging device according to (1), wherein the comparator comprises a multi-stage amplifier.

(8)
The imaging device according to (7), wherein the comparator further comprises a third transistor having a gate coupled to the second transistor.

(9)
The imaging device according to (8), wherein the third transistor is coupled to a third line supplied with a third voltage different than the first and second voltages.

(10)
The imaging device according to (1), wherein the first and second capacitors are variable capacitors.

(11)
An imaging device comprising:
a pixel configured to generate a pixel signal; and
a comparator comprising:
a first capacitor configured to receive the pixel signal;
a second capacitor configured to receive a reference signal;
a node coupled to the first capacitor and the second capacitor;
a first transistor having a gate coupled to the node;
a second transistor disposed between a first line supplied with a first fixed voltage and the first transistor;
wherein the first transistor is coupled between the second transistor and a second line supplied with a second fixed voltage different from the first fixed voltage, and wherein a gate of the second transistor is isolated from the node.

(12)
The imaging device according to (11), wherein the comparator further comprises a third transistor coupled to a third line supplied with a third fixed voltage and to the node.

(13)
The imaging device according to (12), wherein the third transistor is coupled to the node via a switch.

(14)
The imaging device of (12), wherein the third fixed voltage is equal to the second fixed voltage.

(15)
The imaging device according to (12), wherein the comparator further comprises a third capacitor coupling the third transistor to the first line.

(16)
The imaging device according to (11), wherein the comparator comprises a multi-stage amplifier.

(17)
The imaging device according to (16), wherein the comparator further comprises a third transistor having a gate coupled to the second transistor.

(18)
The imaging device according to (17), wherein the third transistor is coupled to a third line supplied with a third fixed voltage different than the first and second voltages.

(19)
The imaging device according to (11), wherein the first and second capacitors are variable capacitors.

(20)
The imaging device according to (11), wherein the first transistor is an NMOS transistor and the second transistor is a PMOS transistor.

(21)
An image sensor including:
a pixel section configured to include a plurality of pixels arranged therein; and
an AD conversion unit configured to perform analog-to-digital (AD) conversion on a pixel signal on the basis of a result of comparison between a first voltage of a signal, which is obtained by adding, via capacitances, the pixel signal of the pixel and a reference signal that linearly changes in a direction opposite to the pixel signal, with a second voltage serving as a reference.

(22)
The image sensor according to (1),
in which the AD conversion unit includes a comparator configured to compare the first voltage with the second voltage and output an output signal representing a result of the comparison.

(23)
The image sensor according to (2),
in which the comparator includes a first amplifier configured to be supplied with the first voltage input to a first input and output the output signal.

(24)
The image sensor according to (3), further including:
a first capacitance; and
a second capacitance,
in which the pixel signal is input to the first input via the first capacitance, and the reference signal is input to the first input via the second capacitance.

(25)
The image sensor according to (4),
in which at least one of the first capacitance and the second capacitance is variable.

(26)
The image sensor according to (5),
in which at least one of a combination of capacitors used for the first capacitance and a combination of capacitors used for the second capacitance is variable.

(27)
The image sensor according to (6),
in which the AD conversion unit is provided for each pixel column in the pixel section, and
the image sensor further includes a control unit configured to change at least one of the combination of the capacitors used for the first capacitance and the combination of the capacitors used for the second capacitance once or more in the middle of the pixel column in a case in which each of the AD conversion units performs AD conversion.

(28)
The image sensor according to (7),
in which the plurality of pixel columns share a plurality of the AD conversion units, and the control unit changes a combination of the pixel column and the AD conversion unit once or more in the middle of the pixel column.

(29)
The image sensor according to any of (3) to (8),
in which the first amplifier is a difference amplifier and is supplied with the second voltage input to a second input.

(30)
The image sensor according to (9), further including:
a capacitor configured to be connected between the second input and a power source or a ground.

(31)
The image sensor according to any of (3) to (8),
in which the first amplifier is a single type amplifier.

(32)
The image sensor according to (11),
in which the first amplifier is a source-grounded type amplifier.

(33)
The image sensor according to (12),
in which the second voltage is set to a voltage of the first input at the time when the first input and an output of the first amplifier are short-circuited.

(34)
The image sensor according to (12) or (13), further including:
a clamping circuit configured to be connected to an output of the first amplifier.

(35)
The image sensor according to any of (12) to (14), further including:
a transistor configured to form a current source of the first amplifier; and
a sample and hold circuit configured to hold a bias voltage to be applied to a gate of the transistor.

(36)
The image sensor according to any of (3) to (15), further including:
a second amplifier configured to amplify the output of the first amplifier.

(37)
The image sensor according to any of (2) to (16),
in which the AD conversion unit further includes a counter configured to acquire a count value until the output signal is inverted after the comparison between the first voltage and the second voltage is started.

(38)
The image sensor according to any of (1) to (17),
in which the AD conversion unit is provided for each pixel column in the pixel section.

(39)
A method of controlling an image sensor, the method including:
performing analog-to-digital (AD) conversion on a pixel signal on the basis of a result of comparison between a first voltage of a signal, which is obtained by adding, via capacitances, the pixel signal and a reference signal that linearly changes in a direction opposite to the pixel signal, with a second voltage serving as a reference.

(40)
An electronic device including:
an image sensor; and
a signal processing unit configured to process a signal output from the image sensor, in which the image sensor includes
a pixel section configured to include a plurality of pixels arranged therein; and
an AD conversion unit configured to perform analog-to-digital (AD) conversion on a pixel signal on the basis of a result of comparison between a first voltage of a signal, which is obtained by adding, via capacitances, the pixel signal of the pixel and a reference signal that linearly changes in a direction opposite to the pixel signal, with a second voltage as a reference.

REFERENCE SIGNS LIST 100 image sensor
101 pixel section
102 timing control circuit
103 vertical scanning circuit
104 DAC
105 ADC group
106 horizontal transfer scanning circuit
121-1 to 121-$n$ comparator
122-1 to 122-$n$ counter
123-1 to 123-$n$ latch
200 to 200$i$ comparator
201, 211 difference amplifier
221, 231 output amplifier
300 to 300$hb$ comparator
301 amplifier
311 output amplifier
400, 400-1, 400-2 comparator
401, 401-1, 401-2 comparison circuit
C11 to C51 capacitor
C61, C62 variable capacitor
C71 to C131 capacitor
C141, C142 variable capacitor
C151 to C203 capacitor
NT11 to NT131 NMOS transistor
PT11 to PT131 PMOS transistor
SW11 to SW203 switch

What is claimed is:
1. A light detecting device comprising:
a pixel configured to generate a pixel signal; and
a comparator comprising:
a first capacitor configured to receive the pixel signal;
a second capacitor configured to receive a reference signal;
a first node coupled to the first capacitor and the second capacitor wherein the first node is a single-type amplifier;

a first transistor having a gate coupled to the first node;
a second transistor disposed between a first line supplied with a first voltage and the first transistor;
a third capacitor coupled to a gate of the second transistor and the first line; and
a third transistor disposed between the first transistor and the second transistor,
a fourth transistor coupled to the third transistor and a switch coupled between a gate and a drain of the fourth transistor;
wherein the first transistor is coupled between the second transistor and a second line supplied with a second voltage different from the first voltage,
wherein a polarity of the first transistor is opposite to a polarity of the second transistor,
wherein a first output signal is configured to output from a second node between the first transistor and the second transistor,
wherein a gate of the second transistor is configured to receive a bias voltage from an external of the comparator.

2. The light detecting device of claim 1, wherein the bias voltage received by the second transistor is different from the first and second voltage.

3. The light detecting device of claim 1, wherein the gate of the second transistor is configured to receive the bias voltage via a switch.

4. The light detecting device of claim 1, wherein a capacitor is coupled to the gate of the second transistor and the first line.

5. The light detecting device of claim 1, wherein the first capacitor and the second capacitor are variable.

6. The light detecting device of claim 1, wherein the third transistor is serially coupled to the first transistor and the second transistor.

7. The light detecting device of claim 6, wherein the gate of the third transistor is configured to receive a via voltage.

8. A light detecting device comprising:
a pixel configured to generate a pixel signal; and
a comparator comprising:
  a first capacitor configured to receive the pixel signal;
  a second capacitor configured to receive a reference signal;
  a first node coupled to the first capacitor and the second capacitor;
  a first transistor having a gate coupled to the first node; and
  a second transistor disposed between a first line supplied with a first voltage and the first transistor,
wherein the first transistor is coupled between the second transistor and a second line supplied with a second voltage different from the first voltage,
wherein a polarity of the first transistor is opposite to a polarity of the second transistor,
wherein a gate of the second transistor is configured to receive a bias voltage,
wherein a first output signal is configured to output from a second node between the first transistor and the second transistor,
wherein the comparator comprises a third transistor coupled to a third line supplied with a third voltage, and a gate of the third transistor is configured to receive the first output signal, and
wherein the third voltage is equal to the second voltage.

9. The light detecting device of claim 8, wherein the third voltage is equal to the first voltage.

10. A light detecting device comprising:
a pixel configured to generate a pixel signal; and
a comparator comprising:
  a first capacitor configured to receive the pixel signal;
  a second capacitor configured to receive a reference signal;
  a first node coupled to the first capacitor and the second capacitor;
  a first transistor having a gate coupled to the first node; and
  a second transistor disposed between a first line supplied with a first voltage and the first transistor,
wherein the first transistor is coupled between the second transistor and a second line supplied with a second voltage different from the first voltage,
wherein a polarity of the first transistor is opposite to a polarity of the second transistor,
wherein a gate of the second transistor is configured to receive a bias voltage,
wherein a first output signal is configured to output from a second node between the first transistor and the second transistor,
wherein the comparator comprises a third transistor coupled to a third line supplied with a third voltage, and a gate of the third transistor is configured to receive the first output signal, and
wherein the comparator comprises a fourth transistor coupled to the third transistor and a switch coupled between a gate and a drain of the fourth transistor.

11. The light detecting device of claim 10, wherein a third capacitor is coupled between the gate of the fourth transistor and the first voltage.

12. The light detecting device of claim 10, wherein a second output signal is configured to output from a node between the third transistor and the fourth transistor.

* * * * *